US007475184B2

(12) United States Patent
Lee

(10) Patent No.: US 7,475,184 B2
(45) Date of Patent: Jan. 6, 2009

(54) SYSTEMS AND METHODS FOR PROVIDING NONVOLATILE MEMORY MANAGEMENT IN WIRELESS PHONES

(75) Inventor: Schweiray Joseph Lee, San Diego, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 478 days.

(21) Appl. No.: 11/215,744

(22) Filed: Aug. 30, 2005

(65) Prior Publication Data

US 2006/0053246 A1    Mar. 9, 2006

Related U.S. Application Data

(60) Provisional application No. 60/611,219, filed on Sep. 20, 2004, provisional application No. 60/605,265, filed on Aug. 30, 2004.

(51) Int. Cl.
*G06F 12/00* (2006.01)
*H04B 1/00* (2006.01)
(52) U.S. Cl. ...................................... 711/103; 711/163
(58) Field of Classification Search ................. 711/100, 711/103, 163
See application file for complete search history.

(56) References Cited

U.S. PATENT DOCUMENTS

| 5,400,389 | A | 3/1995 | Niiyama et al. |
| 5,404,485 | A | 4/1995 | Ban |
| 5,809,531 | A | 9/1998 | Brabandt |
| 5,909,437 | A | 6/1999 | Rhodes et al. |
| 5,937,425 | A | 8/1999 | Ban |
| 5,978,589 | A | 11/1999 | Yoon |
| 6,510,488 | B2 | 1/2003 | Lasser |
| 6,754,894 | B1 | 6/2004 | Costello et al. |
| 2002/0185337 | A1 | 12/2002 | Miura et al. |
| 2003/0050087 | A1 | 3/2003 | Kwon |
| 2003/0156454 | A1 | 8/2003 | Wei et al. |

(Continued)

FOREIGN PATENT DOCUMENTS

| WO | WO 2004/049167 A1 | 6/2004 |
| WO | WO 2005/076137 A1 | 8/2005 |

OTHER PUBLICATIONS

European Search Report; EP 06026552.

(Continued)

*Primary Examiner*—Lee Nguyen
(74) *Attorney, Agent, or Firm*—Knobbe, Martens, Olson & Bear LLP

(57) ABSTRACT

The present invention is related to memory management, and in particular, to methods and systems for accessing and managing nonvolatile, such as in a wireless phone. A wireless phone memory controller is disclosed that, comprises a first interface circuit configured to be coupled to wireless phone nonvolatile memory, a second interface circuit configured to be coupled to wireless phone volatile memory, a first processor interface configured to be coupled to a first wireless phone processor, wherein the first processor interface is configured to provide the first processor with access to the wireless phone volatile memory, a second processor interface configured to be coupled to a second wireless phone processor, and a controller circuit configured to copy at least a portion of wireless phone nonvolatile memory data to the wireless phone volatile memory.

40 Claims, 32 Drawing Sheets

U.S. PATENT DOCUMENTS

2003/0206442 A1 11/2003 Tang et al.
2004/0049629 A1 3/2004 Miura et al.
2004/0064606 A1 4/2004 Kimura
2004/0139310 A1 7/2004 Maeda et al.
2005/0204091 A1* 9/2005 Kilbuck et al. .............. 711/103
2006/0041711 A1 2/2006 Miura et al.

OTHER PUBLICATIONS

International Search Report and Written Opinion; PCT/US05/30928.
International Search Report and Written Opinion; PCT/US05/30928, May 3, 2006.
European Search Report; EP 06026552, Oct. 18, 2007.

* cited by examiner

SYSTEMS AND METHODS FOR PROVIDING NONVOLATILE MEMORY MANAGEMENT IN WIRELESS PHONES

PRIORITY APPLICATION

This application claims the benefit under 35 U.S.C. 119(e) of U.S. Provisional Application 60/605,265 (filed Aug. 30, 2004), and U.S. Provisional Patent Application 60/611,219 (filed Sep. 20, 2004). The entire disclosure of both of these applications is hereby incorporated by reference herein.

COPYRIGHT RIGHTS

A portion of the disclosure of this patent document contains material that is subject to copyright protection. The copyright owner has no objection to the facsimile reproduction by any one of the patent document or the patent disclosure, as it appears in the Patent and Trademark Office patent file or records, but otherwise reserves all copyright rights whatsoever.

BACKGROUND OF THE INVENTION

1. Field of the Invention

The present invention is related to memory management, and in particular, to methods and systems for accessing and managing nonvolatile memory, such as in a wireless phone.

2. Description of the Related Art

With the advent of smaller, faster and less power-consuming electronic components such as processors, memories and ASICs, many cellular phones provide increasingly complex capabilities such as multimedia information and entertainment, commonly referred to as the "applications". A cellular phone further includes wireless communication modulation/demodulation capabilities, commonly referred to as the "modem". To handle the modem and the application functions, many cellular phone designs include two processors whereby the "application processor" controls the application functions and the "modem processor" controls the communication functions. Some cellular phones include yet another processor specifically designed to perform digital signal processing (DSP) algorithms. Although single-processor cellular phones do exist, many current complex cellular phones include multiple processors. In many conventional applications, each processor utilizes both non-volatile and volatile memory to perform their functions.

In addition, traditionally, NOR Flash memory has been commonly used as the cellular phone's non-volatile memory. In recent years, several new Flash memory technologies have emerged on the market. These relatively new high density Flash memories, such as AND Flash memory and NAND Flash memory, are designed to have lower costs, smaller sizes and higher storage capacities than NOR Flash memory. Thus high density Flash memory technology is often the preferred technology for non-volatile mass data storage in complex cellular phones. However, many conventional cellular phones that currently use NOR Flash cannot use AND or NAND Flash memory as a drop-in replacement without making design and/or circuit board modification. This is because these high-density Flash technologies have different characteristics than NOR Flash memory, and so necessitate special treatment.

For example, high-density Flash memory is typically accessed in page-mode, with significant initial access time, and thus is not suitable for a processor to execute program code out of, as processor's typically need random-access on a byte or word level. Therefore, program code stored in high-density Flash memory is usually first moved to RAM memory and then the processor executes the program codes from the RAM. In addition, high-density Flash memory often has a higher probability of introducing errors to the data stored therein as compared to NOR Flash memory, and thus Error Correction Coding (ECC) often needs to be applied when accessing the high-density Flash. Further, high-density Flash memory typically can only endure a limited number of erase-rewrite cycles. Flash media management techniques such as wear-leveling, garbage collection, bad-block replacement and power-failure recovery are often employed to increase the endurance and reliability of these Flash memory devices.

To take advantage of high-density Flash technologies, many cellular phone system designs have incorporated very complex Flash media management algorithms and procedures in the system software to accommodate the above-mentioned special characteristics of the high-density Flash. These complex algorithms and procedures use up plenty of computational/control capacity of the Flash-accessing processor and thus degrade the performance of the system. Therefore, it would be advantageous to have a control circuit included in the cellular phone where the control circuit performs the algorithms and procedures of the Flash media management techniques as well as ECC and releases the Flash-accessing processor from such duties.

In an electronic system which includes a processor, nonvolatile memory and volatile memory, a task commonly performed by the processor is moving data from one memory to another. An example data movement operation involves moving program code from a non-volatile page-mode memory device to a volatile random access memory device to allow the processor to execute the program code. Another example data movement operation involves moving data from volatile memory to nonvolatile memory to thereby permanently store the data. Furthermore, in cellular phones which provide multimedia functions, such as graphics and video, the processor(s) often moves image data from memories to the cellular phone display (e.g., an LCD display) to thereby display images. Moving data in and out of memories is a very repetitive process which consumes a large amount of processor computational/control capacity.

SUMMARY OF THE INVENTION

In view of the foregoing, in order to reduce costs and the size of the overall size of a wireless phone design, such as a cellular phone design, it would be advantageous to have a memory management circuit which accommodates the multiple processors' need for memory capacity without requiring that each processor have its own, separate memory management circuit. Reducing the number of cellular memory systems not only reduces the number of memory devices, but also makes the data transfer among the processors more efficient.

Further, in view of the foregoing, it would be advantageous for a cellular phone to have a memory system containing high-density Flash memory, RAM memory, and a control circuit that, under the control of one or multiple processors, provides a DMA function to transfer data among memories, displays (e.g., LCD screens), and/or an externally inserted memory card.

It would be further advantageous for a cellular phone to have a memory system that performs ECC and user-defined Flash media management autonomously with minimal processor intervention, and allows the processor(s) to access the memories within the memory system. Such a memory system would allow for consolidating memory needs of multiple processors into fewer or even a single memory system, thus reducing the cost and the size of the cellular phone. The use of high-density Flash memory for mass data storage can further reduce the phone cost and size. In addition, it would be advantageous to relieve the processors from having to perform the low level functions of moving data, performing ECC and Flash media management, to thereby improve cellular phone system performance.

However, it should be understood that not all the advantages referred to herein need to be achieved by a given embodiment of the present invention.

One embodiment provides a wireless phone memory controller, comprising: a nonvolatile memory controller circuit coupled to nonvolatile memory; a volatile memory controller circuit coupled to volatile memory; a boot controller circuit coupled to the nonvolatile memory controller circuit, the boot controller circuit configured to cause user-defined boot program code to be read from nonvolatile memory into memory controller memory; a first processor interface, including a first reset signal, coupled to a first wireless phone processor, wherein, the memory controller is configured to release the first wireless phone processor from a reset state after the user-defined code is read into the memory controller memory; a second processor interface, including a second reset signal, coupled to a second wireless phone processor, wherein the second reset signal is configured to be controlled at least in part by the first processor.

Another embodiment provides a method of transferring data from wireless phone nonvolatile memory, the process comprising: after a power-on reset, generating a first address using a boot circuit; accessing data from the wireless phone's nonvolatile Flash memory, including at least data stored at the first address; storing the accessed data in a page buffer; determining whether the accessed data is boot code or Flash memory management code; if the accessed data is boot code, copying the data from the page buffer to a boot random access memory; and if the accessed data is Flash memory management code, copying the data from the page buffer to Flash memory management random access memory.

Still another embodiment provides a wireless phone memory controller, comprising: a first interface circuit configured to be coupled to wireless phone nonvolatile memory; a second interface circuit configured to be coupled to wireless phone volatile memory; a first processor interface configured to be coupled to a first wireless phone processor, wherein the first processor interface is configured to provide the first processor with access to the wireless phone volatile memory; a second processor interface configured to be coupled to a second wireless phone processor; and a controller circuit configured to copy at least a portion of wireless phone nonvolatile memory data to the wireless phone volatile memory without intervention by the first processor or the second processor.

Yet another embodiment provides a method of operating a wireless phone memory circuit, the method comprising: deasserting a reset signal, generating a first address corresponding to boot data stored in wireless phone nonvolatile memory; reading boot program code from the wireless phone nonvolatile memory beginning at the first address; providing error detection with respect to the boot program code; correcting at least a first error if a first error is detected; loading the boot code, including corrected boot code if such is present, into volatile random access memory; loading Flash memory management program code, including wear leveling code, from the wireless phone nonvolatile memory into Flash memory management volatile memory; enabling the Flash memory management program code to be executed by a Flash memory management circuit; releasing a first wireless phone processor, coupled to the wireless phone memory circuit, from a reset state; providing the first wireless phone processor with access to the boot program code; and providing a second wireless phone processor with access to code stored in the volatile memory.

One embodiment provides a method of performing error correction on data stored or being stored in a wireless phone's nonvolatile memory, the method comprising: receiving a first page of data configured to be stored in a wireless phone nonvolatile memory, the first page including user data stored in a user portion and spare data stored in a spare portion; generating page parity data for the first page of data; storing the page parity data in the wireless phone nonvolatile memory; storing spare data in the wireless phone nonvolatile memory; wherein the spare data includes bookkeeping data for nonvolatile memory management and/or system flags; storing parity data for the spare data in the wireless phone nonvolatile memory; reading the spare data from the wireless phone nonvolatile memory; reading the parity data for the spare data from the wireless phone nonvolatile memory; and performing error detection and error correction, if needed, on the spare data from the wireless phone nonvolatile memory using the spare data parity information.

One embodiment provides a wireless phone memory system, comprising: a first port coupled to wireless phone nonvolatile memory; a second port circuit coupled to wireless phone volatile memory; a first processor interface coupled to a first wireless phone processor, wherein the first processor interface is configured to provide the first processor with access to the wireless phone volatile memory; and a second processor interface coupled to a second wireless phone processor, wherein one of the first and second processors is configured to provide modem control.

Another embodiment provides a wireless phone memory controller device, comprising: a first port configured to be coupled to wireless phone nonvolatile memory; a second port circuit configured to be coupled to a modem processor of a wireless phone; a volatile boot memory; a boot controller configured to copy boot code from the wireless phone nonvolatile memory to the volatile boot memory; a direct memory access controller configured to copy data from the nonvolatile memory to the volatile boot memory in response to a command from the modem processor; and providing a path via which the modem processor can read boot memory data.

BRIEF DESCRIPTION OF THE DRAWINGS

Exemplary embodiments are illustrated in the accompanying drawings, which are for illustrative purposes only.

DETAILED DESCRIPTION OF PREFERRED EMBODIMENTS

Figure 1:
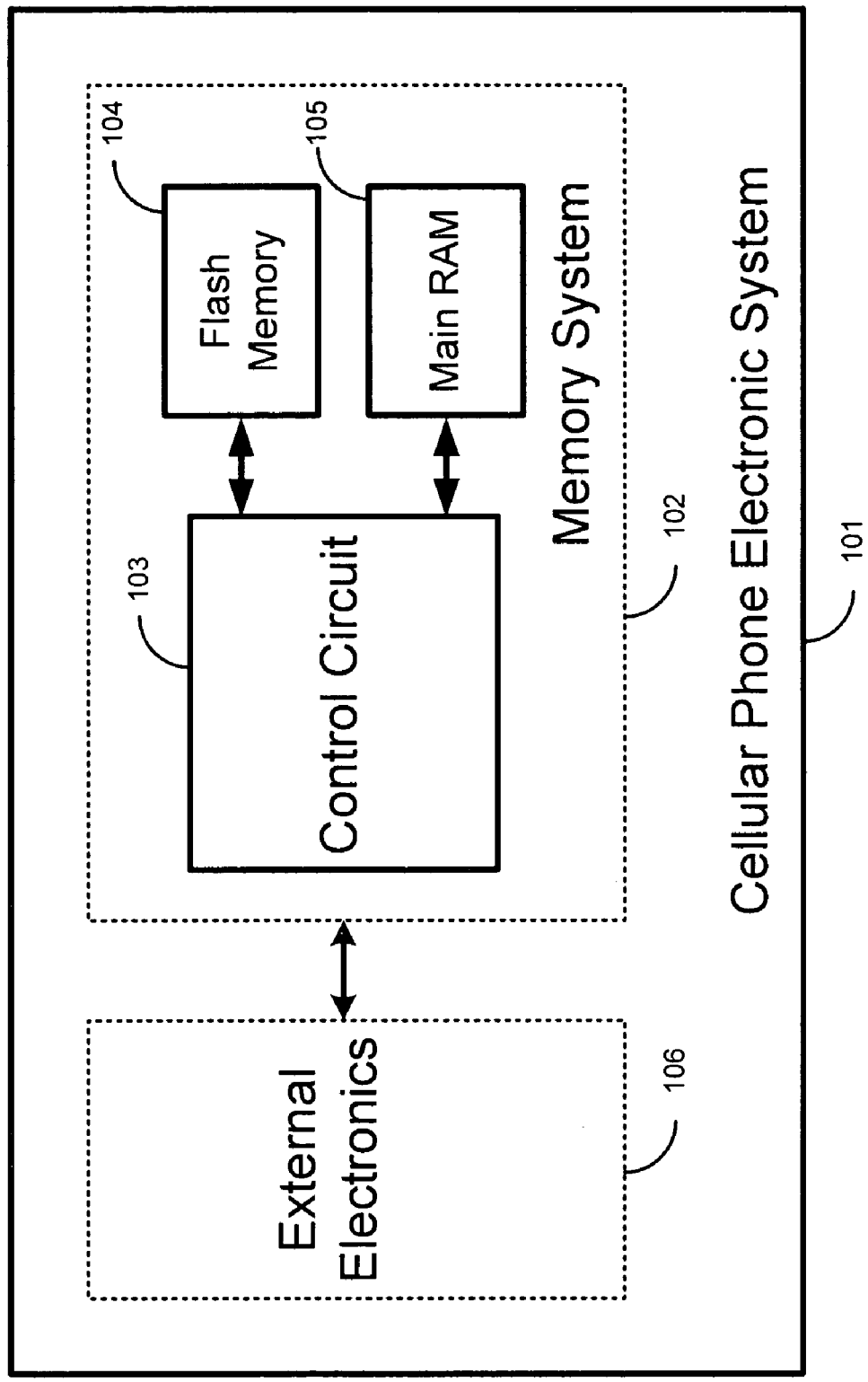
FIG. 1 illustrates a block diagram of an example wireless phone electronic system.

The present invention is related to memory management, and in particular, to methods and systems for accessing and managing non-volatile and volatile memories in electronic devices, such as in a wireless phone.

As described herein, certain optional embodiments can reduce the cost and size of a target device, such as a wireless phone. Further, certain optional embodiments of the memory management system described herein can reduce processor load with respect to memory management and Flash memory bookkeeping, by relieving the processor of such chores.

Still further, certain optional embodiments enable a user (e.g., a cell phone manufacturer) to write, provide and store their own boot code and their own Flash memory management (FMM) code (one or more of wear-leveling, garbage collection, bad block replacement, power-failure recovery, etc.), without having to rely on a memory management chip manufacturer's code. The FMM code can optionally be written by the memory management chip manufacturer instead of the phone manufacturer. In certain embodiments, such memory management code can be written without knowing in advance which processors will be used with the memory management system and/or what wireless phone the memory management system will be used in.

Further, certain embodiments include a memory management system that can define certain address spaces or areas of Flash memory as "protected", wherein certain processors, such as a modem processor or an application processor, are prevented from overwriting the protected areas to thereby prevent software hacks (improper modification of the software). To further prevent unauthorized access to the memories, and so to prevent software hacks, certain embodiments include volatile SDRAM memory, nonvolatile Flash memory, and a memory manager, in a single packaged chip, wherein no chip pins or buses (except, optionally, via test pins) are provided that would allow direct access to the SDRAM memory and the Flash memory. Thus, in this embodiment, a user could only access the SDRAM and the Flash memory via the memory manager, unless the user took extreme or expensive measures, such as opening the chip package and probing internal chip circuitry, which could result in permanent chip damage.

Certain embodiments provide a secure boot function, wherein code for a given process can be copied from Flash memory to SDRAM memory, and/or a software security check is performed, before a boot controller wakes up the processor.

In addition, certain embodiments provide 2-level ECC data protection, wherein page level ECC is provided, and Error Correction Coding (ECC) is also provided specifically for the spare portion of a Flash page.

While the following description may refer to a wireless phone, such as a cellular phone, as an example, illustrative embodiment, the present invention is not so limited. Other example applications include portable or non-portable electronic devices, such as personal digital assistants, portable electronic games, digital entertainment systems, portable video devices, and so on. The wireless phone described herein can include a speaker, a keyboard, a microphone, volatile and volatile memory, and a memory control system, but does not require all the foregoing elements (e.g., a keypad is not required). Further, while certain specific example memory technologies may be referred to for illustrative purposes, the present invention is not limited to such example memory technologies. For example, the present invention is not limited to use with Flash memories or SDRAM memories. Other types of nonvolatile and volatile memory can be used as well. In addition, unless explicitly indicated otherwise, the phrase "transfer" in the context of transferring data, means copying data from one location to another location.

Further, with respect to the example processes described herein, not all the process states need to be reached, nor do the states have to be performed in the illustrated order. Further, certain process states that are described as being serially performed can be performed in parallel. In addition, not all functions or advantages described herein are required, and different circuits and architectures can be used to carry out the functions. While certain functions are described as being performed by program code executed by hardware, such as a processor, in other embodiments, hardwired circuits or state machines can be used to perform the same or similar functions. Similarly, while certain functions are described as being performed by hardwired circuit, in other embodiments, processors executing code can be used to perform the same or similar functions.

As depicted in FIG. 1, in a first embodiment, an example memory system (102) is provided as a part of the electronic system of a cellular phone (101). The memory system (102) includes a high-density non-volatile Flash memory (104), a volatile random access memory (105), and a control circuit (103). Hereinafter, for the purposes of clarity and not limitation, the volatile random access memory which is in the memory system (102) but is not a part of the control circuit (103) is referred to as the "Main RAM" (105). In the example memory system (102), both the Flash memory (104) and the Main RAM (105) are connected to a control circuit (103). The control circuit (102) contains a Flash memory controller, discussed in greater detail below, which provides control signals to operate the Flash memory (104), as well as a Main RAM controller, also described in greater detail below, which provides control signals to operate and interface with the Main RAM (105). As will be discussed in greater detail below, the Flash memory controller further provides ECC (Error Correction Coding) circuit which performs ECC encoding and decoding for protecting the integrity of data stored in the Flash memory (104).

The control circuit (103) further provides a processor interface via which electronics (106) physically and/or functionally external to the memory system (102), such as one or a plurality of processors, can configure and activate the control circuit (103) to perform tasks in the memory system (102). For example, the tasks can include allowing the electronics (106) to access the Main RAM (105), and performing a bidirectional DMA (direct access memory) transfer between the Flash memory (104) and the Main RAM (105).

In an example embodiment, the control circuit (103) optionally further provides the capability of performing user-defined Flash media management (FMM) algorithms and processes, sometimes referred to as "FMM processes" herein. For example, the FMM processes can include, but are not limited to, one or more of wear-leveling, garbage collection, bad block replacement, power-failure recovery, etc. In an example embodiment, such FMM processes can be performed autonomously by the memory system (102), with minimal or no intervention from the processor(s) outside the memory system (102). When the Flash memory (104) is accessed, the FMM processes map the logical address space to the physical address space, and translate a logical page address (LPA) to a physical page address (PPA).

As will be discussed in greater detail below with respect to FIG. 3, in an example embodiment, an embedded control circuit processor (FMM_P in FMM circuit 311) performs the FMM processes. Volatile memory (FMM_RAM in FMM circuit 311) within the control circuit is used to store the FMM program code for execution by the embedded control circuit processor (FMM_P in FMM circuit 311). In an example embodiment, the FMM program code is a series of instructions based on an instruction set for the embedded control circuit processor (FMM_P). The FMM processes are implemented in program codes which are optionally stored in the nonvolatile Flash memory, and, one embodiment, is loaded into FMM_RAM by the control circuit during the power-on boot process.

Referring back to FIG. 1, the example control circuit (103) further provides a DMA function which performs data transfers among the Flash memory (104) and the Main RAM (105).

The example control circuit (103) optionally further provides a power-on boot control process which, substantially immediately after a power-on reset is deasserted or released, automatically activates or enables the control circuit (103) to load the FMM program code and system initialization program (SIP) code (also referred to as boot code) from the Flash memory (104) into control circuit local memory. For example, the SIP code can be loaded into control circuit volatile RAM allocated for receiving the SIP code (BOOT_RAM), and the FMM code can be loaded into control circuit volatile RAM allocated for receiving the FMM code (FMM_RAM). The power-on boot control process then releases the embedded control circuit processor (FMM_P), and a portion of the external electronics (e.g., a selected processor) from reset so that they can execute their corresponding program codes from the control circuit memory (e.g., FMM_RAM and BOOT_RAM, respectively).

The system initialization program code, hereinafter referred to as the "system boot code", is software which is executed by a first processor (sometimes referred to, without limitation, as a primary processor) in order to initialize certain other portions of the electronic system of the cellular phone when the primary processor is released from power-on reset. By way of example, the first processor can act as a modem processor or as an application processor. Similarly, a second processor (sometimes referred to herein as a secondary processor) can act as the modem processor or as an application processor.

In a second example embodiment of the control circuit (103), the BOOT_RAM is absent in the control circuit (103). Substantially immediately after a power-on reset, instead of loading the SIP code to control circuit memory (BOOT_RAM), the power-on boot control process loads the SIP code into the Main RAM (105) and then releases the primary processor to execute the program code from the Main RAM (105). This embodiment is explained in greater detail herein.

In a third embodiment, the control circuit memory allocated to the SIP code is absent in the control circuit or not allocated for SIP code storage. However, the FMM circuit 311, instead of a boot controller circuit (BOOT_CTLR 3133), has the responsibility of loading the system boot code from the Flash memory to the Main RAM.

In a fourth embodiment of the memory system, the memory system control circuit contains a plurality of Flash memory controllers and a plurality of Main RAM controllers, and thus provides not only more memory space in the memory system, but also a higher data transfer rate.

In a fifth embodiment, the memory system control circuit further provides control signals to operate one or a plurality of displays (e.g., wireless phone LCD or OLED screens), whereby the displays are connected to the memory system via control signals provided by the memory system control circuit. In this embodiment, the primary processor can activate the control circuit to transfer image data from the Main RAM to the displays with little or no external processor intervention.

In a sixth embodiment, the memory system control circuit further provides control signals to operate a removable, self-contained, memory module or card (e.g., an SD, Compact Flash, Memory Stick, or other removable memory device), wherein the memory card is connected to the memory system via the control signals provided by the memory system control circuit. When used in a cellular phone, the cellular phone can access the data storage space provided by the memory card. In this example embodiment, the primary processor can activate the memory system control circuit to transfer data between the Main RAM and the memory card with little or no processor intervention.

In a seventh embodiment, the memory system control circuit operates without the need for Main RAM.

The various embodiments will now be discussed in greater detail with reference to the figures. Various embodiments of the memory system architecture will be described, as will the design and operation of the memory system control circuit. In addition, to further illustrate an example application, the use of various embodiments of the memory system in a wireless, cellular phone will be described.

For example, with reference to FIG. 2, in a first embodiment, a memory system, hereinafter referred to for convenience and not limitation as the "Memory System" (202), is provided as a part of the electronic system of a wireless, cellular phone (201). Other portions of the cellular phone electronic system are hereinafter referred to as the "external electronics" (206). The external electronics may contain, among other elements, one or more processors, hereinafter referred to as the "external processors" (e.g., processors 207, 208). The Memory System (202) comprises of a high-density non-volatile Flash memory, hereinafter referred to as the "Flash Memory" (204), a volatile random access memory, hereinafter referred to as the "Main RAM" (205), and a control circuit, hereinafter referred to as the "Control Circuit" (203).

The Flash Memory (204) and the Main RAM (205) are connected to the Control Circuit (203), and the Control Circuit (203) provides control signals to interface with and operate the Flash Memory (204) as well as control signals to interface with and operate the Main RAM (205). The Control Circuit (203) further provides a processor interface via which one or a plurality of external processors can configure and activate the Control Circuit (203) to perform operations in the Memory System (202). Example operations include allowing the external processors to access the Main RAM (205), and performing bidirectional DMA transfer between the Flash Memory (204) and the Main RAM (205). The Control Circuit (203) also performs operations that are self-configured and self-activated by the Control Circuit (203) with little or no intervention from the external electronics.

It is to be understood that the elements of the Memory System (202), (e.g., the Flash Memory (204), the Main RAM (205), and/or the Control Circuit (203)), do not have to be implemented as three individually packaged, separate devices. Optionally, a subset of these elements can be implemented as a single IC (integrated circuit) or as multiple ICs. The present invention does not limit the level of integration of the physical implementation of the Memory System (202).

It is further to be understood that, in the description herein, the Control Circuit (203) is divided into functional blocks in a way that is suitable for explaining the overall functionality of the Control Circuit (203). It will be appreciated by those skilled in the art that the Control Circuit (203) can be divided into functional blocks in many different ways with different communication signals connecting the functional blocks, while still containing the same overall functionality as described herein. The description of the embodiments herein is not intended to limit how the Control Circuit (203) is to be divided into functional blocks or how the functional blocks are to be connected with one another.

In the present embodiment, the Control Circuit (203) contains writable configuration/control registers and readable result/status registers to provide controllability and visibility of various functions of the Control Circuit (203). It is to be understood that, these registers are provided as an example of how various functions of the Control Circuit (203) can be configured to operate in various modes. It will be understood to those skilled in the art that it is possible to make even more functions of the Control Circuit (203) configurable by adding more registers or otherwise, or to reduce the number of registers and to implement some of the functions in fixed hardwired circuitry without the ability of being programmably configured to operate differently. Further, the configurable functions do not have to be grouped into registers in the same way as the example embodiments described herein. Furthermore, more readable registers can be alternatively added to contain more results and statuses of the operations of the Control Circuit (203) to increase the visibility of various functions of the Control Circuit (203).

While the example Flash memory (204) is depicted as including one or more NAND Flash devices (210), other types of Flash memory, such as AND Flash devices, can be used as well. Similarly, while the example Main RAM (205) is depicted as including one or more SDRAM devices (211), other types of volatile random access memories, such as PSRAM (Pseudo Static RAM) devices, can also be used. A PSRAM includes a DRAM (Dynamic RAM) cell for high density and low bit cost, and has an SRAM external interface.

Figure 2:
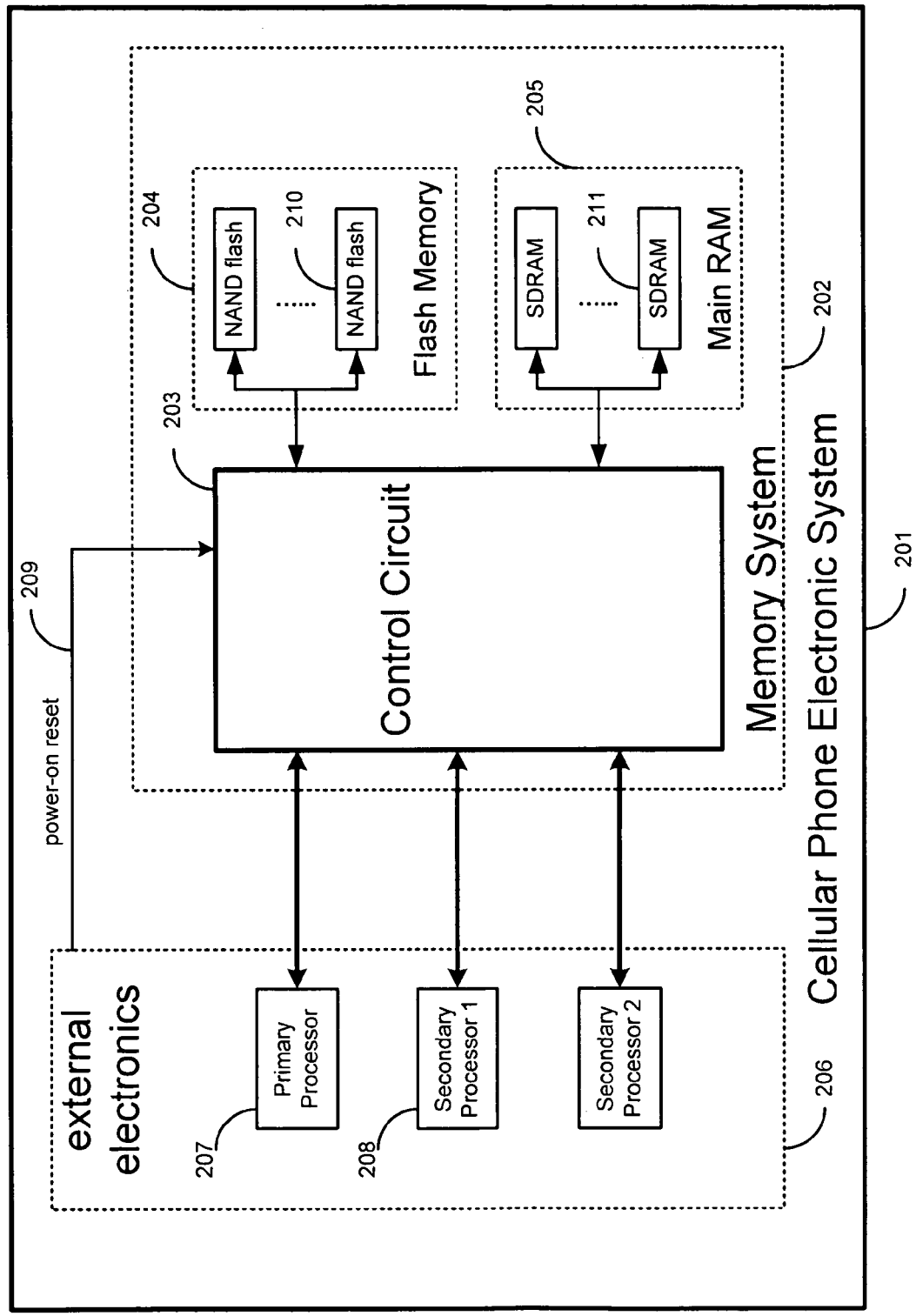
FIG. 2 illustrates a more detailed block diagram of a example wireless phone, such as that of FIG. 1, further illustrating an example memory system.
Figure 3:
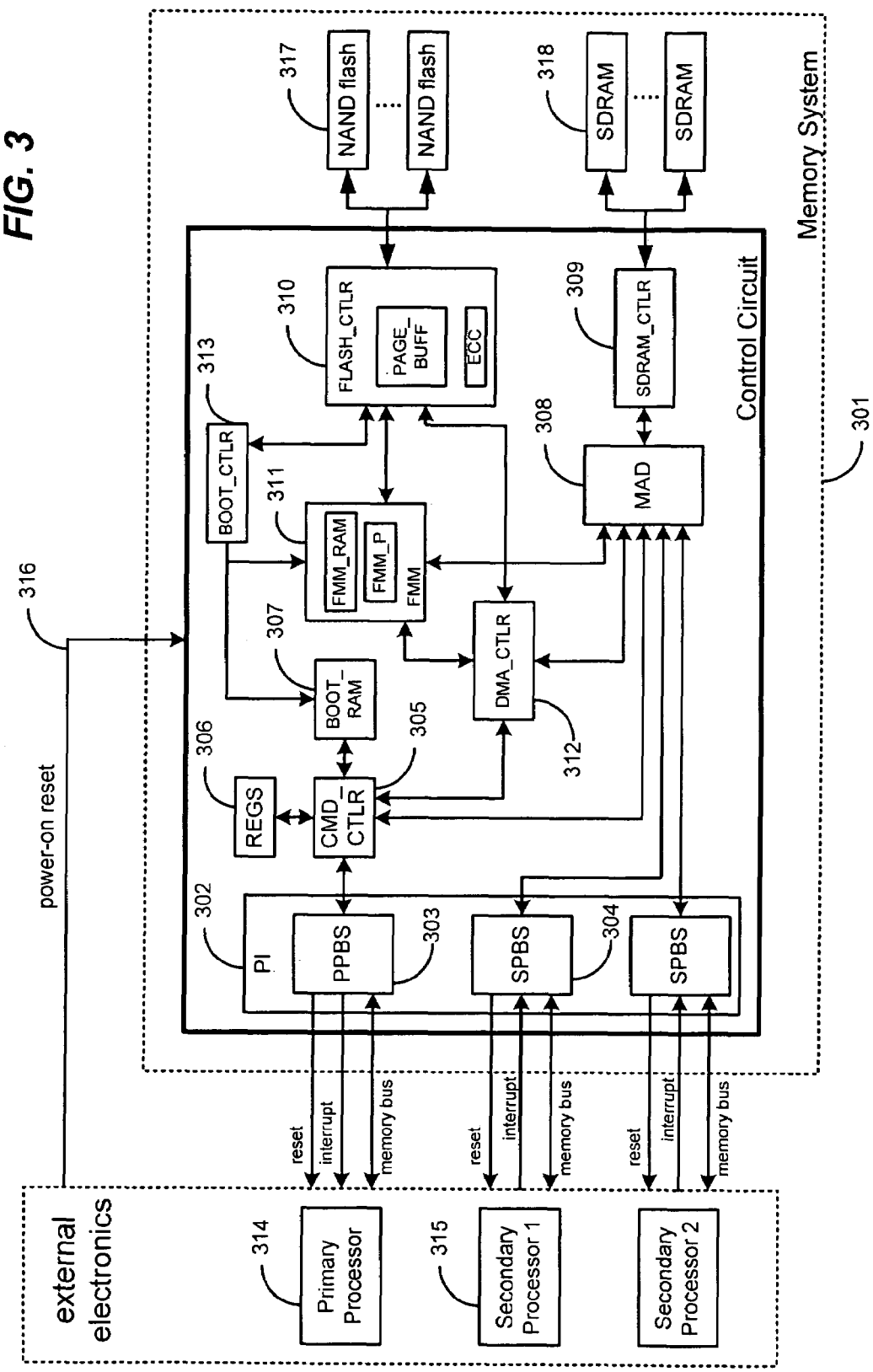
FIG. 3 illustrates a block diagram of a first embodiment of the example memory system control circuit.

FIG. 3 illustrates a block diagram of an example Control Circuit which can optionally correspond to Control Circuit (203) illustrated in FIG. 2. The various example Control Circuit functional blocks are described below, and the operation of the example Memory System (301) is described thereafter.

The Processor Interface Circuit (PI):

The example PI circuit (302) provides an interface to one or more external processors so that the external processors configure, control and/or monitor tasks performed by the Control Circuit, as well as access the data stored in the Memory System (301). The example PI circuit (302) includes Processor Bus Slave circuits (PBSs) (303, 304). A PSB provides an interface to a corresponding individual external processor, such as processors (314, 315). A PBS is attached to a memory bus of its corresponding external processor, and accesses and controls the memory bus in accordance with the memory bus data transfer protocol. Therefore, a PBS appears to its corresponding external processor as if it is a memory device (commonly known as a "bus slave") attached to the external processor's memory bus.

In an optional example embodiment, the interface protocol of the memory bus of the external processors is a "Burst Mode SRAM" interface, which is a well known memory bus protocol often used in modem cellular phones. Two examples of currently commercially available memory devices which comply with this protocol are Pseudo SRAM (PSRAM) and Burst Mode NOR Flash. In other words, in one optional embodiment, each PBS appears to its corresponding external processor as if it is either a PSRAM device or a Burst Mode NOR Flash device attached to the processor's memory bus. The term "Burst Mode" refers to the fact that this interface protocol supports transfer of multiple consecutive words after the transfer is initiated by one transfer command and one address. Typical lengths of a burst transfer are 1, 4, 8 or 16 words, where a "word" refers to the width of the data signal of the memory bus (e.g., a word is a 16-bit data for a memory bus with a 16-bit data signal). This interface protocol further allows the memory device on the memory bus to assert a "wait" signal to temporarily halt the data transfer on the bus in case the memory device is not ready to service the command from the processor.

It is to be noted that, although the Burst Mode SRAM interface protocol is assumed to be the bus interface via which each external processor communicates with its corresponding PBS in this exemplary embodiment, other bus interface protocols can be used. For example, other bus interface protocols allowing the PBS to send a "wait" signal to temporarily halt the data transfer initiated by the external processor in the event that the Control Circuit is not ready to service the external processor can be used.

In the example embodiment illustrated in FIG. 3, a first external processor (314) in the cellular phone is designated as the "Primary Processor" and the other external processors (315) are designated as "Secondary Processors". Similarly, a first PBS (303) in the PI circuit (302) is designated to provide an interface to the Primary Processor and is named the "Primary PBS" (or PPBS). In this example, the other PBSs are designated to provide an interface to their corresponding Secondary Processor and are named "Secondary PBSs" (or SPBSs) (304). Via the PI (302), the external processors can access the data stored in SDRAM (318), while the Primary Processor (314) has the additional responsibility of configuring, activating and monitoring many functions of the Control Circuit, such as the DMA data transfer between the NAND Flash and the SDRAM.

The PPBS (303) translates the memory bus signals from the Primary Processor (314) into commands, data, and address information and then passes this information to a Command Controller (CMD_CTLR 305), which, in turn, activates the appropriate parts of the Control Circuit to perform the associated operations in the Memory System (301). The PPBS (303) further sends data which the Command Controller (305) reads from various parts of the Control Circuit as well as a wait signal back to the Primary Processor (314) via the memory bus. In other words, PPBS (303) is an interface via which the Primary Processor (314) configures, activates and monitors the Control Circuit as well as accesses the data stored in the Memory System (301).

When being accessed by the Primary Processor (314), the PPBS (303) translates the memory bus control signals into one of the following exemplary commands: "RAM Read", "RAM Write", "Register Read", "Register Write", "Download DMA Transfer" or "Upload DMA Transfer" and sends the command to the Command Controller (305). The data and address signals of the memory bus provide the Command Controller (305) with data and address information associated with the command. The data signals of the memory bus are bidirectional to thereby communicate both write data and read data information. If the Control Circuit is busy with other tasks and the command cannot be carried out immediately, then the Command Controller (305) sends a wait signal via PPBS (303) to temporarily halt the data transfer on the memory bus until the command can be carried out. The details of how the Command Controller (305) carries out Primary Processor's commands are described herein.

An SPBS is responsible for translating the memory bus signals from its corresponding Secondary Processor into an SDRAM access request which is sent to the Memory Access Distributor (MAD) circuit (308) to request access to the SDRAM (318), and for providing data read from SDRAM (318) as well as a wait signal back to the processor via the memory bus. The MAD circuit (308) is responsible for receiving multiple requests from various parts of the Control Circuit to access the SDRAM (318) and for granting the request to one of the requesting masters based on a priority scheme. Via the SPBS, the corresponding Secondary Processor can write data to or read data from the SDRAM (318).

If the MAD circuit (308) does not substantially immediately grant access to the SDRAM (318) to the requesting SPBS, then the SPBS sends a wait signal to halt the data transfer on the memory bus until the MAD circuit (308) grants the SPBS access to SDRAM (318). Optionally, a SPBS contains a data buffer (e.g., a first-in-first out buffer, commonly known as a FIFO) providing temporary storage for data being transferred between the corresponding Secondary Processor and the SDRAM (318). The data buffer (not shown) allows for a mismatch between the data transfer rate of the SPBS interface and that of the SDRAM (318) interface. The length of a burst transfer on the SPBS interface and the length of a burst transfer on the SDRAM (318) interface are defined by two registers in the REGS circuit (306), namely the PI_BURST_LENGTH register and the SDRAM _BURST_LENGTH register respectively. The size of a data word for each interface is optionally determined by the width of the data signals of that interface, and is not limited to a particular size.

Figure 4:
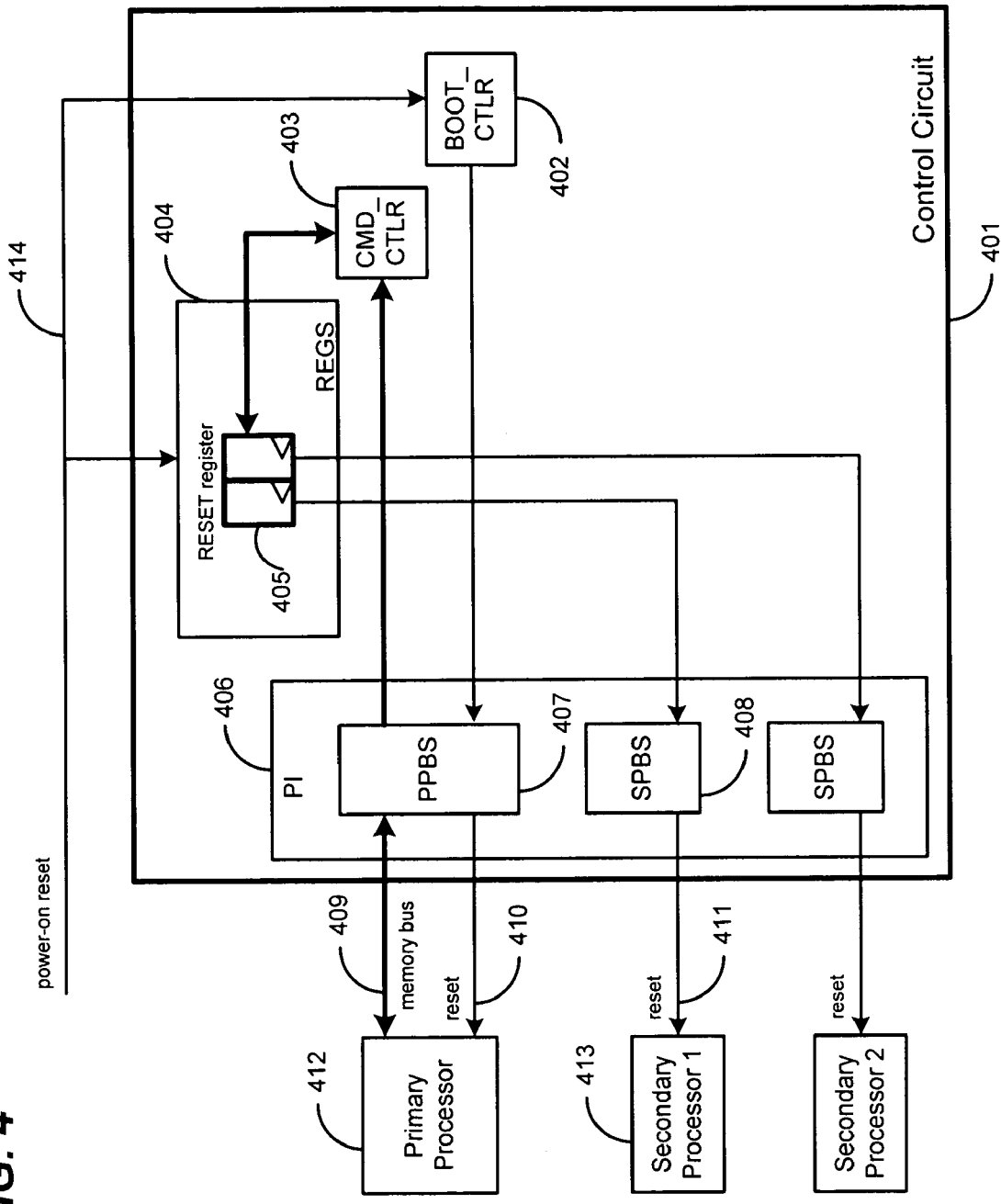
FIG. 4 illustrates a block diagram of an example control circuit reset control.

With reference now to FIG. 4, an example PI circuit (406) includes reset signals, wherein there is optionally an independent reset signal (410, 411) for each external processor (412, 413). The reset signals (410, 411) are provided to the external processors (412, 413) via the corresponding PBS (407, 408). Optionally, the reset signals (410, 411) are controlled, at least in part, by the Control Circuit (401) as follows.

The reset signal (410) coupled to the Primary Processor (412) via PPBS (407) is generated by the BOOT_CTLR circuit (402). The reset signals going to the Secondary Processors via their corresponding SPBSs (408) are output signals of the RESET register (405) in the REGS circuit (404). The power-on default value of the RESET register keeps the Secondary Processors in reset. The Primary Processor (412) can write appropriate values into the RESET registers (405) as needed when the Primary Processor (412) is active. In other words, the reset of each Secondary Processor is optionally controlled by the Primary Processor (412) via the RESET registers (405), whereas the reset of the Primary Processor (412) is controlled by the Control Circuit boot control circuit (BOOT_CTLR 402).

The assertion of the power-on reset (414) by the host device (e.g., a cellular phone) puts the Control Circuit 401 and the external processors (412, 413) into their reset mode. Upon the deassertion of the power-on reset, the BOOT_CTLR circuit (402) begins to perform tasks to initialize various functions of the Control Circuit (401) while at the same time keeping the Primary Processor (412) in reset by keeping its reset signal (410) asserted. After completing the initialization tasks, the BOOT_CTLR circuit (402) deasserts the reset signal (410) to release the Primary Processor (412) from reset. Once the Primary Processor (412) becomes active, it then has the ability to release one or more Secondary Processors from reset and to put one or more Secondary Processors back into reset by writing appropriate values into the RESET registers (405) as required by the particular application.

Figure 5:
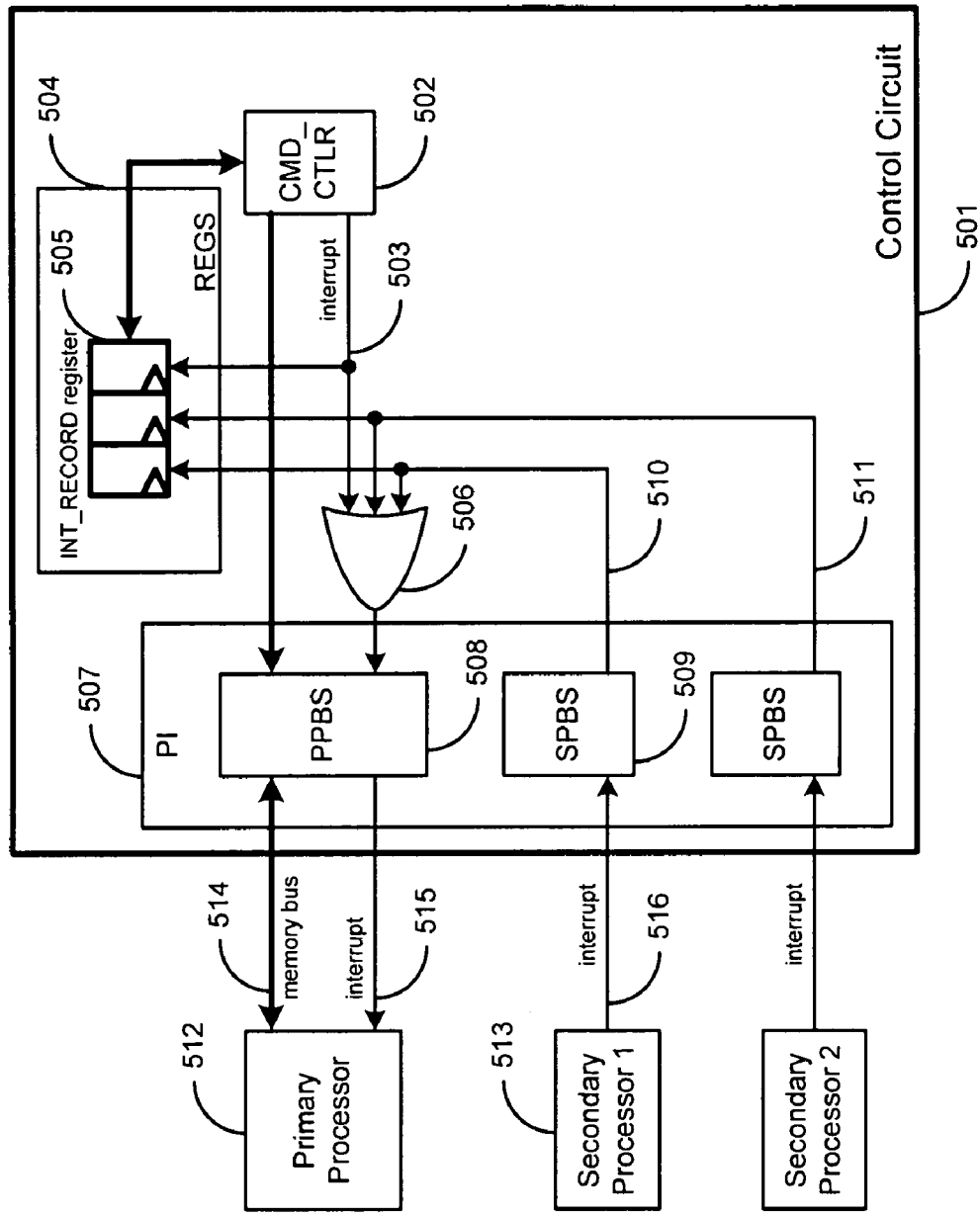
FIG. 5 illustrates a block diagram of an example control circuit interrupt control in the Control Circuit.

With reference to FIG. 5, in an example embodiment, a PI 507 includes interrupt signals, wherein there is optionally an independent interrupt signal (515, 516) for each external processor (512, 513). The interrupt signals (515, 516) are coupled to the external processors (512, 513) via the corresponding PBS (508, 509). Optionally, the interrupt signal (515) is controlled, at least in part, by the Control Circuit (501) via a command controller (CMD_CTLR 502) as follows.

When the CMD_CTLR (502) completes a command received from the Primary Processor (512), it generates an interrupt signal (503), preferably a short pulse, coupled to the REGS block (504) which includes a multi-bit register INT_RECORD (505) that records the interrupt pulse via a register bit. The register INT_RECORD (505) is readable and clearable by the Primary Processor (512).

An example SPBS (509) provides an input port via which its corresponding Secondary Processor (513) can send an interrupt signal (516) into the Control Circuit (501) which goes to the REGS block (504), where it is recorded by a corresponding assigned bit in the INT_RECORD register (505). Thus the interrupt signals (503, 516) generated by the CMD_CTLR circuit (502) and the Secondary Processors (513) are recorded in different, corresponding bits of the INT_RECORD register (505). These interrupt signals (503, 516) are further sent to an OR gate (506) whose output signal goes to the Primary Processor (512) via an output port on the PPBS interface (508). Thus, an interrupt signal generated by a Secondary Processor or the CMD_CTLR circuit (502) is recorded in the INT_RECORD register (505) and is also sent to the Primary Processor (512), which, in turn, can read the register (505) to find out which interrupt is generated and perform the proper routines in response to the interrupt. The Primary Processor (512) can then clear the register (505) or a selected portion thereof so that the register (505) can record future interrupts.

As described above, this example embodiment preferably provides a mechanism via which the Primary Processor (512) controls the reset stage of the Secondary Processors (513). This example embodiment further preferably provides a mechanism via which each of the Secondary Processors (513) can interrupt the Primary Processor (512). However, in certain cellular phones, inter-processor communication mechanism is already provided without involving the cellular phone memory system. For example, in certain cellular phone designs, the multiple processors may actually be implemented on a single chip where sufficient inter-processor communication can easily be provided within the single chip. In such an implementation, the reset and interrupt mechanism provided in this embodiment could be left unused for this purpose, or optionally eliminated, if the external processors in the cellular phone have other mechanisms of controlling and monitoring one another.

In this example embodiment, the PI circuit (507) contains a PPBS (508) and two SPBSs (509). If the cellular phone has only one processor, then this processor would be considered as the Primary Processor (512) and connected to the PPBS (508). The SPBS (513) would be unused or unimplemented in this case.

An example Command Controller (CMD_CTLR, 305 in FIG. 3, 502 in FIG. 5) will now be described in greater detail. While the following description will refer to the CMD_CTRL (305) in FIG. 3, optionally the CMD_CTLR (502) in FIG. 5 can perform the same or similar functions and optionally include the same or similar circuitry:

The CMD_CTLR 305 in FIG. 3 is responsible for receiving the command, data and address information from the Primary Processor (314) via the PPBS (303), and then coordinating the appropriate functional blocks or circuits in the Control Circuit to perform the associated tasks based at least in part on the information received from PPBS (303). Upon the completion of a command, the CMD_CTLR 305 sends an interrupt signal to the Primary Processor (314) via the PPBS (303). The length of a burst transfer on the PPBS interface and the length of a burst transfer on the SDRAM interface can be defined by one or more registers, such as a PI burst length register (PI_BURST_LENGTH) and an SDRAM burst length register (SDRAM_BURST_LENGTH) register respectively. The size of a data word for each interface is determined by the width of the data signals of that interface and is not limited to a specific length.

Example commands which the PPBS (303) is configured to send to the CMD_CTLR (305) are "RAM Read", "RAM Write", "Register Read", "Register Write", "Download DMA Transfer" and "Upload DMA Transfer", as described below:

"RAM Read" and "RAM Write": In the current example embodiment, there are two volatile RAMs which the Primary Processor (314) can directly access in the Memory System (301), i.e. boot ram (BOOT_RAM 307) and SDRAM (318), although other embodiments can provide direct access to fewer or more memories. With respect to the Primary Processor (314), the RAM memory space in the Memory System (301) is divided into two address ranges: an address range for accessing the BOOT_RAM (307) and an address range for accessing the SDRAM (318). When the Primary Processor (314) issues the "RAM Read" or "RAM Write" command, the CMD_CTLR (305) determines whether to access the BOOT_RAM (307) or the SDRAM (318) depending on the address information received via the PPBS (303).

If the address falls in the BOOT_RAM address range, then the CMD_CTLR (305) allows the Primary Processor (314) to perform a burst transfer to or from the BOOT_RAM (307). The address information received from the PPBS (303) also specifies the first of the BOOT_RAM (307) locations to be accessed in the burst transfer. This is the mechanism for the Primary Processor (314) to execute the system boot code stored in the BOOT_RAM (307) substantially immediately after the Primary Processor (314) is released from reset.

If the address falls in the SDRAM address range, the CMD_CTLR (305) allows the Primary Processor (314) to perform a burst transfer to or from the SDRAM (318). Preferably, the CMD_CTLR (305) further contains a data buffer (commonly known as a FIFO) as a temporary storage for data transfers between the Primary Processor (314) and the SDRAM (318). The data buffer allows for a mismatch between the data transfer rate of the PPBS (303) interface and that of the SDRAM (318) interface.

To carry out Primary Processor (314)'s RAM Read or RAM Write command, the CMD_CTLR (305) first sends an access request to the MAD circuit (308) to access the SDRAM (318). Due to the arbitration in the MAD circuit (308), the CMD_CTLR (305) may or may not be granted access to SDRAM (318) immediately after the access request is sent to the MAD circuit (308). In the case where access is not granted immediately, the CMD_CTLR (305) asserts the "wait" signal to the PPBS (303) block to halt the memory bus of the Primary Processor (314) until the CMD_CTLR (305) gets the access grant. For the "RAM Write" command, after being granted SDRAM (318) access, the CMD_CTLR (305) deasserts the wait signal and the Primary Processor (314) sends a burst of data via the PPBS (303) into the data buffer, which the CMD_CTLR (305) transfers to SDRAM (318) via the SDRAM_CTLR.

For the "RAM Read" command, after being granted SDRAM (318) access, the CMD_CTLR (305) continues to assert the wait signal while copying a burst of data in the SDRAM (318) via the SDRAM_CTLR into the data buffer. As the SDRAM (318) data enters the data buffer, the CMD_CTLR (305) deasserts the wait signal and allows the Primary Processor (314) to read the burst of data from the data buffer. This is the mechanism for the primary processor to execute program code stored in SDRAM (318) as well as to access user data stored in the SDRAM (318).

Optionally, the address range for BOOT_RAM (307) is at a lower portion of the memory map starting from address zero since BOOT_RAM (307) is the portion of the RAM space which many processors, such as the example Primary Processor (314), runs program code from after power on, and many processors are designed to fetch the first instructions from address zero after being released from reset. It is to be understood that address range is not the only method to determine whether the Primary Processor (314) is accessing BOOT_RAM (307) or SDRAM (318). Other example methods include, but are not limited to, implementing a configuration register which is writable by the Primary Processor (314) and whose value determines the destination of Primary Processor (314)'s data access.

"Register Read" and "Register Write": For these two commands, the CMD_CTLR (305) writes to or reads from the register in the REGS block (305) addressed by the address information from the PPBS (303). The write data is provided by the data signal of the memory bus via the PPBS (303), and the data read from REGS is sent back on the data signal via PPBS (303) to be read by the Primary Processor (314). This is the mechanism for the Primary Processor (314) to write and read the registers in the REGS block (306) in order to control and monitor the operations of the Control Circuit (301).

"Download DMA Transfer" and "Upload DMA transfer": These two commands cause the CMD_CTLR (305) to activate a DMA controller (DMA_CTLR 312) to perform a DMA transfer from NAND Flash memory (317) to SDRAM (318) or from SDRAM (318) to NAND Flash memory (317) (uploading), respectively. After being activated by the CMD_CTLR (305), the DMA_CTLR (312) obtains information associated with the DMA transfer from a DMA_CONFIG register in the REGS block (306), such as the amount of data to be moved preferably described in number of NAND Flash pages, the starting NAND Flash Logical Page Address (LPA), and the starting SDRAM address.

Thus, for example, the Primary Processor (314) loads appropriate values into the DMA_CONFIG register before issuing the DMA command to CMD_CTLR (305). Upon the completion of the DMA transfer by the DMA_CTLR (312), the CMD_CTLR (305) sends an interrupt signal to the Primary Processor (314) via the PPBS interface to indicate the completion of the DMA transfer.

An embodiment of the Registers (REGS 306) will now be described:

The example REGS block (306) contains configuration registers which configure the modes of operation for the functional blocks which are under the control of the Primary Processor (314) as well as status registers which contain the results or statuses of operations performed by the Control Circuit. The REGS block (306) is controller by the CMD_CTLR (305), which writes to or reads from registers in REGS block (306) after receiving either a "Register Write" or "Register Read" command from the Primary Processor (314) via the PPBS (303) interface. In other words, the REGS block (306) provides the Primary Processor (314) with the capability to configure, activate and monitor the operations performed by the Control Circuit.

In an example embodiment, the REGS block (306) includes one or more of the following registers: A DMA_CONFIG register contains information regarding the DMA transfer between NAND Flash memory (317) and SDRAM (318) such as the starting NAND Flash LPA, starting SDRAM address and the number of NAND Flash pages to transfer. A PI_BURST_LENGTH register defines the length of a burst transfer for each PBS interface in the PI circuit. An SDRAM_BURST_LENGTH register defines the length of a burst transfer for the SDRAM interface. An SDRAM_PARTITION register defines the starting SDRAM address for each Secondary Processor to access, wherein each Secondary Processor optionally is assigned its own starting SDRAM start address. A RESET register individually controls the reset of each Secondary Processor. A MAD_PRIORITY register defines the arbitration priority of SDRAM masters for SDRAM access.

An INT_RECORDS register records the interrupt signal from the CMD_CTLR (305) and each Secondary Processor. A POWER_OFF register, when written with an "active" command by the Primary Processor (314), activates the FMM circuit (311) to perform the power-off procedure with the Memory System. When the FMM circuit (311) completes the power-off procedure, the POWER_OFF register value is changed by a signal from the FMM circuit (311) back to "idle", which is the power-on default value of this register. Optionally, additional writable control/configuration registers and/or readable result/status registers can be added to increase Primary Processor's controllability of the Control Circuit. The above-mentioned registers are presented as examples to illustrate the operation of the Control Circuit and not to limit the invention.

An embodiment of the Boot RAM (BOOT_RAM 307) will now be described with reference to FIG. 3:

In the example embodiment, the BOOT_RAM (307) is a static random access memory (SRAM) for storing "system initialization" program code for the Primary Processor (314) to execute once the Primary Processor (314) is released from reset. The BOOT_RAM (307) is under the control of either BOOT_CTLR (313) or CMD_CTLR (305), but optionally not both at the same time. After power-on reset, the BOOT_CTLR (313) by default has access to BOOT_RAM (307), and as part of the initialization of the Control Circuit, the BOOT_CTLR (313) activates the appropriate parts of the Control Circuit to load the "system initialization" program code from the NAND Flash into the BOOT_RAM (307). After the Control Circuit is initialized, the BOOT_CTLR (313) turns the control of BOOT_RAM (307) over to CMD_CTLR (305) and then releases the Primary Processor (314) from reset so that the Primary Processor (314) can execute, via the CMD_CTLR (305), the program code stored in the BOOT_RAM (307).

An example embodiment of the Memory Access Distributor (MAD 308) will now be described with reference to FIG. 3:

In the Control Circuit, there are multiple functional blocks which can make requests to access the SDRAM (318), (e.g., CMD_CTLR (305), DMA_CTLR (312), FMM (311), and the SPBSs). Any functional block which can access the SDRAM is hereinafter referred to as an "SDRAM master" or simply "master". The MAD circuit (308) arbitrates among the requests from multiple SDRAM masters and gives an access grant to the master having the highest priority based on a priority scheme. The priority scheme can optionally be configured via the a MAD priority register in the REGS block (306). Once a master is granted access, the MAD circuit (308) allows the granted master to gain access to the SDRAM_CTLR (309) and blocks other masters from accessing the SDRAM_CTLR (309) as if the granted master is directly connected to the SDRAM_CTLR (309). Then the granted master begins to utilize the SDRAM_CTLR (309) to perform a burst transfer to/from the SDRAM (318) by sending the transfer-related information to SDRAM_CTLR (309) such as the SDRAM address and the type of transfer (i.e. read or write). For a write burst to SDRAM (318), the granted master provides the burst of data via the MAD circuit (308) to the SDRAM_CTLR (309) which writes the data to SDRAM (318). For a read burst from SDRAM (318), the SDRAM_CTLR (309) reads the burst of data from SDRAM (318) and sends the data via the MAD circuit (308) to the granted master.

The SDRAM Controller (SDRAM_CTLR 309) will now be described with reference to FIG. 3:

The SDRAM_CTLR circuit (309) is responsible for providing control, data and address signals to the SDRAM in order to operate the SDRAM according to the protocols of the SDRAM interface. The data transfer protocols of the SDRAM (318) interface are well-known in the prior art and therefore not described in the present invention. The operations which the SDRAM_CTLR (309) performs include reading bursts of data from and writing bursts of data to SDRAM (318), precharge and refresh to SDRAM (318) as needed according to the SDRAM interface protocol. The SDRAM_CTLR (309) obtains information accompanying a particular transfer such as the write data for a write transfer, the SDRAM address as well as the transfer type (i.e. read or write) from the granted SDRAM master via the MAD block. The MAD circuit (308) arbitrates among the SDRAM masters requesting access to the SDRAM (318), and allows the granted master to send the data, address and transfer type information to the SDRAM_CTLR (309). The SDRAM_CTLR (309) obtains the length of the burst transfer from the SDRAM_BURST_LENGTH register in the REGS block (306), which is loaded with a default value during the power-on of the Control Circuit, and can be changed by the Primary Processor (314) during normal operation.

In an optional embodiment, the SDRAM_CTLR (309) provides a "memory partition" function for the Primary Processor (314) to specify an address range in SDRAM (318) for each Secondary Processor to access. For each SDRAM access initiated by a Secondary Processor, the SDRAM_CTLR (309) adds an offset value to the address from this Secondary Processor to obtain a sum which is used as the real address for the SDRAM access. The SDRAM_CTLR (309) obtains the offset value for each Secondary Processor from the SDRAM_PARTITION register in the REGS block (306) which the Primary Processor (314) can load appropriate values into.

Thus, while in this optional embodiment it appears to each Secondary Processor that it is performing SDRAM accesses in an address range starting from address zero, the SDRAM_CTLR (309) actually performs these SDRAM accesses in an address range starting from an offset address specified by the Primary Processor (314). This mechanism allows multiple Secondary Processors to operate in different address ranges of the SDRAM memory space without the need to modify Secondary Processors' software to fit every different address range arrangement in SDRAM (318). The address range for each external processor may or may not overlap each other depending on the application. When there is an overlapped address range, then this overlapped address range can be used as a shared memory region for the two external processors to exchange information. Optionally, the Primary Processor (314) can access all SDRAM addresses and thus can exchange information with any Secondary Processor utilizing the SDRAM (318).

Optionally, the SDRAM_CTLR (309) further provides the capability of operating multiple SDRAM devices. In one embodiment, the SDRAM_CTLR (309) drives multiple chip select signals to circuitry external to the Control Circuit via multiple output ports, wherein a given chip select signal is connected to the chip select input port of an individual SDRAM device. Optionally, except for the chip select signals, the multiple SDRAM devices share the other control, address and data signals from the SDRAM_CTLR (309). According to an address map built into the SRAM_CTLR (309) or stored in map memory, the SDRAM memory space is divided into multiple address ranges where each address range corresponds to a chip select signal. The SDRAM_CTLR (309) determines which SDRAM device to access, or equivalently which chip select signal to assert, based on which address range the address received from the granted master via the MAD circuit (308) falls into. With this mechanism, the SDRAM memory space of the Memory System (301) can be expanded beyond the maximum space provided by a single SDRAM device.

The Flash Memory Controller (FLASH_CTLR 310) will now be explained with reference to FIG. 3:

The FLASH_CTLR (310) is responsible for providing control signals to operate the NAND Flash memory according to the data transfer protocols of the NAND Flash interface.

The data transfer protocols of the NAND Flash interface are well-known and so will not be described in detail herein. The various functions which the NAND Flash device can be activated to perform via the NAND Flash interface, such as "data input", "auto-program", "read mode", "spare read mode", "block erase" and "device reset", etc., are also well-known and therefore not described in detail herein.

The FLASH_CTLR (310) is under the control of either the BOOT_CTLR (313) or the FMM, but optionally not both at the same time. After the deassertion of the power-on reset, the BOOT_CTLR (313) by default has the control of the FLASH_CTLR (310) and uses the FLASH_CTLR (310) to read FMM program code and the system boot code from the NAND Flash memory (317). The BOOT_CTLR (313) then switches the control of the FLASH_CTLR (310) over to the FMM (311), which uses the FLASH_CTLR (310) to either access the NAND Flash in a DMA transfer between NAND Flash memory (317) and SDRAM (308) or to perform the FMM book-keeping tasks such as reading an address translation table from NAND Flash memory (317) or updating an address translation table in the NAND Flash memory (317).

The FLASH_CTLR (310) contains a buffer, which optionally can be in the form of SRAM, hereinafter sometimes referred to as the PAGE_BUFF. The PAGE_BUFF is used as a temporary storage for data transferred in and out of a NAND Flash page and is used to store data while ECC error corrections are performed. While the FLASH_CTLR (310) is under the control of BOOT_CTLR (313), the PAGE_BUFF is accessible to BOOT_CTLR (313). While the FLASH_CTLR (310) is under the control of FMM (311), the PAGE_BUFF is accessible to either the FMM (311) or the DMA_CTLR (312). When the FMM (311) uses FLASH_CTLR (310) to perform a DMA transfer between NAND Flash memory (317) and SDRAM (318), the DMA_CTLR (312) has access to PAGE_BUFF. When the FMM (311) uses FLASH_CTLR (310) to perform the regular FMM book-keeping tasks, the FMM (311) has access to PAGE_BUFF.

The FLASH_CTLR (310) further contains an Error Correction Coding (ECC) circuit which performs ECC encoding, decoding and corrections to handle and protect against the errors which the NAND Flash media introduces to the data stored therein. As FLASH_CTLR (310) transfers data from the PAGE_BUFF to a NAND Flash device, the ECC circuit performs encoding (e.g., calculating parity codes based on the data being transferred). The parity codes are also transferred to and stored within the NAND Flash device. As the FLASH_CTLR (310) transfers data and the parity codes from the NAND Flash to the PAGE_BUFF, the ECC circuit performs decoding and determines if an error has occurred in the data transferred. If errors are found, the ECC circuit performs corrections to the data by performing, for example, a read-modify-write to the PAGE_BUFF.

The FLASH_CTLR (310) further optionally contains configuration registers (not shown) which the BOOT_CTLR (313) and the FMM (311) can program to provide the information needed to operate the NAND Flash device. An F_COMMAND register contains information indicating the type of operation that the FLASH_CTLR (310) is to perform, such as "page write", "page read", "page spare read", "block erase", "device reset", etc. A PPA register contains the Physical Page Address (PPA) needed for address-specific operations such as "page read", "page write" and "block erase". An F_IDLE register can be written to in order to release the FLASH_CTLR (310) from idle mode and can be read to obtain the status of the FLASH_CTLR (310). Optionally, the power-on default value of this register is "idle", which indicates the FLASH_CTLR (310) is in idle mode.

When written with an "active" command, the F_IDLE register releases the FLASH_CTLR (310) from idle to perform the operation specified in the F_COMMAND register. Upon the completion of the operation, the FLASH_CTLR (310) changes the register value back to "idle". Before the FLASH_CTLR (310) is activated, the F_COMMAND register and optionally the PPA register are setup and written to with appropriate values. After the FLASH_CTLR (310) is activated, the F_IDLE register can be polled to ascertain the operational status of the FLASH_CTLR (310). Furthermore, before the F_IDLE register is written with the value "active", which activates the FLASH_CTLR (310), the F_IDLE register is polled until it contains the value "idle" to ensure the FLASH_CTLR (310) is in idle mode.

Figure 6:
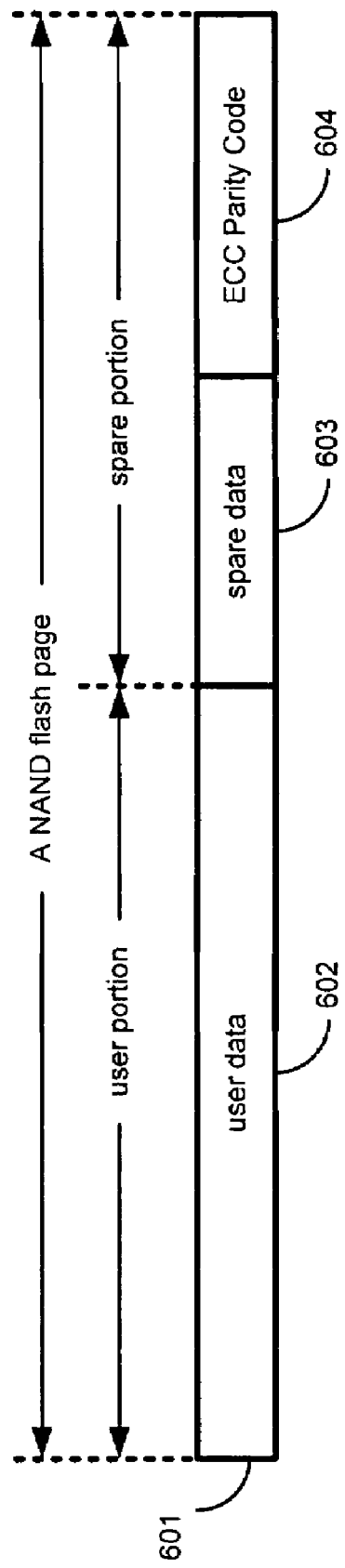
FIG. 6 illustrates a block diagram of an example arrangement of a NAND Flash page for one-level ECC.

Referring now to FIG. 6, a block diagram of an example arrangement of a NAND Flash page for one-level ECC is depicted. The example NAND Flash page (601) is divided into a "user portion" (602) and a "spare portion" (603, 604). The user portion (602), as the name suggests, is used to store user data. The spare portion (603, 604) is used to store ECC parity codes (604) and optionally spare data (603). By way of example and not limitation, the spare data can include one or more of file system flags or book-keeping records for the FMM circuit.

Currently, in many commercially available NAND Flash devices, these two portions are arranged so that either the user portion occupies the lower 512 bytes and the spare portion occupies the upper 16 bytes of the page if each page contains 528 bytes, or the user portion occupies the lower 2048 bytes and the spare portion occupies the upper 64 bytes of the page if each page contains 2112 bytes. In some other commercially available Flash devices, a page may not be divided into two portions by the Flash device manufacturer. In this case, a page can still be conceptually divided into two portions by the user of the Flash device with one portion used as the "user portion" and the other portion used as the "spare portion". Optionally, in a Flash Memory device or system where no ECC is needed and no system-related information such as file system flags or book-keeping records for the FMM need to be stored in the Flash Memory, the Flash devices optionally do not include the "spare portion" in each page and the entire page is considered the "user portion".

FIG. 6 also illustrates an example of how the ECC parity code for a page is stored in the page. In this example, the ECC function is assumed to be a one-level ECC. In other words, the ECC parity code is calculated from the data stored in the "user portion", and optionally data stored in the "spare portion", based on one particular ECC code. The data from which the ECC parity code is calculated, along with the ECC parity code itself, is commonly known as a "codeword". So in a page write operation, a one-level ECC would store one single codeword in a page. In a page read operation, in order for the ECC to perform error detection and error correction, the entire codeword needs be read out of the page. Therefore, a one-level ECC does not provide data protection if only a fragment of the codeword, such as the spare portion data, is read out of the page.

One of the tasks that FMM algorithms and processes may perform is to read the data from the spare portion of a NAND Flash page in order to obtain system-related information such as file system flags or some of the FMM book-keeping records, without reading the user portion data. In this case, a one-level ECC will not provide data protection and the FMM algorithms and processes may receive corrupted information. Therefore, optionally, the ECC function can be implemented as a two-level ECC.

Figure 7:
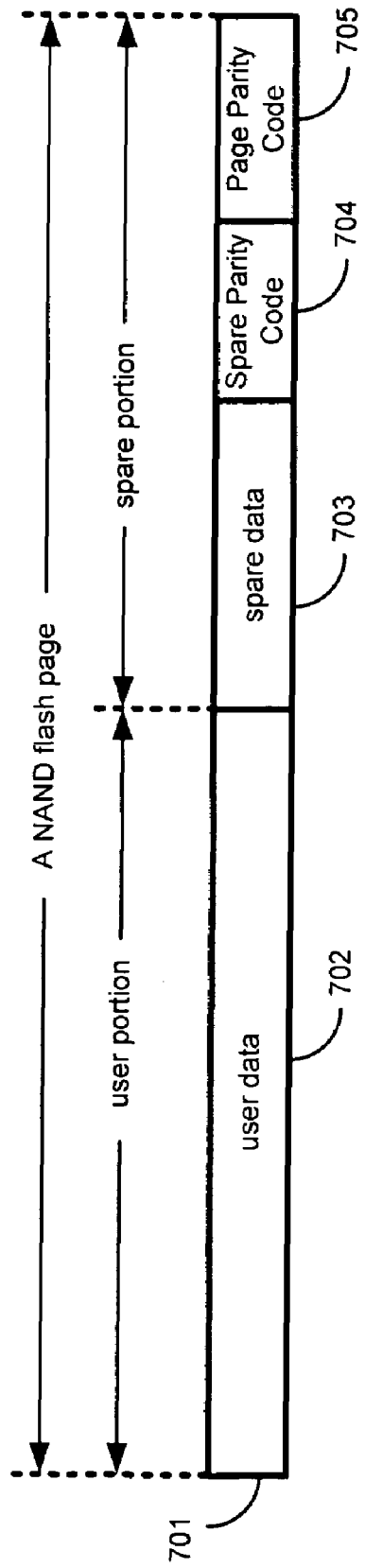
FIG. 7 illustrates a block diagram of an example arrangement of a NAND Flash page for a two-level ECC.

As illustrated in FIG. 7, in an example embodiment, the ECC circuit provides two levels of data protection for a NAND Flash page (701), where one level protects the spare portion data (703), and the other protects the entire page (701), including both the user portion data and the spare portion data. For spare portion protection, the ECC circuit calculates the ECC parity code (Spare Parity Code 704) based on the data to be stored in the spare portion. For protection of the entire page, the ECC calculates the ECC parity code (Page Parity Code 705) based on the data to be stored both in the user portion (702) and the spare portion (703, 704, and 705).

When a FLASH_CTLR, such FLASH_CTLR (310) illustrated in FIG. 3, performs a page write, in addition to writing the user data into the user portion and the spare data into the spare portion, the two ECC parity codes, (the Spare Parity Code (704) and the Page Parity Code (705)), are also written into the spare portion. In other words, two ECC code words are stored per Flash page. When the FLASH_CTLR (310) reads the entire page from NAND Flash memory, the ECC circuit detects and corrects errors in the entire page based on the Page Parity Code. When the FLASH_CTLR (310) reads only the spare portion of a page, then the ECC circuit detects and corrects errors in the spare data based on the Spare Parity Code.

The Page Parity Code may optionally be calculated based on user portion data alone without spare portion data, while Spare Parity Code is optionally still calculated based on spare portion data. In this case, when the FLASH_CTLR (310) reads an entire page, the ECC performs error detection and correction based on both the Page Parity Code and the Spare Parity Code to provide protection on the user portion data and spare portion data respectively. When the FLASH_CTLR (310) reads only the user portion of a page and the associated page parity code, the ECC circuit optionally performs error detection and correction based on Page Parity Code alone.

The error correction codes used by the ECC circuit are optionally block codes, and the present invention is not limited to a particular ECC code or a particular ECC block code.

Two examples of well known block codes that optionally can be used are the Reed-Solomon Code and the Hamming Code. The encoding and decoding algorithms for block codes are also well-known and thus not described in detail herein. If a two-level ECC is used, optionally the two ECC parity codes are based on two different block codes.

Referring again to FIG. 3, the FLASH_CTLR (310) performs NAND Flash page read or page write operations based on the Physical Page Address (PPA) received from the FMM circuit (311) or the BOOT_CTLR, and is not aware of the Logical Page Address (LPA). The BOOT_CTLR optionally only reads from the boot section of the NAND Flash memory (317) and directly generates the PPAs when reading from the NAND Flash memory (317), as in an example embodiment, there is no distinction between the LPA and the PPA for pages in the boot section. Therefore, the BOOT_CTLR (313) can directly use the FLASH_CTLR (310) to access the NAND Flash memory (317) without having to perform a logical-to-physical address translation. However, in a DMA transfer between NAND Flash memory (317) and SDRAM (318), the DMA_CTLR (312) activates the access of each NAND Flash page by issuing the Logical Page Address (LPA) to the FMM circuit (311), which, in turn, translates the LPA to PPA and then uses the FLASH_CTLR (310) to access the NAND Flash page addressed by the PPA.

Optionally, the FLASH_CTLR (310) further provides the capability of operating multiple NAND Flash devices. To accomplish this, in an example embodiment, the FLASH_CTLR (310) drives multiple chip select signals to circuitry external to the Control Circuit via multiple output ports. In this example embodiment, a given chip select signal is connected to a corresponding chip select input port of an individual NAND Flash device. Optionally, except for the chip select signals, the multiple NAND Flash devices share other control and I/O signals to and from the FLASH_CTLR (310). According to an address map hardwired in the circuit of FLASH_CTLR (310) or stored in programmable memory, the NAND Flash storage space is divided into multiple address ranges whereby each address range corresponds to a chip select signal. The FLASH_CTLR (310) determines which NAND Flash device to access, or equivalently which chip select signal to assert, based on which address range the PPA received from the BOOT_CTLR or the FMM circuit (311) falls into. With this mechanism, the NAND Flash storage space of the Memory System can be expanded beyond the maximum space provided by a single NAND Flash device.

Some exemplary operations which the FLASH_CTLR (310) can be activated to perform will now be described. In addition to the operations described, the FLASH_CTLR (310) may further be capable of performing more types of operations with respect to the NAND Flash device(s). Optionally, the FLASH_CTLR (310) can perform additional or different functions then those described herein. In an example embodiment, the F_COMMAND register value specifies the operation which the FLASH_CTLR (310) performs, and not the operation which the NAND Flash device performs.

A "page write" operation involves transferring data in PAGE_BUFF to a NAND Flash page addressed by a PPA. Typically, before the "page write" operation is activated, the PAGE_BUFF is loaded with data to be written to the NAND Flash page, including user portion data and possibly spare portion data. The PPA register is first written with the PPA and the F_COMMAND register with "page write". Then the FLASH_CTLR (310) is activated when the F_IDLE register is written with "active". As used herein, when the phrase "written with" is used with respect to writing a command or status to a register, actually a digital value is being written that corresponds to the command or status (e.g., "active" can be represented by a "00000001" value or other desired representation). The FLASH_CTLR (310), in turn, activates the "data input" function in the NAND Flash device and begins to transfer data from the PAGE_BUFF to NAND Flash device's internal data register. Optionally, concurrently, the ECC circuit is enabled to calculate the ECC parity codes based on the data being transferred to the NAND Flash device.

After the data in the PAGE_BUFF has been transferred to the NAND Flash device, the ECC parity codes are transferred thereafter. Then, the FLASH_CTLR (310) activates the "auto program" function in the NAND Flash device to store the data in its internal data register to the Flash memory cells. Upon the completion of the "auto program" function in the NAND device, the FLASH_CTLR (310) changes the F_IDLE register value back to "idle".

A "page read" operation involves transferring user portion data and possibly spare portion data in a NAND Flash page addressed by a PPA to the PAGE_BUFF and correcting potential errors introduced by the Flash media. The PPA register is first written with the PPA and the F_COMMAND register with "page read". Then, the FLASH_CTLR (310) is activated when the F_IDLE register is written with "active". The FLASH_CTLR (310), in turn, activates the "read mode" function in the NAND Flash device to read data from a page in the Flash memory cells addressed by the PPA into NAND Flash device's internal data register. Then the FLASH_CTLR (310) transfers the page data and ECC parity codes from NAND Flash device's internal data register to the PAGE_BUFF, and in the meantime, enables the ECC circuit to check for errors in the data and make error corrections in the PAGE_BUFF. Upon the completion of error correction, the FLASH_CTLR (310) changes the F_IDLE register value back to "idle".

A "page spare read" operation involves transferring data stored in the spare portion of a NAND Flash page addressed by a PPA to the PAGE_BUFF. The PPA register is first written with the PPA, and the F_COMMAND register is written with a "page spare read" command. The FLASH_CTLR (310) is activated when the F_IDLE register is written with an "active" command. The FLASH_CTLR (310) in turn activates the "spare read mode" function in the NAND Flash device to read the spare portion of a page in the Flash memory cells addressed by the PPA into NAND Flash device's internal data register. The FLASH_CTLR (310) then transfers the spare page data from NAND Flash device's internal data register to the PAGE_BUFF. If two-level ECC is used, the spare parity code is also read from the NAND Flash which the ECC circuit uses to check for errors in the spare data and make error corrections in the PAGE_BUFF. The FLASH_CTLR (310) then changes the F_IDLE register value back to "idle".

A "block erase" operation involves erasing an entire NAND Flash erase unit, known as a "block". A block contains multiple pages. Therefore, in an example embodiment, the FLASH_CTLR (310) derives the block address from the PPA by removing the least significant bits of the PPA. For example, if a block contains 32 pages, then the block address is obtained by removing the least significant 5 bits of the PPA. The PPA register is first written with the PPA, which FLASH_CTLR (310) converts to a block address, and the F_COMMAND register with "block erase". Then the FLASH_CTLR (310) is activated when the F_IDLE register is written with an "active" command. The FLASH_CTLR (310), in turn, activates the "block erase" function in the NAND Flash device. Upon the completion of the "block erase" function in the NAND Flash device, the FLASH_CTLR (310) changes the F_IDLE register value back to "idle".

A "device reset" operation involves restoring the circuitry in the NAND Flash device back to its power-on default state. The F_COMMAND register is first written with "device reset". Then the FLASH_CTLR (310) is activated when the F_IDLE register is written with "active". The FLASH_CTLR (310), in turn, activates the "reset" function in the NAND Flash device. Upon the completion of the "reset" function in the NAND Flash device, the FLASH_CTLR (310) changes the F_IDLE register value back to "idle".

An example Flash Media Manager (FMM) will now be described:

Examples of "Flash Media Management" processes include, but are not limited to, one or more of the following techniques: wear-leveling; garbage collection; bad block replacement; and power-failure recovery. These techniques are used to overcome challenges raised by high-density Flash technology's sensitivity to the number of erase-rewrite cycles performed on a particular erase unit. An erase unit is defined as an area on the storage media which can be erased in a single erase operation. In NAND Flash memory, the erase unit is equivalent to a block, which contains multiple pages (e.g. 32 or 64 pages) where a page (e.g. 528 or 2112 bytes) is a data access unit which can be written to, or read from the storage media with a single write or read command. When an already-written block needs to be overridden with new data, the entire block needs to be erased before the new data can be written to that block. The process of erasing a block, and then writing new data to the block, is counted as one erase-rewrite cycle.

In current high-density Flash devices, a block can usually endure up to 10,000 to 100,000 erase-rewrite cycles, after which, more erase-rewrite cycles would very likely cause defects in the block and the block would not be able to store data reliably anymore. A defective block which cannot reliably store data is referred to as a "bad block" and should not be used to store data anymore. Theoretically, when more and more erase-rewrite cycles have been applied to a Flash memory, there should be fewer and fewer usable blocks and eventually no usable blocks at all.

If software programs, such as operating systems, do not take into consideration the limited erase-rewrite cycles of high-density Flash memory, it is likely that the software would override certain Flash memory locations with new data repeatedly without constraint. An example is the File Allocation Table (FAT) in the file system, which is updated very frequently. This can cause certain blocks to quickly reach their limit of erase-rewrite cycles and become bad blocks. Even if the software replaces the bad blocks with good blocks, wherein good blocks are used to store data which would otherwise be stored in bad blocks, the practice of overriding the same Flash memory locations without constraint can quickly wear out all the good blocks in the entire Flash, or a significant portion thereof, and end the life of the Flash device in an unacceptably short period of time.

To increase or maximize the life expectancy of the Flash devices, many methods of arranging and tracking data in the Flash media have been developed. The methods often involve separating the "logical" address space from the "physical" address space, where the higher-level system software operates the Flash data storage space in terms of "logical" Flash addresses. An address translation scheme translates the logical addresses into physical addresses which are then used by the lower-level device driver software to access the Flash media.

To maintain the association of the logical and physical addresses, address translation tables are usually used. When the higher-level system software overrides an already-written logical address with new data, instead of erasing the associated physical address and writing the new data to the same physical address, the lower-level software actually finds an unwritten physical address and writes the new data to this newly found physical address. The address translation tables are then updated to reflect the new association between the logical and physical addresses. This technique is generally referred to as "Wear Leveling", because multiple writes to the same logical address are distributed to multiple different physical addresses and thus minimizing the wear on a particular physical address.

When a logical address has been rewritten multiple times, the latest data of this logical address is contained in one physical address, but many other physical addresses previously associated with this logical address would contain outdated data. These outdated physical addresses can be reclaimed by performing an erase operation to them which turns them back to "unwritten" physical addresses. This technique is generally referred to as "Garbage Collection".

Even using wear leveling techniques, some blocks are likely to eventually become bad blocks, which cannot be used to reliably store data, and are therefore replaced with good blocks. In other words, when a block becomes a bad block, a good block is then chosen to store the data which would otherwise be stored in the bad block. This technique is generally referred to as "Bad Block Replacement".

The foregoing techniques generally involve maintaining certain book-keeping records, such as one or more of logical-to-physical address translation tables, bad block locations, and physical addresses containing outdated data, etc. To keep track of the data arrangement in the Flash memory, these records are stored in the Flash memory and updated often enough to reflect the latest data arrangement in the Flash memory. However, if a sudden power failure happens before a record gets properly updated in the Flash memory, then when the host device (e.g., a cellular phone) is powered on again, the records would not contain the most current information. To overcome this potential hazard, many convention techniques have been developed to recover the latest book-keeping records in case of a power failure. These techniques are generally referred to as "Power-Failure Recovery" techniques.

The above-mentioned techniques are collectively referred to herein as the "Flash Media Management". There are many Flash media management techniques, which will be known to one of ordinary skill in the art, which can be utilized. However, unlike many conventional cellular phone memory systems, one embodiment provides a method for implementing user-defined Flash media management schemes in the Memory System with little or minimal external processor intervention.

Referring to FIG. 3, the Flash Media Manager (FMM 311) block represents a circuit which performs the Flash Media Management algorithms and processes, and serves as the interface between the logical NAND Flash address space and the physical NAND Flash address space. The example FMM circuit (311) optionally contains an embedded processor random access memory (e.g., static RAM). As previously discussed, the embedded processor is referred to as "FMM_P" and the FMM random access memory is referred to as "FMM_RAM". FMM_RAM provides volatile random access memory which can be used for storing the FMM program code, which the FMM_P can then execute.

FMM_RAM is accessible to BOOT_CTLR (313) and FMM_P, but not both at the same time.

During the power-on boot process, the BOOT_CTLR (313) loads the FMM program code into FMM_RAM, and then releases the FMM_P to access the FMM_RAM to execute the FMM program code stored therein. The FMM program code is a series of instructions based on FMM_P's instruction set. The FMM_P executes the FMM program code by fetching the instructions from the FMM_RAM. The FMM_P optionally also uses FMM_RAM to store intermediate information generated by running the FMM program code and book-keeping records for the FMM algorithms. User-defined Flash media management algorithms can be implemented in the FMM program code which the FMM_P executes to perform these algorithms.

Figure 8:
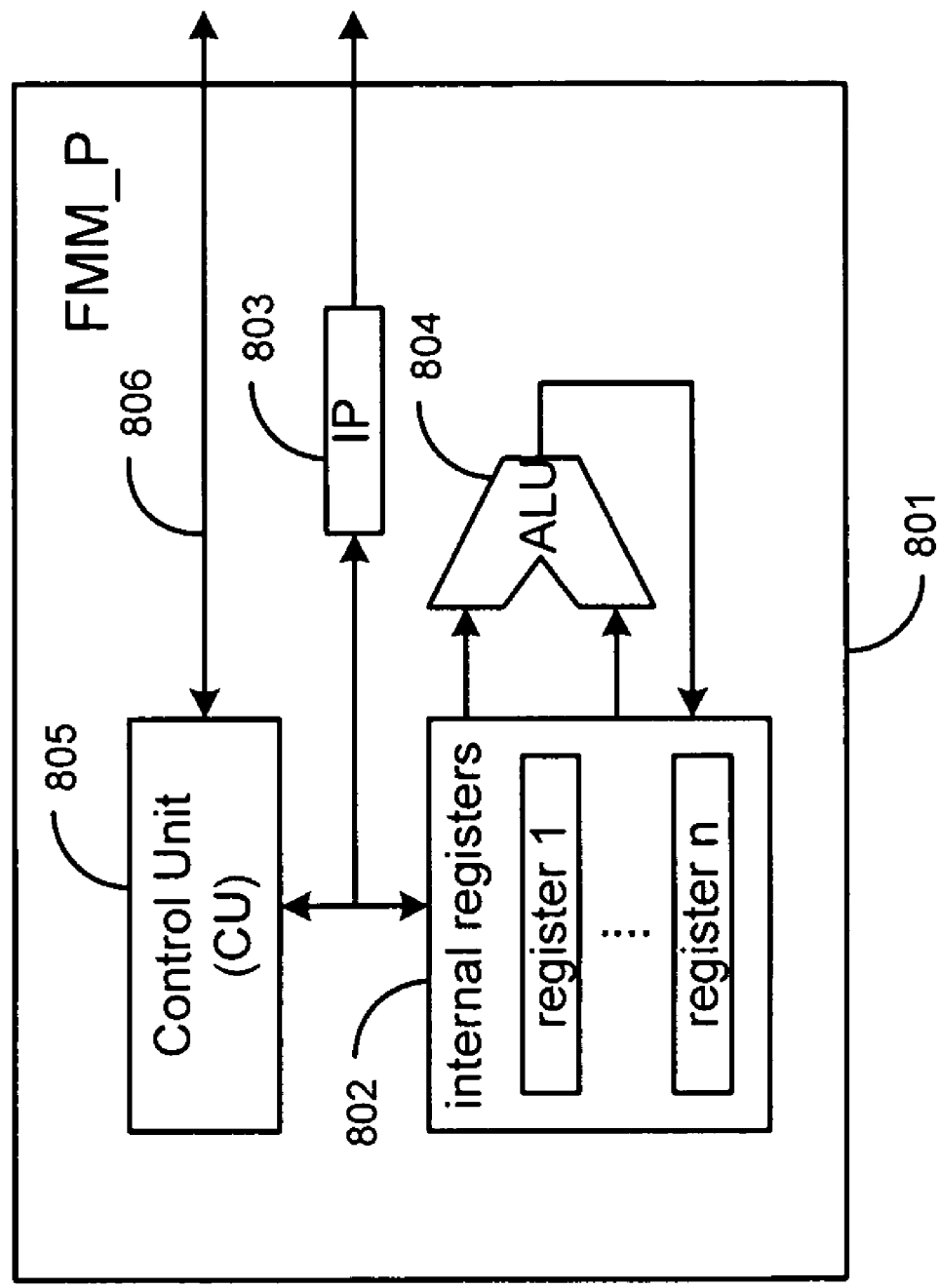
FIG. 8 illustrates a block diagram of an example Flash media management circuit.

FIG. 8 illustrates a block diagram of an example embodiment of an FMM_P (801), which optionally can be used in the system illustrated in FIG. 3. The example FMM_P (801) includes, but is not limited to, internal registers (802), an ALU (804), an Instruction Pointer (IP) (803), and a Control Unit (CU) (805). The internal registers (802) are used to temporarily store data read into the FMM_P (801) as well as data to be written out of the FMM_P (801). The ALU (804) performs arithmetic operations such as addition and subtraction and logical operations such as AND, OR and XOR on the internal registers. The IP (803) is a register which contains the address of an FMM_RAM location containing the next instruction to be read into the FMM_P (801). The CU (805) controls the instruction execution tasks such as changing the IP value, reading instructions and data from FMM_RAM, writing data to FMM_RAM, receiving and reacting to interrupt signals from various parts of the Control Circuit, configuring and activating other functional blocks in the Control Circuit, etc.

Referring back to FIG. 3, the FMM (311) further provides configuration registers (not shown) as the mechanism for BOOT_CTLR (313) and DMA_CTLR (312) to configure and activate the FMM (311). An LPA register contains the LPA of the NAND Flash page to be accessed. An FMM_COMMAND register contains the operation to be performed by the FMM (311), such as "page read", "page write", etc. This register is ignored by the FMM (311) after power-on until the FMM (311) completes the initialization tasks. An FMM_INIT register indicates whether the FMM (311) has been initialized or not. The power-on default value of this register is "not initialized", which is changed by the FMM (311) to "initialized" after the FMM (311) finishes the initialization tasks. An FMM_IDLE register can be written to in order to release the FMM_P (801) from idle mode. The power-on default value of this register is "idle" which indicates that the FMM (311) is in idle mode. When written with the value "active", the FMM_IDLE register releases the FMM_P (801) from idle mode to execute the FMM program code and the FMM (311) begins to perform either the FMM (311) initialization or the task specified by the FMM_COMMAND register. Upon the completion of the task, the FMM (311) changes the register value back to "idle". Before the FMM_IDLE register is written with "active" which activates the FMM, the FMM_IDLE register is polled until it contains "idle" to ensure the FMM (311) is in idle mode.

The FMM_P (801) instruction set provides instructions to write to and read from configuration registers in the FLASH_CTLR (310) in order to configure and activate the FLASH_CTLR (310) to operate the NAND Flash memory (317), as well as instructions to transfer data between the FMM_RAM and the PAGE_BUFF in order to transfer data to and from the NAND Flash memory (317). The FMM_P (801) instruction set further provides instructions to perform data accesses to the SDRAM (318) via the MAD (308) and the SDRAM_CTLR (309) in order to transfer data between the FMM_RAM and the SDRAM. In other words, the FMM (311) is an SDRAM master and accesses SDRAM (318) via MAD according to the access-grant handshake protocol of the MAD block. The FMM_P (801) uses SDRAM (318) to store intermediate information generated by running the FMM program code as well as book-keeping records for the FMM (311) algorithms in case the FMM_RAM does not provide enough memory space for this purpose. With these instructions, the FMM (311) is able to transfer data between the NAND Flash and the SDRAM (318) via the FMM_RAM.

The FMM program code is stored in the nonvolatile NAND Flash memory (317) and is loaded into FMM_RAM by the BOOT_CTLR (313) during the boot up process. However, the FMM (311) is not yet functional while the FMM program code is being read out of the NAND Flash memory (317) by the BOOT_CTLR (313). Therefore, the FMM program code is stored in a section in the NAND Flash memory (317), referred to herein as the "boot section", where the FMM algorithms are not applied and therefore there is no distinction between the logical page addresses and the physical page addresses. In other words, the FMM (311) algorithms are not needed to read the data from the boot section in the NAND Flash memory (317). The boot section is described in more detail with respect to the description of the BOOT_CTLR (313).

Upon the deassertion of the power-on reset, the BOOT_CTLR (313) keeps the FMM (311) in idle mode while loading the FMM program code into FMM_RAM. Then the BOOT_CTLR (313) releases the FMM (311) from idle mode by writing "active" to the FMM_IDLE register, which renders the FMM (311) active. The FMM_P (801) then begins to execute the FMM program code from FMM_RAM. At this time, the FMM_INIT register still contains a "not initialized" indication, which causes the FMM_P (801) to branch to a routine in the FMM program code which instructs the FMM_P (801) to perform FMM initialization.

The FMM initialization is part of the FMM function and therefore is user-defined, wherein the end-device (e.g., a cellular phone) manufacture and/or other appropriate user can define the Flash memory management algorithms and processes. The present invention does not limit the tasks or the sequence of the tasks involved in the FMM initialization. The description below presents several exemplary initialization tasks which the FMM (311) can be used to perform.

The FMM (311) initialization often involves finding and copying the FMM (311) book-keeping records required for Flash media management, such as address translation tables, from the NAND Flash memory (317) to the FMM_RAM or SDRAM (318). Finding the FMM book-keeping records usually involves loading the spare portion of many NAND Flash pages into the FMM_RAM where the FMM (311) examines the spare portion data of each page to determine whether the corresponding NAND Flash page contains FMM book-keeping records. Once a page is found to contain a part of the FMM book-keeping records, the user portion of the page is then read from NAND Flash memory (317) and loaded into FMM_RAM or SDRAM (318).

To copy data (user portion data, spare portion data or both) from a NAND Flash page to FMM_RAM, the FMM (311) generates a NAND Flash PPA and configures the FLASH_CTLR (310) to read the NAND Flash page addressed by the PPA into the FLASH_CTLR PAGE_BUFF. The FMM (311) then loads the data from the PAGE_BUFF to the FMM_RAM. To copy data from a NAND Flash page to SDRAM, the FMM (311) first generates a NAND Flash PPA and an SDRAM address and then configures the FLASH_CTLR (310) to read the NAND Flash page addressed by the PPA into the FLASH_CTLR PAGE_BUFF. The FMM (311) then reads the data from the PAGE_BUFF into the FMM_RAM and writes the data from the FMM_RAM to SDRAM (318) via the MAD (308).

After the initialization of the Flash media management is completed, the FMM (311) changes the FMM_INIT register value to "idle" and the FMM_IDLE register to "initialized". From this point on, the FMM (311) is ready to perform logical-to-physical address translation and thus ready to receive commands from the DMA_CTLR (312) to support DMA transfers requested by the Primary Processor. When released from idle mode again, the FMM_INIT register's value "initialized" instructs the FMM_P (801) to branch to the part of the FMM program code to perform the operation specified by the FMM_COMMAND register instead of performing the initialization.

The FMM book-keeping records may be kept in the FMM_RAM, SDRAM (318), or both during normal operation. Because the FMM program code is already in the FMM_RAM, the book-keeping records may also be easily stored in the FMM_RAM. For the purpose of explaining the operation of the present embodiment, the description below assumes that the FMM book-keeping records are kept in the SDRAM (318). When the FMM algorithms need to read the book-keeping records stored in the SDRAM (318) to perform certain tasks (e.g., reading the address translation tables to perform logical-to-physical address translation), the FMM (311) copies a portion of the book-keeping records from SDRAM (318) via the MAD (308) to FMM_RAM where the FMM algorithm code reads the copied data. When the FMM algorithm code needs to update a portion of the book-keeping records in the SDRAM, the FMM (311) generates a new version of the portion of the book-keeping records in the FMM_RAM, and then copies the data from the FMM_RAM to the SDRAM (318) via the MAD (308) to override the older version stored in the SDRAM (318).

From time to time, the FMM algorithms need to write or update certain book-keeping records in the NAND Flash memory (317), which often involves erasing various NAND Flash blocks and copying data from SDRAM (318) to NAND Flash memory (317). To erase a NAND Flash block, the FMM (311) generates the block address of the NAND Flash block to be erased, and then loads the block address to the PPA register and configures the FLASH_CTLR (310) to erase the NAND Flash block. To copy data from an SDRAM address to a NAND Flash page, the FMM (311) first generates a NAND Flash PPA and an SDRAM address, and then reads the data from the SDRAM (318) via the MAD (308) to the FMM_RAM, and writes the data from the FMM_RAM to the FLASH_CTLR PAGE_BUFF. The FMM (311) then configures the FLASH_CTLR (310) to write data in the PAGE BUFF to the NAND Flash page addressed by the PPA.

It is to be noted that the FMM (311) algorithms may initiate an update to the book-keeping records in the NAND Flash memory (317) during the normal operation without being activated or intervened by other functional blocks of the Control Circuit or the Primary Processor (314). When the FMM (311) needs to perform a self-initiated task which prevents the FMM (311) from being able to serve the command written into the FMM_COMMAND register, the FMM (311) changes the FMM_IDLE register value to "active" before such task begins. Upon the completion of the task, the FMM (311) changes the register value back to "idle". Therefore, before the FMM_IDLE register is written with "active" which activates the FMM (311), the FMM_IDLE register is polled until it contains "idle" to ensure the FMM (311) is in idle mode.

By using the configuration registers, the DMA_CTLR (312) can use the FMM (311) to access a NAND Flash page based on an LPA. To configure the FMM (311) to read from a NAND Flash LPA, the DMA_CTLR (312) writes the LPA to the LPA register and a command "page read" to the FMM_COMMAND register. Then the DMA_CTLR (312) writes "active" to the FMM_IDLE register to activate the FMM (311) and begins to poll the FMM_IDLE register. Once activated, the FMM (311) performs the logical-to-physical address translation to convert the LPA to a PPA and then configures the FLASH_CTLR (310) to read the physical NAND Flash page of this PPA. When the FLASH_CTLR (310) finishes the page read, the FMM (311) changes the FMM_IDLE register value to "idle", which indicates to the DMA_CTLR (312) that the NAND Flash page data is now in the PAGE_BUFF. The DMA_CTLR (312) can then read from the PAGE_BUFF to obtain the page data.

To configure the FMM (311) to write data to a NAND Flash LPA, the DMA_CTLR (312) first writes data to the PAGE_BUFF and the LPA to the LPA register and a command "page write" to the FMM_COMMAND register. Then the DMA_CTLR (312) writes "active" to the FMM_IDLE register to activate the FMM (311) and begins to poll the FMM_IDLE register. Once activated, the FMM (311) performs the logical-to-physical address translation to convert the LPA to a PPA and then configures the FLASH_CTLR (310) to write data in the PAGE_BUFF to the physical NAND Flash page of this PPA. The FMM (311) then changes the FMM_IDLE register value to "idle", which indicates to the DMA_CTLR (312) that the page write is completed.

Optionally, the FMM program code is configured to prevent certain areas in the NAND Flash memory (317) from being erased or overridden if these areas contain important data such as the system boot code, the FMM program code, and essential operating system program codes, etc. This measure protects important data stored in the NAND Flash memory (317) from being altered by accident or by malicious application software with the intent to damage data in the NAND Flash memory (317). The protected NAND Flash memory (317) areas are hereinafter referred to as the FMM-protected areas. The FMM-protected areas may be specified in the FMM program code in terms of logical address, physical address or both. For example, when the DMA_CTLR (312) configures the FMM (311) to write to a NAND Flash page of an LPA, the FMM (311) first checks to see if the LPA falls within an FMM-protected area. If it does, then the FMM (311) does not perform the LPA-to-PPA translation or activating FLASH_CTLR (310) to write to the corresponding PPA. One area that it may be particular desirable to protect is the area where the FMM program code is stored, because the FMM program code itself needs to be protected in order to provide protection for other data in NAND Flash memory (317).

The FMM-protected areas defined in the FMM program code cannot be altered by the Primary Processor (314) in the example embodiment, as the FMM program code is read from the NAND Flash memory (317) by the BOOT_CTLR (313) hardware and the FMM (311) becomes functional before the Primary Processor (314) is released from reset. If the FMM-protected areas include the boot section, then the FMM program code and the system boot code also cannot be altered by the Primary Processor. In other words, the FMM (311) can provide protection of data stored in the NAND Flash memory (317) against the software programs executed by the Primary Processor (314) or other processors in the external electronics.

When the user issues a command to turn off the power supply (e.g., by pushing the power-off button) to the host device (a cellular phone, for example), the FMM (311) algorithms may need to update certain book-keeping records in the NAND Flash memory (317) so that the most up-to-date book-keeping records are available when the cellular phone is powered on again. This is referred to as the "power-off procedure". In order for the FMM (311) to complete updating the book-keeping records in the NAND Flash memory (317), the FMM (311) is activated to perform the power-off procedure while the power supply to the Memory System (301) is preferably maintained until the FMM (311) completes the power-off procedure.

Upon receiving the power-off command from the user, the Primary Processor (314) writes "active" to the POWER_OFF register in the REGS block (306), which then sends a signal to the FMM (311) to activate the power-off procedure. The Primary Processor (314) then begins to poll the register while the FMM (311) performs the power-off procedure. When FMM (311) finishes the power-off procedure, the FMM (311) sends a signal to the REGS block to change the POWER_OFF register value back to "idle", which causes the Primary Processor (314) to perform the necessary tasks in the external electronics to turn off the power supply to the cellular phone. When receiving the signal from the REGS block (306) to start the power-off procedure, the FMM (311) may be idle or may be in the process of performing another operation. The FMM program code may be configured to abort the operation in process before starting the power-off procedure, or to complete the operation in process before starting the power-off procedure.

This FMM architecture optionally allows the Memory System (301) to perform Flash media management tasks with little or minimal external processor intervention. The software programs that the Primary Processor (314) executes operate the Flash data storage space in terms of "logical" addresses, and thus external processors do not have the overhead of managing, maintaining or changing the data arrangement in the physical Flash media. This autonomous nature of the FMM (311) provides the benefits as if it is a hardware implementation. Because the FMM (311) is optionally implemented as an embedded processor which runs the user-defined FMM program code in an example embodiment, it is possible for the user to modify the program code without making any changes to the Control Circuit fixed hardware, which allows for easy bug fixes and upgrades to the FMM program code after the Memory System hardware, or even after the cellular phone design has been implemented and fixed. Therefore, the FMM (311) also provides benefits as a software implementation.

Referring to FIG. 3, the example DMA Controller (DMA_CTLR 312) will now be described in greater detail. The DMA_CTLR (312) is responsible for performing DMA transfers between the NAND Flash memory (317) and the SDRAM (318) under the control of, and while being monitored by the Primary Processor (314). More specifically, the CMD_CTLR (305) receives a DMA transfer command (e.g., "Download DMA Transfer" or "Upload DMA Transfer") from the Primary Processor (314) via the PPBS (303), and then activates the DMA_CTLR (312) to perform the DMA transfer. The DMA transfer command itself indicates the direction of the transfer. The "Download DMA Transfer" command causes a NAND Flash-to-SDRAM transfer. The "Upload DMA Transfer" causes a SDRAM-to-NAND Flash transfer. The DMA_CTLR (312) obtains other information accompanying this DMA transfer command from the DMA_CONFIG register in the REGS block (306), such as the amount of data to transfer (e.g., described in number of NAND Flash pages), the starting NAND Flash Logical Page Address (LPA), and the starting SDRAM address. The DMA_CTLR (312) then generates the LPAs of the NAND Flash pages to be transferred, as well as the starting SDRAM address corresponding to each NAND Flash page to be transferred.

To accomplish the DMA transfer of a NAND Flash page, the DMA_CTLR (312) accesses the NAND Flash memory (317) and the SDRAM (318). To access the NAND Flash memory (317), instead of directly controlling the FLASH_CTLR (310), the DMA_CTLR (312) activates the FMM (311) to control the FLASH_CTLR (310) because the DMA_CTLR (312) operates in the logical NAND Flash address space (i.e. The LPAs) and needs the FMM (311) to perform the logical-to-physical address translation based on the FMM algorithms and/or table.

To begin the transfer of a NAND Flash page, the DMA_CTLR (312) writes the LPA and the transfer type (e.g., a "page read" for Download DMA Transfer or a "page write" for Upload DMA Transfer) to the LPA register and the FMM_COMMAND register and then "active" to the FMM_IDLE register. The FMM (311) then performs the address translation to obtain the PPA and configures the FLASH_CTLR (310) to read from or write to the NAND Flash page of this PPA. For Download DMA Transfer, FLASH_CTLR (310) is configured to perform a page read operation. When the FLASH_CTLR (310) finishes the page read operation, the page data is stored in the PAGE_BUFF with potential errors already corrected by the ECC circuit. The DMA_CTLR (312) then generates the next LPA and activates the FMM to perform the next page read from NAND Flash memory (317), while the DMA_CTLR (312) moves the data from PAGE_BUFF to SDRAM (318).

For an Upload DMA Transfer, the DMA_CTLR (312) first moves a page's worth of data from the SDRAM (318) to the PAGE_BUFF, and then activates the FMM (311) to use the FLASH_CTLR (310) to perform the page write operation. As the FLASH_CTLR (310) moves data from the PAGE_BUFF to the NAND Flash memory (317), the DMA_CTLR (312) begins to move the data of the next page from SDRAM (318) to the FLASH_CTLR PAGE_BUFF. This process is repeated until the DMA transfer is completed.

To access the SDRAM (318), as with other SDRAM masters, the DMA_CTLR (312) sends an access request to the MAD (308) and waits for the access grant. When granted, the DMA_CTLR (312) performs a burst transfer to/from the SDRAM (318) by using the SDRAM_CTLR (309) and then sends the access request again to perform the next burst transfer. The DMA_CTLR (312) performs multiple burst transfers to finish the transfer of a NAND Flash page's worth of data. The length of the burst is determined by the SDRAM_BURST_LENGTH register in the REGS block (306) which the Primary Processor (314) loads with the proper value before starting a DMA transfer.

An example embodiment of the Boot Controller (BOOT_CTLR 313) will now be discussed in greater detail, with reference to FIG. 3. The BOOT_CTLR (313) is responsible for performing tasks to initialize the Control Circuit substantially immediately after power-on, such as loading the system boot code and the FMM program code from NAND Flash memory (317) into the BOOT_RAM (307) and FMM_RAM respectively, releasing the FMM (311) from idle and releasing the Primary Processor (314) from reset. The BOOT_CTLR (313) uses the FLASH_CTLR (310) to read from the boot section in the NAND Flash memory (317). Because the FMM algorithms are not applied to the boot section, in one embodiment, there is no distinction between logical and physical addresses for data in the boot section. When reading the boot section, the BOOT_CTLR (313) directly generates the PPAs of the pages in the boot section without logical-to-physical address translation and then uses the FLASH_CTLR (310) to read each PPA from the boot section.

Figure 9:
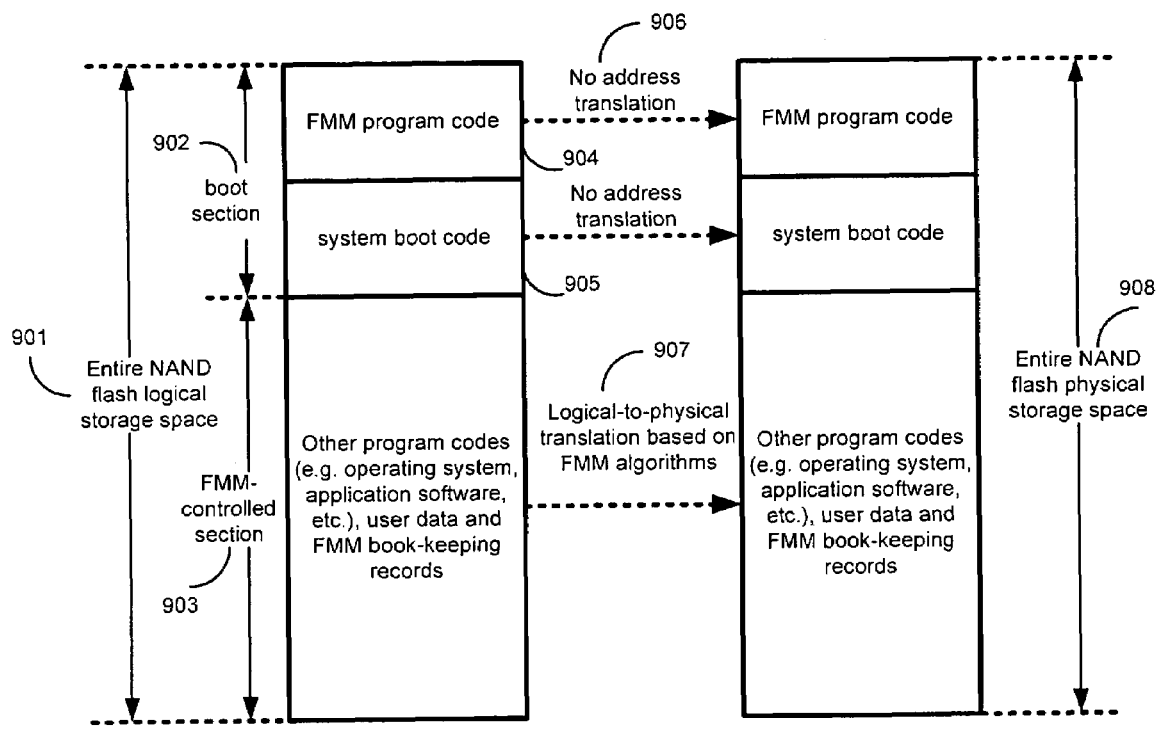
FIG. 9 is a diagram illustrating an example arrangement of NAND Flash storage space.

FIG. 9 illustrates an example NAND Flash storage space (901) allocation. In this example, the NAND Flash storage space (901) is divided into a boot section (902) and an FMM-controlled section (903). The boot section (902) in the NAND Flash memory (e.g., NAND Flash memory (317) in FIG. 3) optionally is excluded from the FMM algorithms that perform wear-leveling, garbage collection, bad-block replacement and power-failure recovery. The boot section (902) is the area where the system boot code and FMM program code are stored. Preferably, these program codes are written into the boot section (902) of the NAND Flash only once when the cellular phone is assembled by the manufacturer, and are not erased during the normal use of the cellular phone, except in the relatively rare event of bug fixes or upgrades to the program codes stored therein.

Thus, the boot section (902) does not undergo the wear of erase-rewrite cycles as much as the rest of the NAND Flash memory does, and thus is not likely to become defective during the life time of the cellular phone. Therefore, the FMM algorithms are optionally not applied to the boot section (902). In other words, in present embodiment, there is no distinction between logical and physical addresses for data in the boot section (902), and so logical-to-physical address translation is not needed when accessing this section (906). The FMM-controlled section (903) is where other program codes, user data, and book-keeping records for the FMM algorithms are stored. In the FMM-controlled section (903), data stored therein are moved around to different physical addresses for wear-leveling and bad-block replacement purposes, and are maintained and tracked by the FMM algorithms. Therefore, logical-to-physical address translations (907) are performed by the FMM (e.g., FMM (311) illustrated in FIG. 3) when accessing data in the FMM-controlled section.

As depicted in FIG. 9, the boot section (902) contains the FMM program code (904) and the system boot code (905). Referring to FIG. 3, the BOOT_CTLR (313) automatically becomes active upon the deassertion of the power-on reset signal, and then configures and activates the FLASH_CTLR (310) to fetch data from the boot section (902) in the NAND Flash memory (317). As each page of the boot section (902) gets fetched into the PAGE_BUFF in the FLASH_CTLR (310), the BOOT_CTLR (313) transfers the page data from the PAGE_BUFF either into the FMM_RAM if the page is part of the FMM program code, or into the BOOT_RAM (307) if the page is a part of the system boot code. The BOOT_CTLR (313) then activates the FLASH_CTLR (310) to fetch the next NAND Flash page into the PAGE_BUFF as the BOOT_CTLR (313) moves data out of the PAGE_BUFF. This process repeats until the program codes in the boot section (902) of the NAND Flash memory (317) are loaded into FMM_RAM and BOOT_RAM (307).

The BOOT_CTLR (313) then writes "active" into the FMM_IDLE register to release the FMM (311) from idle and starts polling the FMM_IDLE register. The FMM_P then begins to execute the FMM program code stored in the FMM_RAM and performs initialization of the FMM algorithms. After the initialization, the FMM (311) changes the FMM_IDLE register value back to "idle" which causes the BOOT_CTLR (313) to deassert the reset signal going to the Primary Processor (314) via the PPBS (303). The Primary Processor (314) then becomes active and begins to execute the system boot code stored in the BOOT_RAM (307). At this point, the BOOT_CTLR (313) has completed its function and will remain idle until the power-on reset signal is asserted and deasserted again, which causes the BOOT_CTLR (313) to repeat the above process.

In order to read the program codes from the boot section (902) in the NAND Flash memory (317), the BOOT_CTLR (313) needs to know the NAND Flash PPA ranges of the FMM program code and the system boot code. One method of providing this information to the BOOT_CTLR (313) is to build or hardwire this information into the circuit of the BOOT_CTLR (313), such that the BOOT_CTLR (313) always reads the program codes from fixed NAND Flash PPAs. Another method is to store a "boot flag" in the spare portion of the NAND Flash pages within the boot section (902), whereby the boot flag identifies the page as either a part of the FMM program code or the system boot code or neither, while the BOOT_CTLR (313) circuit is built with the knowledge of the PPA range of the boot section (902), and with the function of examining the boot flag when a NAND Flash page in the boot section (902) is read into PAGE_BUFF to identify the content of the page as either the FMM program code or the system boot code. Once the content of the page is identified, the BOOT_CTLR (313) then moves the data in the FLASH_CTLR PAGE_BUFF to either FMM_RAM or BOOT_RAM (307).

The operation of certain embodiments will now be described with reference to the flow charts and to FIG. 3.

Figure 10:
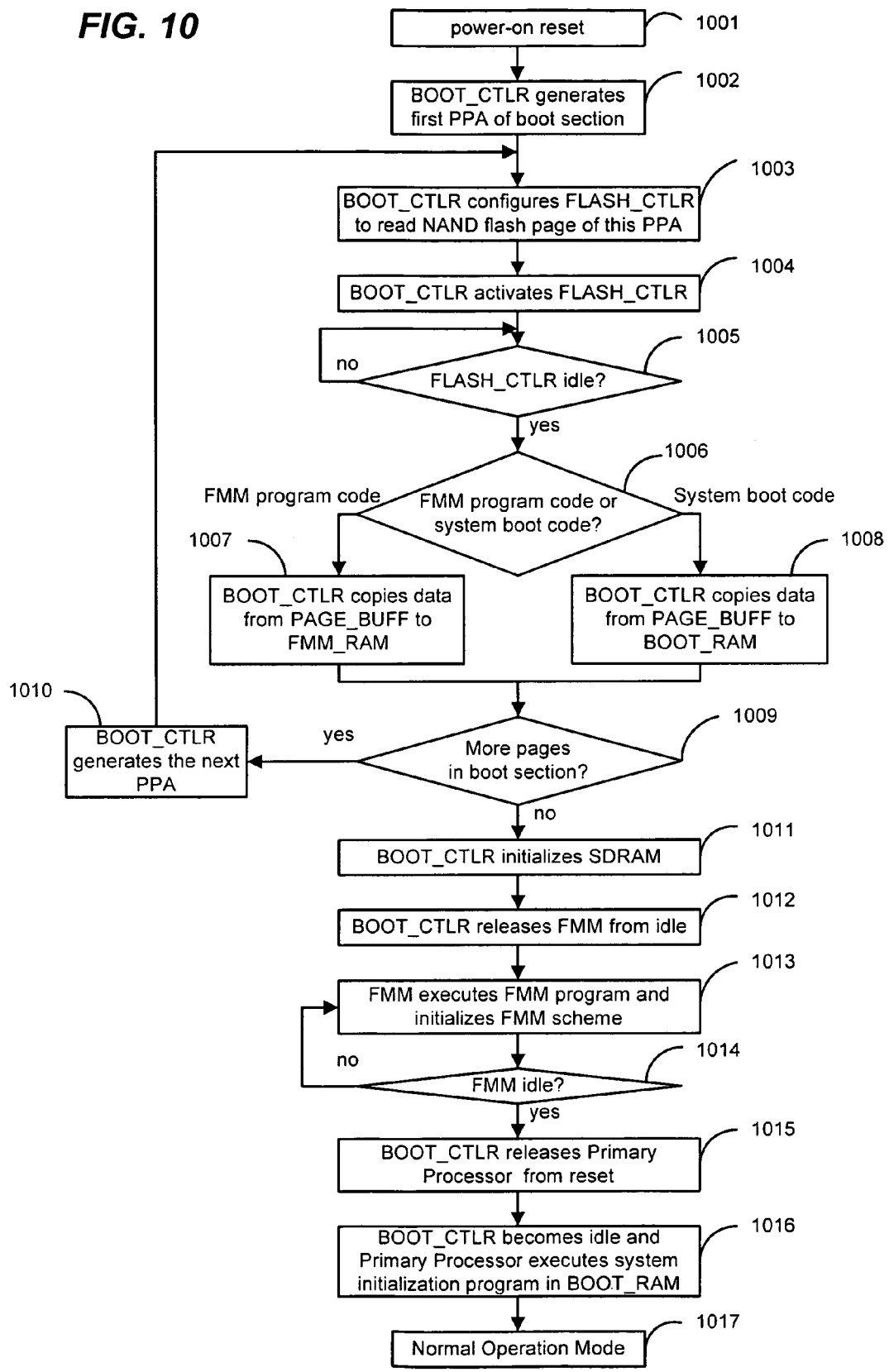
FIG. 10 is a flow chart illustrating an example boot procedure performed by the first embodiment of the memory system, starting from a power-on state to a normal operation mode.

First, the Boot Up After Power-On Reset process will be described. FIG. 10 illustrates an example boot up procedure performed by the BOOT_CTLR (313). The assertion of the power-on reset signal puts the overall Memory System and the external electronics in reset mode. At state (1001), the power-on reset signal is deasserted. Upon the deassertion of the power-on reset signal, the BOOT_CTLR (313) automatically becomes active and begins to generate the first PPA of the boot section at state (1002). The BOOT_CTLR (313) then configures and activates the FLASH_CTLR (310) to read the NAND Flash page of this PPA at states (1003, 1004).

At state (1005), a determination is made as to whether the FLASH_CTLR (310) is idle, and so whether the FLASH_CTLR (310) has completed the page read operation. The read NAND Flash page is stored in PAGE_BUFF with potential errors corrected by the ECC circuit. The BOOT_CTLR (313) then copies the page data from PAGE_BUFF to either the BOOT_RAM (307) or the FMM_RAM, depending on whether this page is a part of the System boot code or the FMM program code, see states (1006, 1007 and 1008).

A determination is made at state (1009) as to whether there are more pages to be transferred. If pages still remain in the boot section, the process proceeds to state (1010), and the BOOT_CTLR (313) repeats the above download process to download other NAND Flash pages until all program codes in the boot section have been read in and copied to either the BOOT_RAM (307) or the FMM_RAM. Then, at state (1012), the BOOT_CTLR (313) releases the FMM (311) from idle. Once released, at state (1013), the FMM (311) begins to execute the FMM program code stored in the FMM_RAM.

At state (1013), the FMM program code instructs the FMM (311) to initialize the FMM scheme such as reading the address translation table in the NAND Flash memory (317)

and copying it to the SDRAM (318). When the FMM (311) completes the initialization at state (1014), then at state (1015) the BOOT_CTLR (313) releases the Primary Processor from reset by deasserting the reset signal going to the Primary Processor (314) via the PPBS interface. Then, at state (1016), the BOOT_CTLR (313) becomes idle, but the Primary Processor (314) becomes active and begins to execute the System boot code in the BOOT_RAM (307). At state (1017), the Memory System (301) enters the "Normal Operation Mode".

The "Normal Operation Mode" refers to the condition where the FMM (311) has been initialized and can perform logical-to-physical NAND Flash address translation, and the Primary Processor (314) has been released from reset to execute the system boot code. In addition, the Primary Processor (314) can, via the PPBS (303) and the CMD_CTLR (305): issue commands to transfer bursts of data in and out of the BOOT_RAM (307) and the SDRAM (318); write to and read from registers in the REGS block (306) to configure/monitor the operations of the Memory System (301); activate DMA transfers between NAND Flash memory (317) and the SDRAM (318); and receive the interrupt signal generated by the CMD_CTLR (305) or one or more of the Secondary Processors. Furthermore, in the normal operation mode, the Secondary Processors can be individually released by the Primary Processor (314) to access the SDRAM (318) and send an interrupt signal to the Primary Processor (314) as needed.

Once in Normal Operation Mode, DMA transfer is a commonly used function. Download and upload DMA transfers performed by the Control Circuit will now be described in greater detail.

Figure 11:
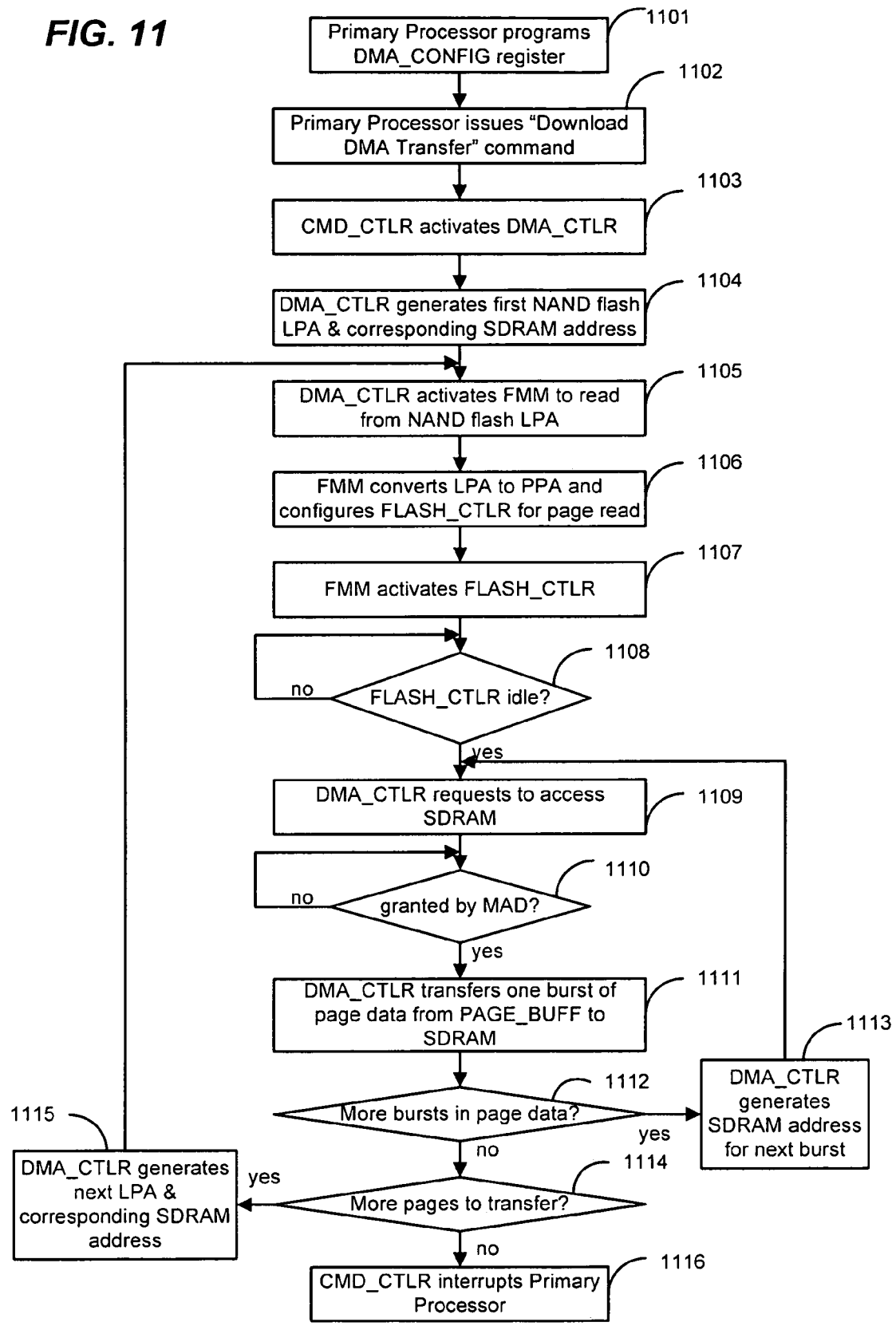
FIG. 11 is a flow chart illustrating an example DMA transfer process that transfers data from nonvolatile Flash memory to volatile SDRAM memory.

FIG. 11 illustrates an example "Download DMA Transfer" process, wherein a NAND Flash-to-SDRAM (318) transfer is performed. At state (1101), the Primary Processor (314) programs the DMA-related information, such as starting NAND Flash LPA, starting SDRAM (318) address and the amount of data to transfer into the DMA_CONFIG register. At state (1102), the Primary Processor (314) issues a "Download DMA Transfer" command", which, at state (1103), causes the CMD_CTLR (305) to activate the DMA_CTLR (312) to perform the DMA transfer. At state (1104), the DMA_CTLR (312) obtains DMA-related information from the DMA_CONFIG register. At state (1104), based on the DMA_CONFIG register information, the DMA_CTLR (312) generates a first NAND Flash LPA and its corresponding SDRAM address, and then activates the FMM (311) to read NAND Flash page of this LPA at state (1105). At state (1106), the FMM (311) performs a logical-to-physical address translation to convert the LPA to PPA and then configures and, at state (1107), activates the FLASH_CTLR (310) to read the NAND Flash page of this PPA.

When the FLASH_CTLR (310) completes the page read operation, as determined at state (1108), the page data is stored in the PAGE_BUFF with potential errors already corrected by the ECC circuit. Now the DMA_CTLR (312) needs to move the page data from PAGE_BUFF to the SDRAM (318). The DMA_CTLR (312) first disassembles the page data into bursts of data aligned to SDRAM bursts and, for a given burst, sends an SDRAM access request to the MAD (308) at state (1109). When, at state (1110), a determination is made that access has been granted, at state (1111), the DMA_CTLR (312) transfers a burst of data from PAGE_BUFF to the SDRAM (318) via SDRAM_CTLR (309). At state (1112), a determination is as to whether there are more bursts in page data that need to be transferred. If there is, then at state (1113), the DMA_CTLR (312) repeats the access to SDRAM (318), and the SDRAM access will continue to be repeated until all page data has been transferred to SDRAM (318). The DMA_CTLR (312) then repeats the page transfer process until the entire DMA transfer is complete (1114, 1115). At state (1116), the CMD_CTLR (304) interrupts the Primary Processor (314) to indicate the completion of the DMA transfer.

Figure 12:
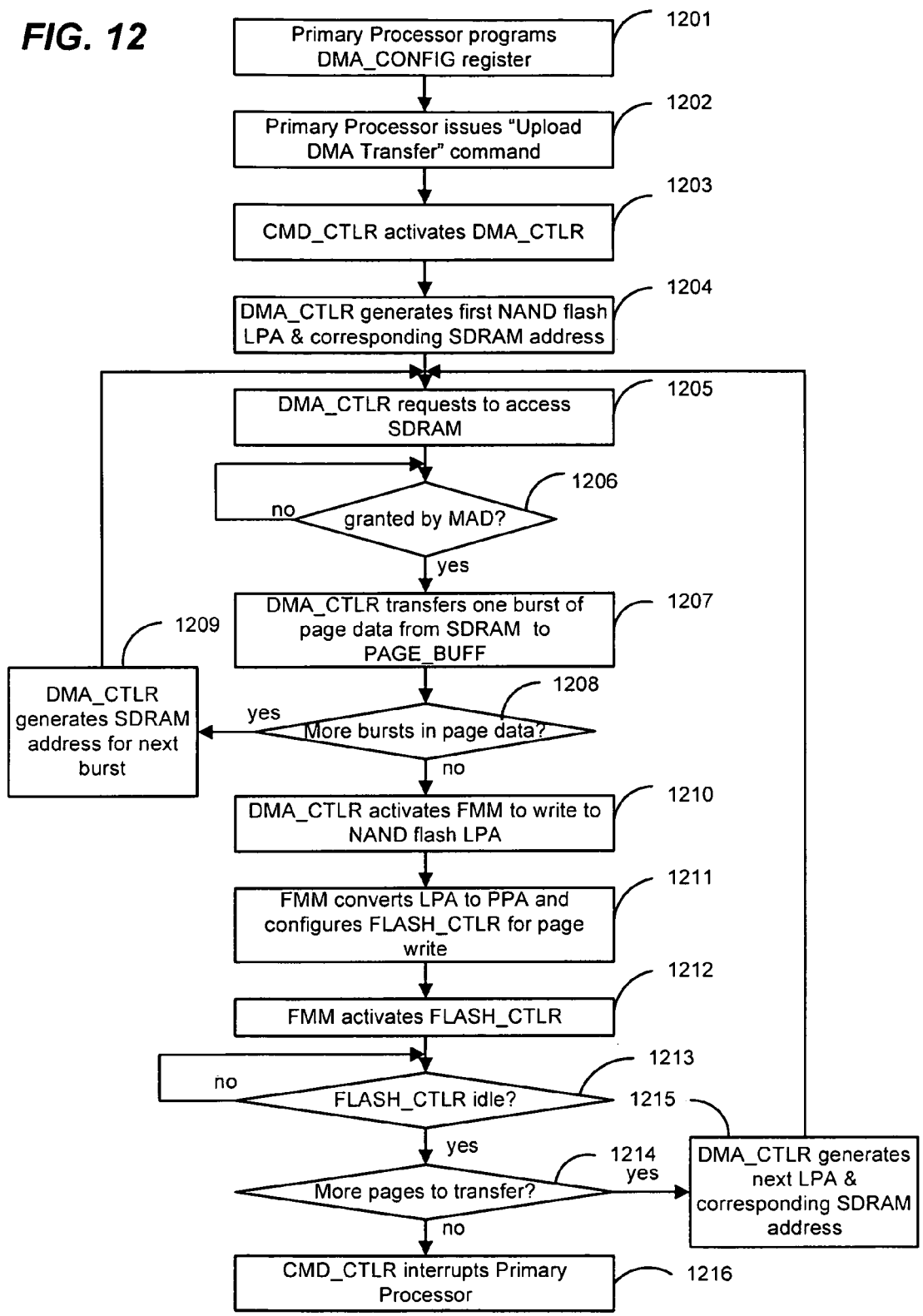
FIG. 12 is a flow chart illustrating an example DMA transfer process that transfers data from SDRAM memory to NAND Flash memory.

FIG. 12 illustrates an example "Upload DMA Transfer" process, wherein an SDRAM-to-NAND Flash transfer process is performed. With reference to FIGS. 3 and 12, at state (1201) the Primary Processor (314) programs the DMA-related information, such as starting NAND Flash LPA, starting SDRAM (318) address, and the amount of data to transfer into the DMA_CONFIG register. At state (1202), the Primary Processor (314) issues an "Upload DMA Transfer" command". This causes, at state (1203), the CMD_CTLR (305) to activate the DMA_CTLR (312) to perform the DMA transfer. The DMA_CTLR (312) obtains DMA-related information from the DMA_CONFIG register. Based on the DMA-related information from the DMA_CONFIG register, at state (1204), the DMA_CTLR (312) generates the first NAND Flash LPA and its corresponding SDRAM address.

The DMA_CTLR (312) begins by moving the page data from SDRAM (318) to the PAGE_BUFF. At state (1206), a determination is made as to whether the MAD (308) has granted access in response to a DMA_CTLR request, wherein the DMA_CTLR (312) first disassembles the page data in SDRAM (318) into bursts and, for each burst, sends an SDRAM (318) access request to the MAD (308) (state 1205). When access is granted, at state (1207), the DMA_CTLR (312) transfers a burst of data from SDRAM (318) to the PAGE_BUFF. With reference to states (1208, 1209), the DMA_CTLR (312) repeats the access to SDRAM (318) until all page data has been transferred to the PAGE_BUFF.

At state (1210), the DMA_CTLR (312) activates the FMM (311) to write the page data to the NAND Flash page of the LPA. At state (1211), the FMM (311) first performs logical-to-physical address translation to convert the LPA to PPA and then configures, and, at state (1212), activates the FLASH_CTLR (310) to write to the NAND Flash page of this PPA. At state (1213), a determination is made as to whether the FLASH_CTLR (310) is idle to determine if the FLASH_CTLR (310) has completed the page write operation, and if the page data and the ECC parity codes calculated by the ECC circuit have been written to the NAND Flash page of this PPA. The DMA_CTLR (312) repeats the same page transfer until the entire DMA transfer is complete by determining at, state (1214), whether there are more pages to transfer, at which time, at state (1216), the CMD_CTLR (305) interrupts the Primary Processor (314) to indicate the completion of the DMA transfer.

Because, in an example embodiment, the size of the BOOT_RAM (307) is small relative to all the program codes stored in the NAND Flash memory (317), the BOOT_CTLR (313) can only load a small amount of program codes into the BOOT_RAM (307) for the Primary Processor (314) to execute substantially immediately after power-on. The Primary Processor (314) often needs many more program codes of much larger size to perform the complex functions of modern cellular phones. Preferably, once in the normal operation mode, the Primary Processor (314) would configure the Control Circuit to perform DMA transfers to copy all of the program codes or at least the basic system program codes, such as the operating system, file system, and device drivers, to SDRAM (318). Afterwards, the Primary Processor (314) may continue to execute from BOOT_RAM (307), or branch to execute from SDRAM (318) as needed. From this point on, the cellular phone (or other host device) enters the "User Mode".

The "User Mode" refers to the condition where, in addition to the Normal Operation Mode, enough software program codes have been transferred from the NAND Flash memory (317) to the SDRAM (318) so that, in the example embodiment where the host device is a cellular phone, the cellular phone's user interface can begin to allow the user to launch functions on the cellular phone.

Figure 13:
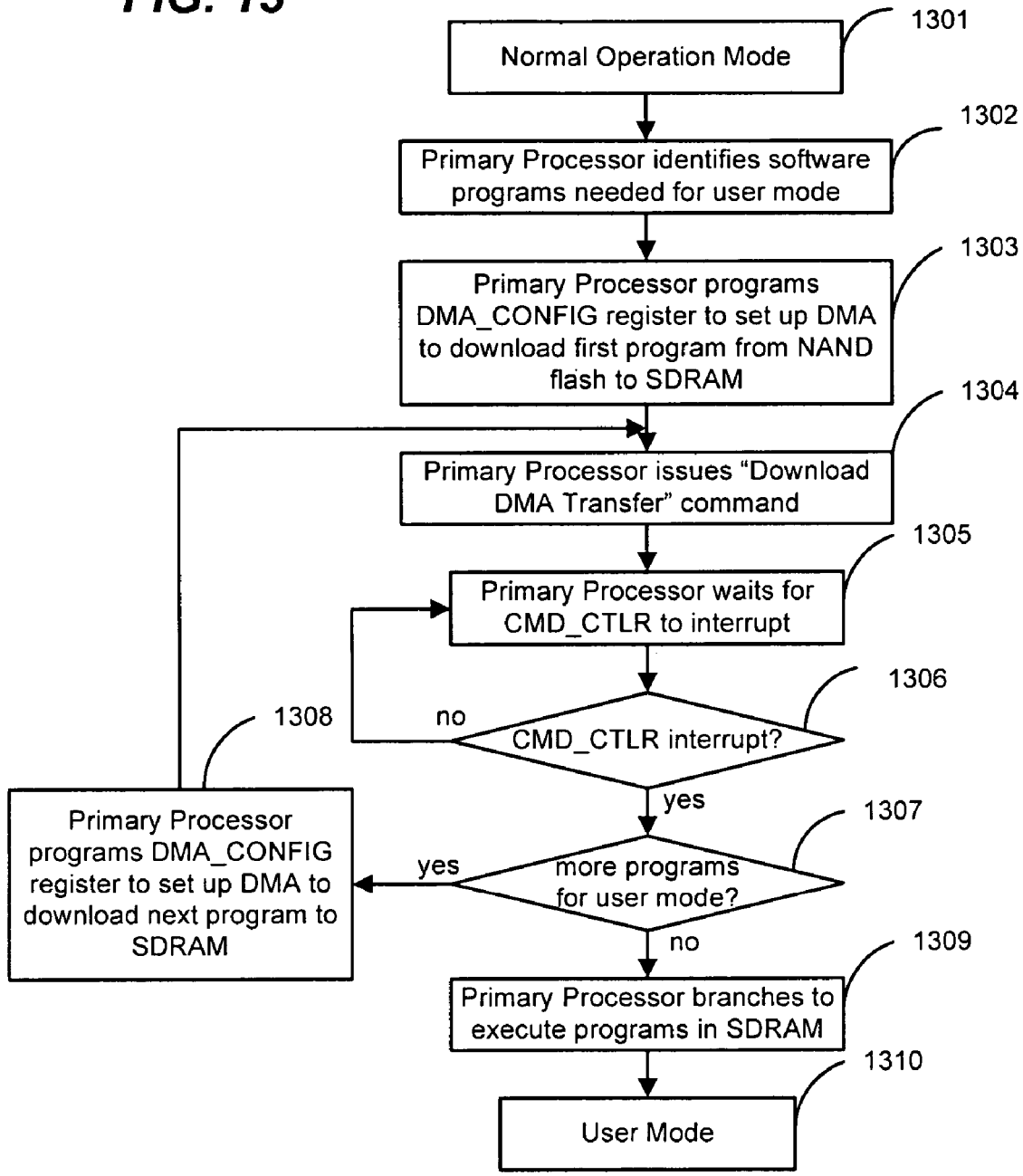
FIG. 13 is a flow chart illustrating an example process, wherein the example memory system enters a User Mode from a Normal Operation Mode.

FIG. 13 illustrates an example procedure performed by the Primary Processor (314) to enter the User Mode from the Normal Operation Mode. At state (1301), the system is in Normal Operation mode. At state (1302), the Primary Processor (314) identifies the programs that are needed for the User Mode. With reference to states (1303 to 1308), for each program, the Primary Processor activates a DMA transfer to copy the program code from NAND Flash to SDRAM, until all program codes required by User Mode have been downloaded from NAND Flash to the SDRAM (318). At state (1309), the Primary Processor (314) then branches to execute the User Mode programs, and at state (1310), enters the User Mode (1310).

In the case where some program codes, (e.g., application software programs), are not copied from NAND Flash memory (317) to the SDRAM (318) before entering the User Mode, these application software programs are copied from NAND Flash memory (317) to SDRAM (318) as needed when the user launches certain applications which require these programs to be executed.

Figure 14:
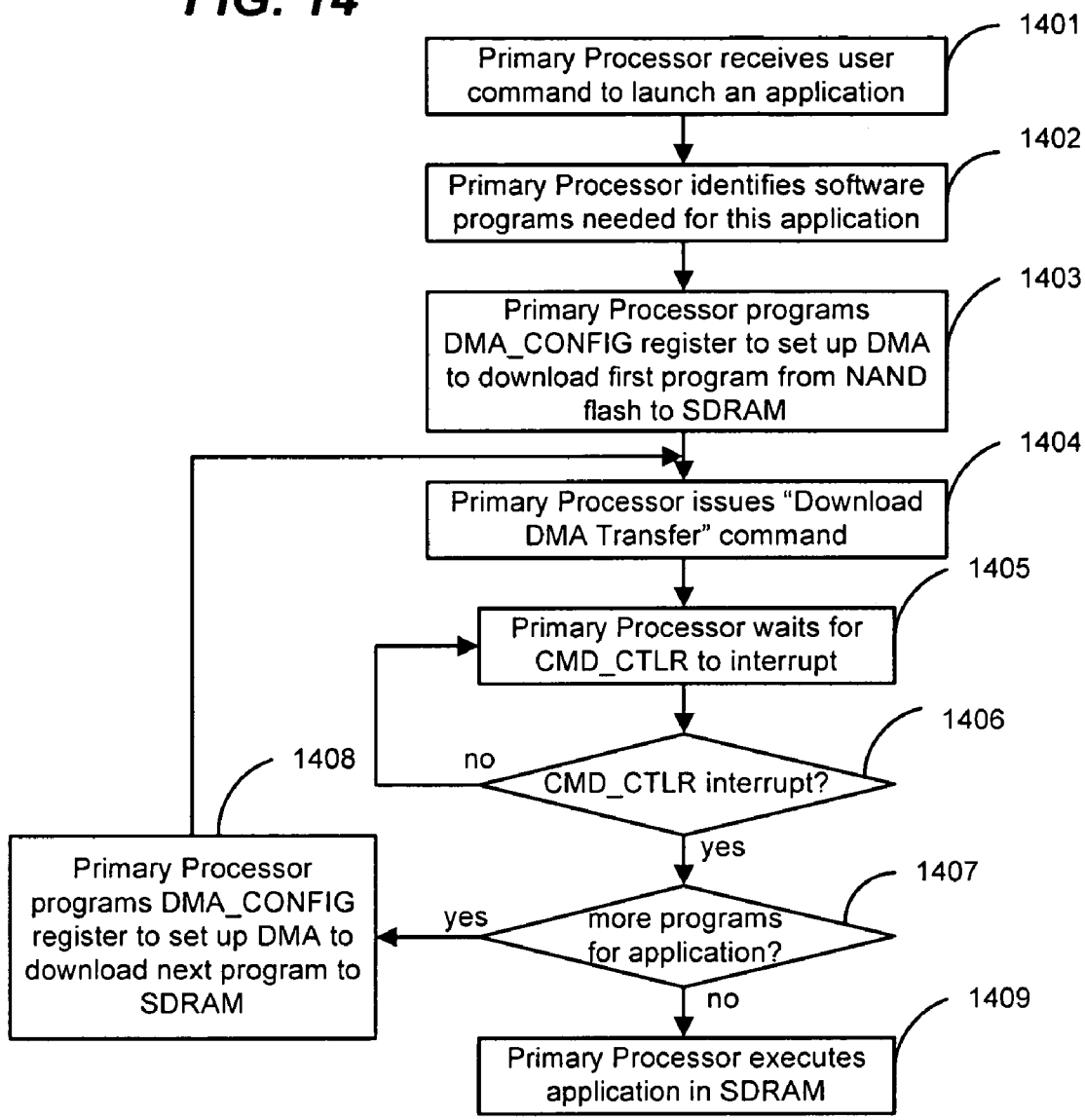
FIG. 14 is a flow chart illustrating an example process, wherein a primary processor runs a user-launched application.

FIG. 14 shows an example procedure via which the Primary Processor (314) executes an application launched by the user while in User Mode. At state (1401), the Primary Processor (314) receives a user command to launch an application. At state (1402), the Primary Processor (314) identifies the programs that are needed for the application launched by the user, but which have not been copied from NAND Flash memory (317) into the SDRAM (318). With reference to state (1403 to 1408), for each program, the Primary Processor activates a DMA transfer to copy the program code from NAND Flash memory (317) to the SDRAM (318). Once the programs needed by the application are stored in the SDRAM (318), then at state (1409), the Primary Processor (314) branches to execute the application.

Optionally, the Primary Processor (314) is further responsible for: copying program codes from the NAND Flash memory (317) to the SDRAM (318) for one or more of the Secondary Processors to execute; controlling, at least in part, a reset of the Secondary Processors; and responding to interrupts generated by the Secondary Processors.

Figure 15:
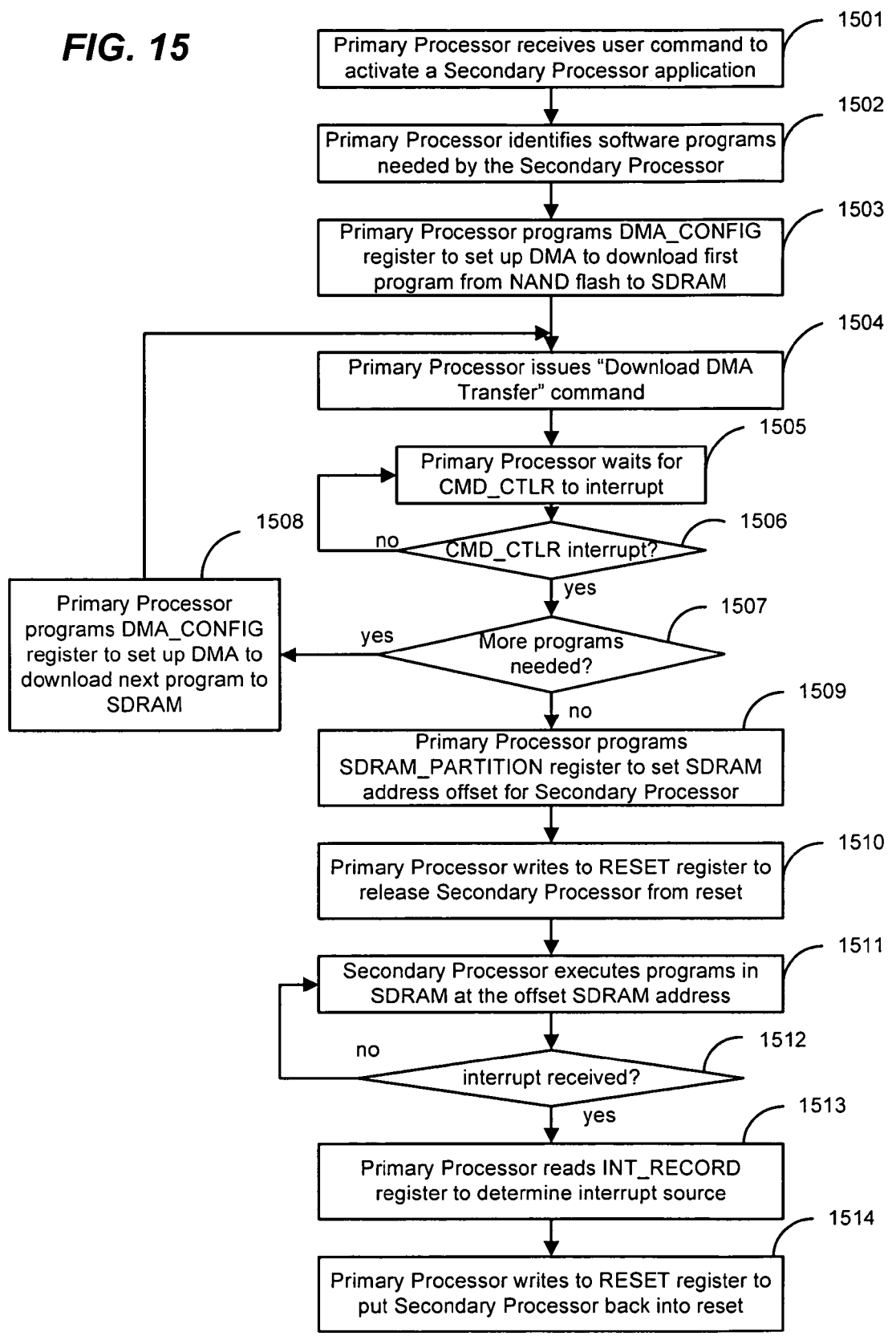
FIG. 15 is a flow chart illustrating an example process, where the primary processor activates a secondary processor and reacts to an interrupt.

FIG. 15 illustrates an example procedure in which the Primary Processor (314) controls a Secondary Processor. At state (1501), the Primary Processor (314) receives a user command to activate an application which is to be performed by a Secondary Processor (e.g., a graphics or multimedia processor). To activate a Secondary Processor, at state (1502), the Primary Processor (314) first identifies the programs that are needed for the specific tasks to be performed by the Secondary Processor. With reference to states (1503 to 1508), for each program, the Primary Processor (314) activates a Download DMA Transfer to thereby copy the corresponding program code from the NAND Flash memory (317) to the SDRAM (318). Once the programs needed by the Secondary Processor are stored in the SDRAM (318), at state (1509), the Primary Processor (314) programs the SDRAM_PARTITION register to properly set a region in the SDRAM (318) for the Secondary Processor to access. This region will include the programs downloaded from NAND Flash memory (317) for the Secondary Processor to execute. At state (1510), the Primary Processor (314) writes an appropriate value to the RESET register to deassert the reset signal of the Secondary Processor. At state (1511), the Secondary Processor becomes active and executes the program codes from the appropriate SDRAM (318) partition.

The Secondary Processor may need to interrupt the Primary Processor (314) for various reasons (e.g. to inform the Primary Processor that the task has completed). In this exemplary procedure, it is assumed that the Secondary Processor only interrupts the Primary Processor upon the completion of operation, although optionally, the Secondary Processor can generate interrupts for other reasons. Upon receiving an interrupt at state (1512), then at state (1513), the Primary Processor (314) reads the INT_RECORD register and determines that a Secondary Processor issued the interrupt. At state (1514), the Primary Processor (314) performs the corresponding routines to react to the interrupt. In this example, at state (1514), the Primary Processor (314) writes to the RESET register to put the Secondary Processor back into reset mode.

In Normal Operation Mode, the Primary Processor (314) further has the responsibility of copying user data from NAND Flash memory (317) to SDRAM (318) and vice versa as needed by the Primary Processor or for the Secondary Processors.

Other Example Embodiments

Several additional example embodiments will now be described. The following description will focus on the elements of the additional embodiments that differ from the first embodiment described above.

In a second example embodiment, the Control Circuit optionally does not have a BOOT_RAM. The BOOT_CTLR is connected to the MAD circuit such that the BOOT_CTLR can access the SDRAM via the MAD circuit. The boot up procedure is performed by the BOOT_CTLR differs from that described above with respect to the first embodiment. After power-on, instead of copying the system boot code from the NAND Flash memory to the BOOT_RAM, the BOOT_CTLR optionally initializes the SDRAM using the SDRAM_CTLR, and then loads the system boot code to SDRAM before releasing the Primary Processor to execute code from SDRAM.

Figure 16:
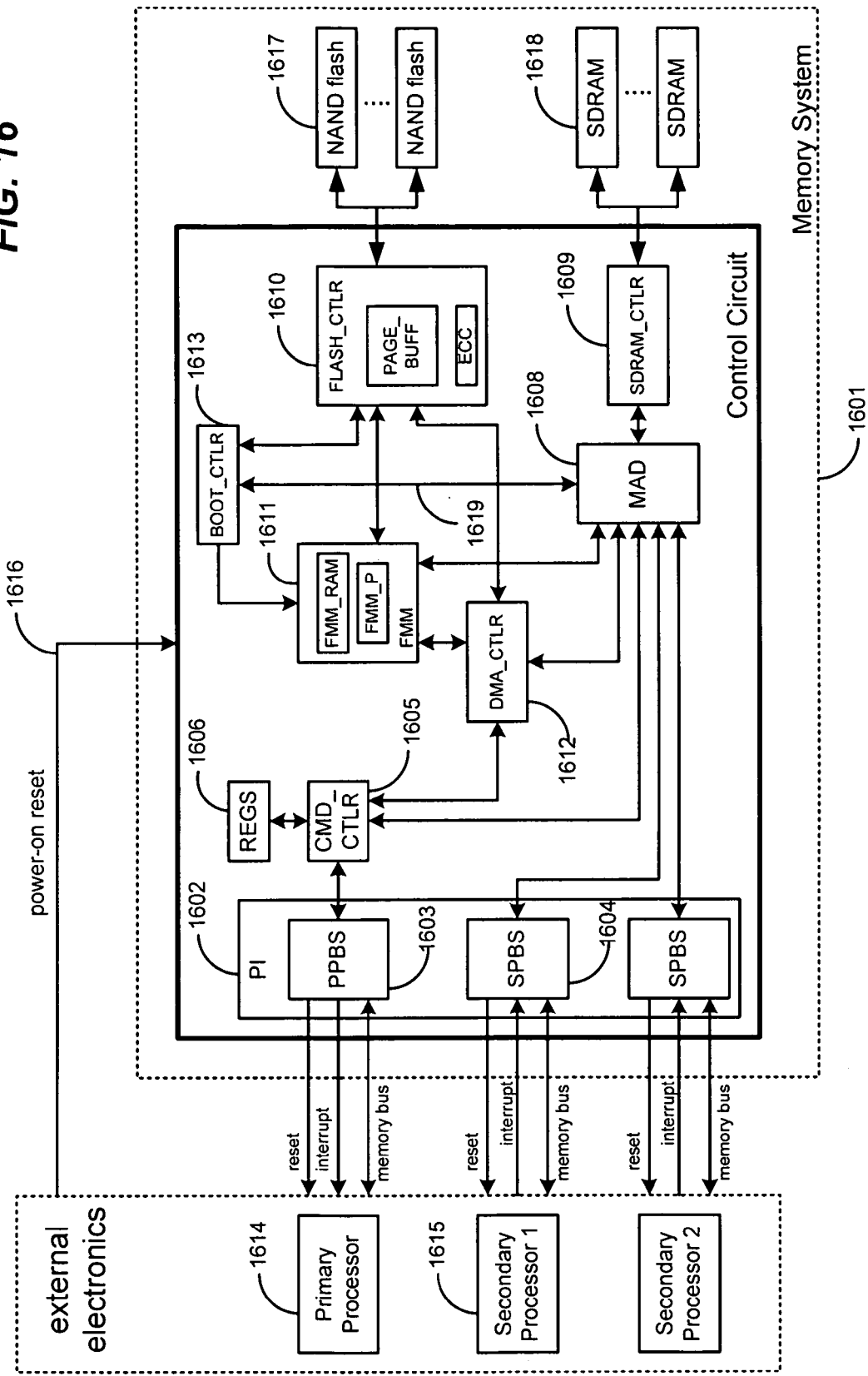
FIG. 16 illustrates a block diagram of a second embodiment of a memory system.

FIG. 16 illustrates the second embodiment of the Memory System (1601). The functional blocks of the Control Circuit in this embodiment which differ from those discussed above will now be described.

The example embodiment includes a Primary Processor (1614), one or more Secondary Processors (1604), a PI (1602) (which includes a PPBS (1603), and one or more SPBSs (1604)), a CMD_CTLR (1605), a REGS block (1606), a MAD (1608), an FMM (1611), a DMA_CTLR (1612), an SDRAM_CTLR (1609), a FLASH_CTLR (1610), a BOOT_CTLR (1613), NAND flash memory (1617), and SDRAM (1618).

As previously discussed, the BOOT_RAM is absent in this embodiment.

The example BOOT_CTLR (1613) of the present embodiment differs from that of the first embodiment in that, instead of moving the system boot code into the BOOT_RAM, the BOOT_CTLR (1613) moves the system boot code into the SDRAM (1618). The boot-up procedure performed by the BOOT_CTLR (1613) is described below.

The BOOT_CTLR (1613) automatically becomes active upon the deassertion of the power-on reset signal (1616). After becoming active, the BOOT_CTLR (1613) configures the FLASH_CTLR (1610) to fetch data from the boot section of the NAND Flash memory (1617), wherein the boot section contains system boot code and FMM program code. As each page of the boot section gets fetched into the FLASH_CTLR PAGE_BUFF, with potential errors corrected by the FLASH_CTLR ECC circuit, the BOOT_CTLR (1613) moves the page data from the PAGE_BUFF either into the FMM_RAM, if the page is part of the FMM program code, or into the SDRAM (1618) if the page is a part of the system boot code. Optionally, at the same time, the BOOT_CTLR (1613) activates the FLASH_CTLR (1610) to fetch the next NAND Flash memory page into the PAGE_BUFF. This process repeats until the FMM program code is loaded into FMM_RAM and the system boot code into SDRAM (1618).

To move the page data from PAGE_BUFF to SDRAM (1618), a connection (1619) is provided from the BOOT_CTLR (1613) to the MAD (1608) via which the BOOT_CTLR (1613) accesses the SDRAM (1618), and the BOOT_CTLR (1613) is an SDRAM master. To transfer page data from the PAGE_BUFF to the SDRAM (1618), the BOOT_CTLR (1613) disassembles the page data in PAGE_BUFF into a plurality of bursts of data aligned to SDRAM bursts, and transfers each burst to SDRAM (1618) via the MAD (1608) according to the access-grant protocol of the MAD (1608), until the entire page data have been copied into the SDRAM (1618)

After the NAND Flash memory boot section is loaded into the FMM_RAM and the SDRAM (1618), the BOOT_CTLR (1613) releases the FMM (1611) to initialize the Flash media management, after which, the BOOT_CTLR (1613) deasserts the reset signal going to the Primary Processor (1614) via the PPBS (1603). The Primary Processor (1614) then begins to execute the system boot code stored in SDRAM (1618) At this point, the BOOT_CTLR (1613) has completed its function and will remain idle until the power-on reset signal is asserted and deasserted again, which causes the BOOT_CTLR (1613) to repeat the above process.

The example embodiment of the Command Controller (CMD_CTLR 1605) illustrated in FIG. 16 will now be described. Because the BOOT_RAM is absent in the present embodiment, the CMD_CTLR (1605) of course does not perform access to the BOOT_RAM. To the Primary Processor (1614), the accessible RAM memory space is represented by the SDRAM (1618). When the CMD_CTLR (1605) receives a "RAM Read" or a "RAM Write" command from the Primary Processor (1614) via the PPBS (1603), the CMD_CTLR (1605) sends an access request to, and waits for an access grant from the MAD (1608) in order to allow the Primary Processor (1614) to perform a burst transfer to or from the SDRAM (1618)

The example embodiment of the Memory Access Distributor (MAD 1608) illustrated in FIG. 16 will now be described.

In order to allow the BOOT_CTLR (1613) to move data from the FLASH_CTLR PAGE_BUFF in the FLASH_CTLR (1610) to the SDRAM (1618), the MAD (1608) is configured to accept the access request from the BOOT_CTLR (1613) and arbitrate its access request with other SDRAM masters. Thus, the MAD (1608) treats the BOOT_CTLR (1613) as another SDRAM master.

Figure 17:
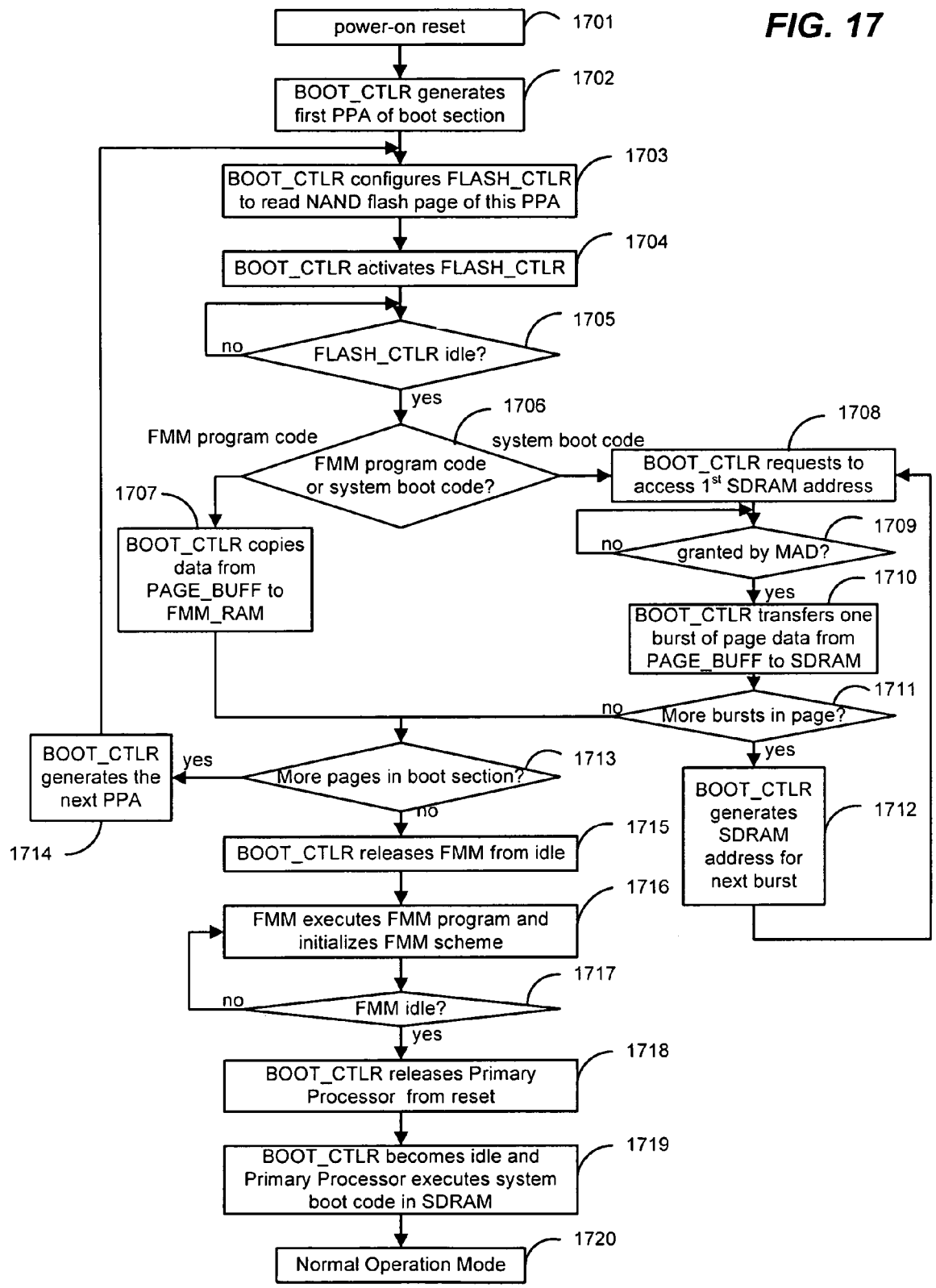
FIG. 17 is a flow chart illustrating an example boot process performed by the second embodiment of the memory system, starting from a power-on state to a Normal Operation Mode.

The operation of the second embodiment illustrated in FIG. 16 will now be described with reference to FIG. 17. FIG. 17 illustrates the boot up procedure performed by the BOOT_CTLR (1613). The assertion of the power-on reset signal at state (1701) puts the Memory System (1601) and the external electronics in reset mode. Upon the deassertion of the power-on reset signal, at state (1702) the BOOT_CTLR (1613) automatically becomes active and begins to generate the first PPA of the boot section and, at states (1703, 1704) configures and activates the FLASH_CTLR (1610) to read the NAND Flash page of this PPA. When, at state (1705), a determination is made that the FLASH_CTLR (1610) has completed the page read operation, the read NAND Flash page is stored in PAGE_BUFF with any potential errors corrected by the FLASH_CTLR ECC circuit. At state (1706), a determination is made as to whether the page is part of the system boot code or the FMM program code. At state (1707), the BOOT_CTLR (1613) the copies the page data from the PAGE_BUFF to the FMM_RAM if the page is part of the FMM program code. If the page is part of the system boot code, the process proceeds to state (1708), and the page will be copied to the SDRAM (318) as described herein.

With reference to state (1708), if the page data is a part of the System boot code, then the BOOT_CTLR (1613) disassembles the page data into bursts of data aligned to SDRAM bursts and, for each burst, sends an SDRAM access request to the MAD (1608). At state (1709), a determination is made as to whether the MAD (1608) has granted access. When access is granted, at state (1710), the BOOT_CTLR (1613) transfers a burst of data from PAGE_BUFF to the SDRAM (318) via the SDRAM_CTLR (1609). At state (1711), a determination is made as to whether there are more page burst. If there are, the process proceeds to state (1712), and the BOOT_CTLR (1613) generates the SDRAM address for the next burst. The BOOT_CTLR (1613) repeats the burst transfer to the SDRAM (318) until all page data in PAGE_BUFF has been transferred to the SDRAM (318).

At state (1713), a determination is made as to whether there are more pages in the boot section. If there are more pages, the process proceeds to state (1714), and the BOOT_CTLR (1613) generates the next PPA. The BOOT_CTLR (1613) repeats the NAND Flash page read until all program codes in the boot section have been read in from NAND Flash and copied to either the FMM_RAM or the SDRAM (318). At state (1715), the BOOT_CTLR (1613) then releases the FMM (1611). Once released, then at state (1716), the FMM (1611) begins to execute the FMM program code stored in the FMM_RAM. The FMM program code instructs the FMM to perform tasks to initialize the FMM scheme, such as reading the address translation table in the NAND Flash memory (1617) and copying it to the SDRAM (318).

Once the FMM (1611) completes the initialization (1717), then at state (1718), the BOOT_CTLR (1613) releases the Primary Processor (1614) from reset by deasserting the reset signal going to the Primary Processor (1614) via the PPBS interface (1603). At state (1719), the BOOT_CTLR (1613) becomes idle, an the Primary Processor (1614) becomes active and begins to execute the System boot code in the SDRAM (318) by transferring bursts of data in and out of the SDRAM (318). At state (1720), the Memory System (1601) enters the "Normal Operation Mode" (1720).

Figure 18:
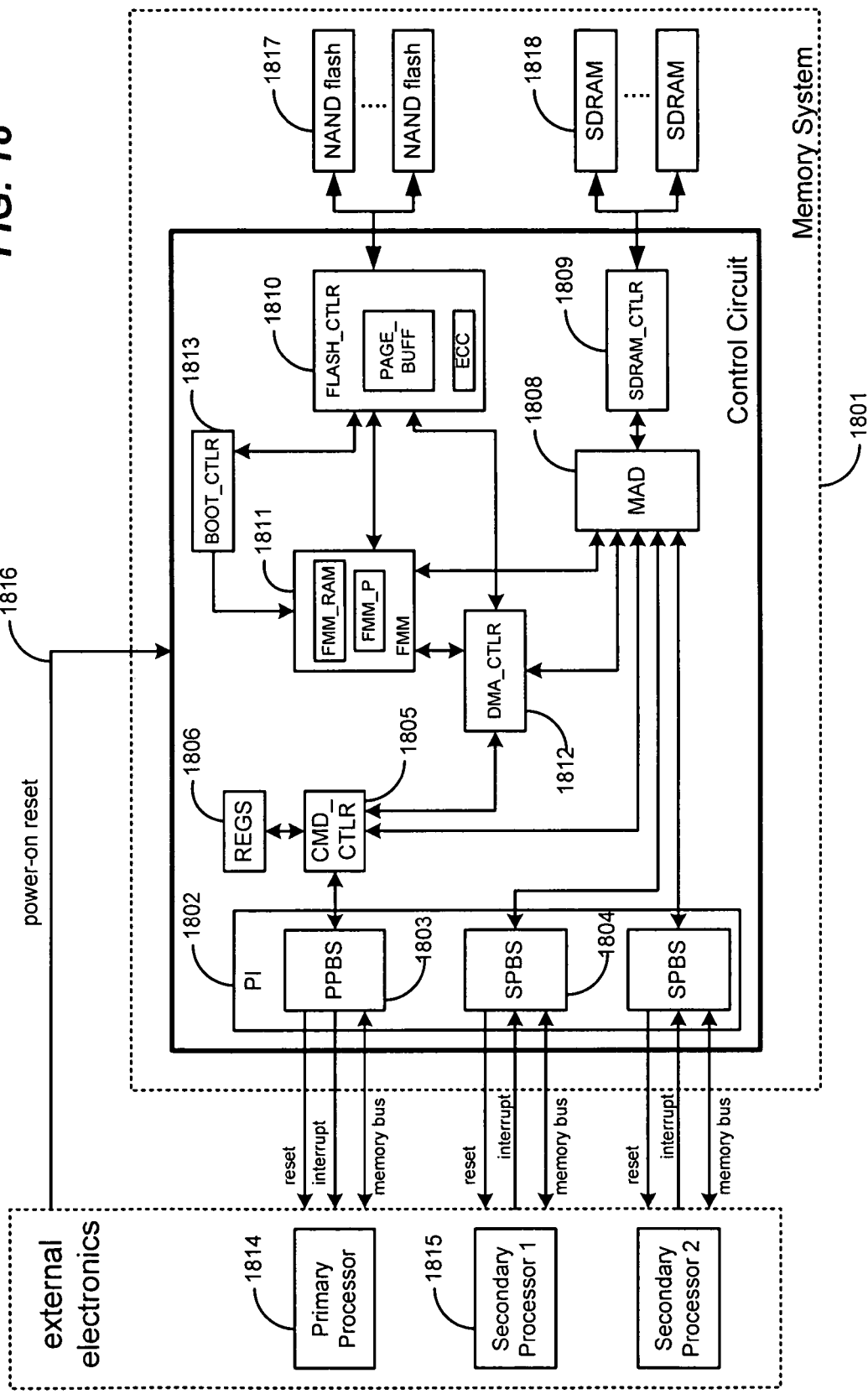
FIG. 18 illustrates a block diagram of a third embodiment of a memory system.

FIG. 18 illustrates a third embodiment of the Memory System (1801). In this embodiment, as compared to the first embodiment illustrated in FIG. 3, the BOOT_RAM is absent in the Control Circuit. Therefore, the boot up process differs from the boot process described above with respect to the first embodiment.

The third example embodiment includes a Primary Processor (1814), one or more Secondary Processors (1815), a PI (1802) (which includes a PPBS (1803), and one or more SPBSs (1804)), a CMD_CTLR (1805), a REGS block (1806), a MAD (1808), an FMM (1811), a DMA_CTLR (1812), an SDRAM_CTLR (1809), a FLASH_CTLR (1810), a BOOT_CTLR (1813), NAND flash memory (1817), and SDRAM (1818).

The system boot code transfer process, wherein the boot code is transferred from the NAND Flash memory (1817) to the SDRAM (318), is implemented via the FMM program code's initialization routine as a part of the FMM initialization process. Thus, in addition to loading the FMM book-keeping records for the FMM algorithms from the NAND Flash memory (1817) to the SDRAM (1818), the FMM (1811) is programmed to further load the system boot code from the NAND Flash memory (1817) to the SDRAM (1818) while running the FMM initialization routine. The BOOT_RAM is not needed, and the BOOT_CTLR (1813) does not have the responsibility of loading the system boot code from the NAND Flash memory (1817). The BOOT_CTLR (1813) does load the FMM program code from the NAND Flash memory (1817) to the FMM_RAM and releases the FMM (1811) from idle and the Primary Processor (1814) from reset. When released from reset by the BOOT_CTLR (1813), the Primary Processor (1814) executes the system boot code from the SDRAM (318) instead of the BOOT_RAM.

The functional blocks of the Control Circuit illustrated in FIG. 18 which are different from the first embodiment illustrated in FIG. 3 are described as follows:

As previously discussed, the BOOT_RAM is absent in this embodiment. The BOOT_CTLR (1813) of the present embodiment is different from that of the first embodiment in that the BOOT_CTLR (1813) does not perform loading the system boot code from NAND Flash memory to BOOT_RAM.

The BOOT_CTLR (1813) automatically becomes active upon the deassertion of the power-on reset signal. After becoming active, the BOOT_CTLR (1813) configures the FLASH_CTLR (1810) to fetch the FMM program code from the boot section of the NAND Flash memory (1817). As each page of the FMM program code gets fetched into the PAGE_BUFF, with potential errors corrected by the ECC circuit, the BOOT_CTLR (1813) moves the page data from the FLASH CTLR PAGE_BUFF into the FMM_RAM. In the meantime, the BOOT_CTLR (1813) activates the FLASH_CTLR (1810) to fetch the next NAND Flash memory page into the PAGE_BUFF. This process repeats until the FMM program code has been loaded into the FMM_RAM.

After the FMM program code is loaded into the FMM_RAM, the BOOT_CTLR (1813) releases the FMM (1811) to perform FMM initialization. As implemented in the initialization routine of the FMM program code, the FMM initialization loads not only the FMM book-keeping records, but also the system boot code, from NAND Flash memory (1817) to SDRAM (1818). After FMM (1811) finishes initialization, the BOOT_CTLR (1813) deasserts the reset signal going to the Primary Processor (1814) via the PPBS (1803). The Primary Processor (1814) then begins to execute the system boot code stored in SDRAM (1818). At this point, the BOOT_CTLR (1813) has completed its function and will remain idle until the power-on reset signal is asserted and deasserted again, which causes the BOOT_CTLR (1813) to repeat the above process.

The CMD_CTLR (1805) operates as similarly described above with respect to CMD_CTLR (1605).

Figure 19:
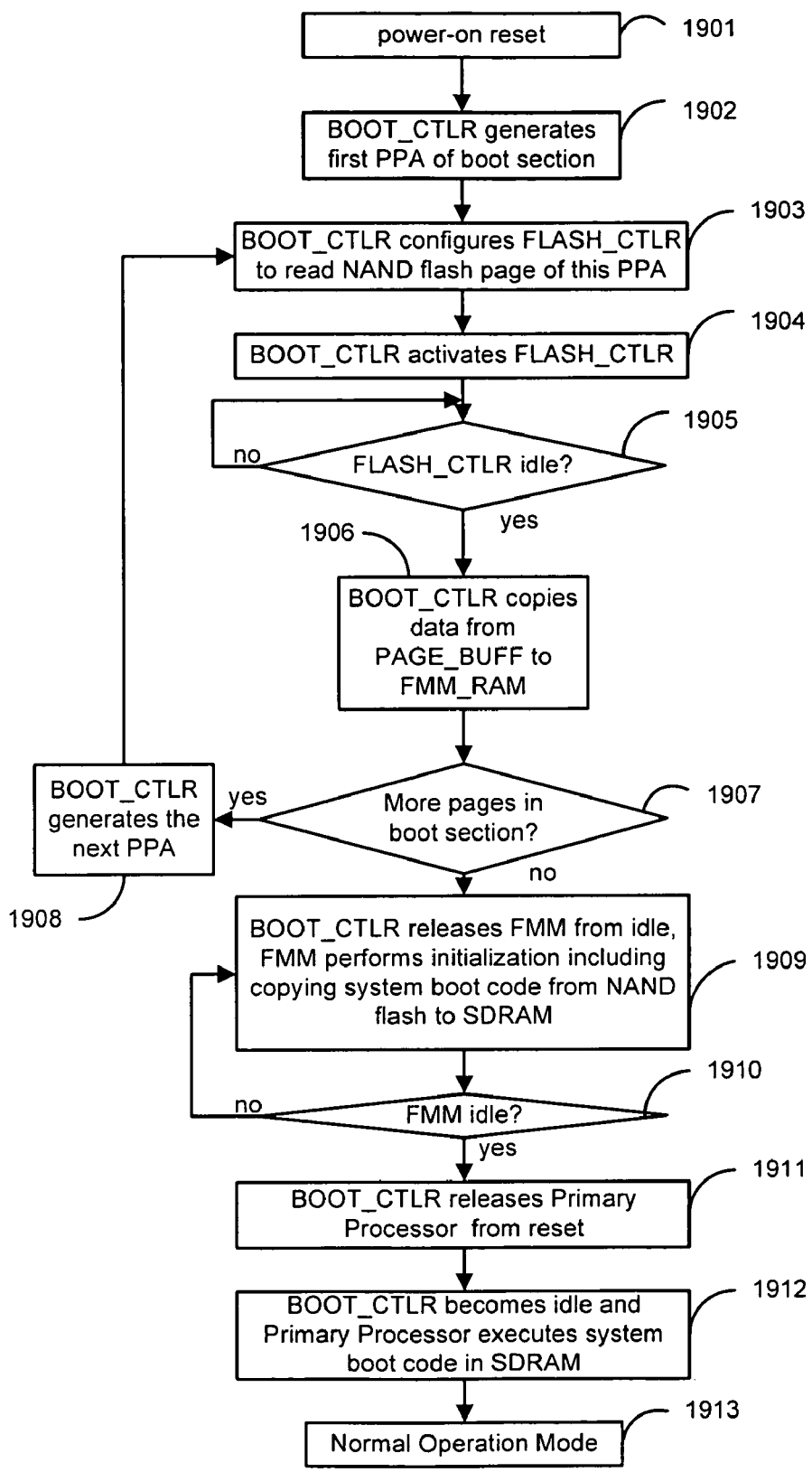
FIG. 19 is a flow chart illustrating an example boot process performed by the third embodiment of the memory system, starting from a power-on state to a Normal Operation Mode.

The operation of the third embodiment illustrated in FIG. 18 will now be described with reference to FIG. 19. FIG. 19 illustrates an example boot up procedure performed by the BOOT_CTLR (1813) illustrated in FIG. 18. At state (1901), the assertion of the power-on reset signal puts the Memory System (1801) and external electronics in reset mode. Upon the deassertion of the power-on reset signal at state (1902), the BOOT_CTLR (1813) automatically becomes active and begins to generate the first PPA of the boot section containing the FMM program code. At states (1903, 1904), the BOOT_CTLR (1813) configures and activates the FLASH_CTLR (1810) to read the NAND Flash memory (1817) page of this PPA.

At state (1905), a determination is made as to whether the FLASH_CTLR (1810) has completed the page read operation by detecting if the FLASH_CTLR (1810) is idle, and the read NAND Flash memory (1817) page is stored in the PAGE_BUFF, with potential errors corrected by the ECC circuit. At state (1906), the BOOT_CTLR (1813) copies the page data from the FLASH_CTLR PAGE_BUFF to the FMM_RAM. Based on a determination made at state (1907) as to whether there are more pages in the boot section, the BOOT_CTLR (1813) repeats the NAND Flash memory (1817) page read by generating the next PPA at state (1908), until the FMM program codes are read in from NAND Flash memory (1817) and copied to the FMM_RAM.

At state (1909), the BOOT_CTLR (1813) releases the FMM (1811) from idle. Once the FMM is no longer idle, and has been released, the FMM (1811) begins to execute the FMM program code stored in the FMM_RAM. The FMM program code instructs the FMM (1811) to perform tasks to initialize the FMM (1811) including copying the system boot code from the NAND Flash memory (1817) to SDRAM (1818). When the FMM (1811) completes the initialization, at state (1910), the BOOT_CTLR releases the Primary Processor (1814) from reset by deasserting the reset signal going to the Primary Processor (1814) via the PPBS interface (1911). Then the BOOT_CTLR (1813) becomes idle, but the Primary Processor (1814) becomes active and begins to execute the System boot code in the SDRAM (1818) by transferring bursts of data in and out of the SDRAM (1818) at state (1912). At state 1913, the Memory System (1801) enters the "Normal Operation Mode" (1913).

If the FMM initialization routine is configured such that the FMM algorithms become functional before the FMM reads the system boot code from the NAND Flash memory (1817), then the system boot code does not need to reside in the boot section of the NAND Flash memory (1817), as the NAND Flash memory logical-to-physical address translation is already functional when FMM (1811) reads the system boot code. In other words, once the FMM algorithms are functional, the FMM (1811) is able to access the FMM-controlled section of the NAND Flash memory (1817) and locate the system boot code stored in the FMM-controlled section even if the location of the system boot code is defined in the FMM program code in terms of logical NAND Flash memory addresses. Similarly, in addition to the system boot code, the FMM program code is optionally configured to load other program codes or data from NAND Flash memory (1817) to the SDRAM (1818). Optionally, the entire NAND Flash memory data image can be copied to SDRAM (1818), or as much of the data image can be copied as the SDRAM (1818) can hold.

In some devices, such as cellular phones, the external electronics may contain non-volatile memories, such as Flash memories and read-only-memories (ROMs) which are used to store the system boot code for the Primary Processor (1814). In this case, the system boot code is not stored in the NAND Flash memory (1817) within the Memory System (1801) and is made available to the Primary Processor (1814) by other mechanisms in the external electronics when the Primary Processor (1814) is released from reset. As such, the BOOT_RAM is not needed and the BOOT_CTLR (1813) does not have the responsibility of loading the system boot code from NAND Flash memory (1817), but still has the capability of loading the FMM program code from NAND Flash memory (1817) to FMM_RAM and releasing the FMM and the Primary Processor (1814) from reset.

When released from reset by the BOOT_CTLR (1813), the Primary Processor (1814) executes the system boot code by fetching instructions from the external electronics instead of from the Memory System (1801). Furthermore, in certain electronic devices, such as cellular phones, the external electronics may further directly control the reset of the Primary Processor (1814). In this case, the Primary Processor (1814) may or may not have already been released from reset by the external electronics when the BOOT_CTLR (1813) deasserts the reset signal going to the Primary Processor (1814). Therefore, the reset signal which the BOOT_CTLR (1813) sends to the Primary Processor (1814) may instead be used by the Primary Processor (1814) as a signal indicating whether or not the Memory System has been initialized and is ready to service the commands from the Primary Processor (1814).

The ability of the FMM (1811) to perform tasks in addition to loading the system boot code to the SDRAM (1818) before the Primary Processor (1814) is released from reset by the BOOT_CTLR (1813) can be utilized for many applications. For example, the Primary Processor (1814) may optionally require that the entire software, or a subset thereof, be available for the Primary Processor (1814) to read in a random-accessing fashion when the Primary Processor (1814) is released from reset. As an example, such a requirement may exist when the Primary Processor (1814) is implemented with a ROM-based microprocessor which, right after being released from reset, performs a security check of the entire software, or a selected subset thereof, to ensure that the software does not contain malicious program codes which may cause damage to data stored in the NAND Flash memory (1817), before actually executing the software. To accommodate such a requirement, the FMM initialization routine is optionally configured so that the entire cellular phone system software, or a selected subset thereof, is loaded from NAND the Flash memory (1817) to the SDRAM (1818) before the BOOT_CTLR (1813) releases the Primary Processor (1814) from reset.

Optionally, if the Primary Processor (1814) does not perform such security checks of the software, then the security checks may be implemented in the FMM program code so that the FMM (1811) performs security check of the software in SDRAM (1818) after the software is loaded from NAND Flash memory (1817) to SDRAM (1818). Optionally, the FMM program code is configured to execute an encryption/decryption algorithm. In this case, software program codes to be executed by external processors, excluding the FMM program code, can be stored in the NAND Flash memory (1817) in an encrypted format and, after the software program codes are loaded into SDRAM (1818), the FMM (1811) decrypts the program codes into a format which is executable by the external processors. A variety of conventional, unconventional, and yet to be implemented security check algorithms and encryption/decryption algorithms can be used, and the Memory System in not limited to particular algorithms.

With the foregoing example Memory Systems architectures, a wide variety of algorithms can be implemented in the FMM program code such that the FMM can manage the data in the NAND Flash memory (1817), transfer data between NAND Flash memory (1817) and SDRAM (1818), and perform various operations on the data stored therein in many different ways. The FMM operations described herein are only presented as examples and not intended to limit the use of the FMM (1811) to the specific examples.

Figure 20:
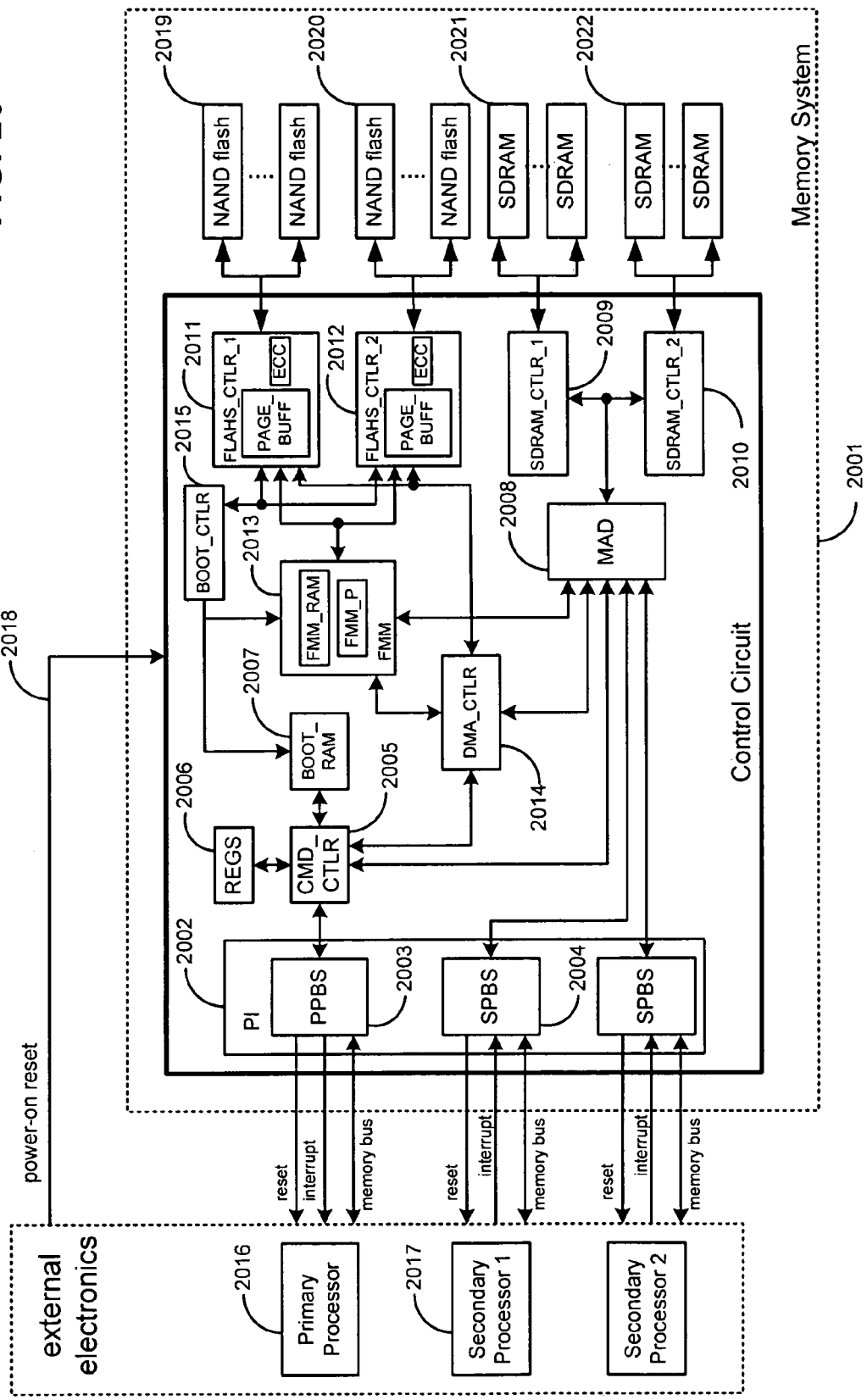
FIG. 20 illustrates a block diagram of a fourth embodiment of a memory system.

FIG. 20 illustrates a fourth embodiment of the Memory System (2001). In this embodiment, the Control Circuit contains multiple copies of the FLASH_CTLR and the SDRAM_CTLR. In the example illustrated in FIG. 20, two copies of the FLASH_CTLR (hereinafter referred to as FLASH_CTLR_1 (2011) and FLASH_CTLR_2 (2012)) and two copies of the SDRAM_CTLR (hereinafter referred to as SDRAM_CTLR_1 (2009) and SDRAM_CTLR_2 (2010)) are provided in the Control Circuit, although the number of the FLASH_CTLR and the SDRAM_CTLR are not limited to two. The fourth example embodiment further includes a Primary Processor (2016), one or more Secondary Processors (2017), a PI (2002) (which includes a PPBS (2003), and one or more SPBSs (2004)), a CMD_CTLR (2005), a REGS block (2006), a MAD (2008), an FMM (2013), a DMA_CTLR (2014), a BOOT_CTLR (2015), NAND flash memory (2019, 2020), and SDRAM (2021, 2022).

As described above, a FLASH_CTLR and/or a SDRAM_CTLR may provide multiple chip select signals to operate multiple NAND Flash devices and multiple SDRAM devices respectively. However, in an example configuration, each controller (FLASH_CTLR or SDRAM_CTLR) is optionally limited to actively transferring data in or out of one single memory device at a given time, although multiple memory devices may be under the control of each controller. The memory address of each access determines which memory device should be activated based on a memory map built into, or otherwise accessed by the controller whereby each memory device is designated an address range in the memory map. In other words, a controller providing multiple chip select signals can expand the total memory space beyond the maximum memory space provided by a single memory device, but may not be capable of expanding the data transfer rate beyond the maximum data transfer rate of a single memory device.

By having two copies of the FLASH_CTLR and two copies of the SDRAM_CTLR, not only does the memory space of both the NAND Flash memory and SDRAM doubles, but the data transfer rate of both the NAND Flash and SDRAM also doubles. For a given FLASH_CTLR, the Control Circuit provides one set of input and output ports to be connected to the NAND Flash devices which the corresponding FLASH_CTLR operates. Similarly, for a given SDRAM_CTLR, the Control Circuit provides one set of input and output ports to be connected to the SDRAM devices, which the corresponding SDRAM_CTLR operates. Thus, the total number of input and output ports that can be connected to NAND Flash devices and SDRAM devices in this embodiment is twice that in the first example embodiment.

The present embodiment does not limit the coordination of the operations of the two FLASH_CTLRs or the two SDRAM_CTLRs to a specific technique. To illustrate the current embodiment by way of example, in the example described below it is assumed that the two FLASH_CTLRs (2011, 2012) perform the same operations and the two SDRAM_CTLRs (2009, 2010) perform the same operations.

When performing data accesses to the NAND Flash, both FLASH_CTLRs (2011, 2012) perform the same operation at substantially the same time. In other words, the Control Circuit will read two pages from, or write two pages to the NAND Flash storage space at the same time, with each page transferred by one of the FLASH_CTLRs (2011, 2012). To accommodate this hardware architecture, the arrangement of logical pages in the NAND Flash storage space may be "interleaved" between the two FLASH_CTLRs (2011, 2012). For example, if the data in the entire NAND Flash storage space is logically arranged in pages of LPA 0, 1, 2, 3 . . . and so on, then even LPAs such as LPA 0, 2 . . . and so on are stored in the NAND Flash devices (2019) attached to FLASH_CTLR_1, and odd LPAs such as LPA 1, 3 . . . and so on are stored in the NAND Flash devices (2020) attached to FLASH_CTLR_2. Therefore, the Control Circuit always accesses LPA 0 and 1 together or LPA 2 and 3 together, and so on. With two FLASH_CTLRs (2011, 2012), the total number of LPAs in the NAND Flash storage space is twice that of the first embodiment.

In this example, each FLASH_CTLR has an independent physical address space (e.g., PPAs) and a unique logical-to-physical association. The even LPAs are stored in FLASH_CTLR_1's physical address space based on FLASH_CTLR_1's unique logical-to-physical association. The odd LPAs are stored in FLASH_CTLR_2's physical address space based on FLASH_CTLR_2's unique logical-to-physical association.

A new data unit is introduced here and hereinafter referred to as "Logical Double Page" (LDP). Each LDP contains two NAND Flash pages of consecutive LPAs where one LPA is even and the other is odd. Each LDP is assigned an address hereinafter referred to as "LDP Address" (LDPA). For example, LDPA 0 addresses the two pages of LPA 0 and LPA 1, LDPA 1 addresses the two pages of LPA 2 and LPA 3, and so on. With two FLASH_CTLRs (2011, 2012), the Control Circuit transfers one LDP to or from the NAND Flash space in a single NAND Flash access operation where FLASH_CTLR_1 transfers the even LPA and FLASH_CTLR_2 transfers the odd LPA.

Similar to the FLASH_CTLRs (2011, 2012), the two SDRAM_CTLRs (2009, 2010) perform the same data access operation at the same time. In other words, when performing a data access to the SDRAM memory space, the Control Circuit reads two bursts of data or writes two bursts of data simultaneously, with each burst transferred by one of the SDRAM_CTLRs (2009, 2010). Having two SDRAM_CTLRs (2009, 2010) operating the same commands at the same time has the same effect as doubling the width of a data word. For example, if the data size of a single SDRAM burst is 8 words with each word being 16 bits wide, then two SDRAM bursts at the same time is equivalent to 8 words with each word being 32 bits wide.

The functional blocks of the Control Circuit in the embodiment illustrated in FIG. 20 which are different from those in the first embodiment illustrated in FIG. 3, are described as follows.

The Control Circuit contains two copies of the FLASH_CTLR, where each copy has the same or similar functionality as in the first embodiment. Each FLASH_CTLR outputs multiple chip select signals to operate multiple NAND Flash devices although an access may be limited to one NAND Flash device at a time. Both FLASH_CTLRs (2011, 2012) are under the control of the BOOT_CTLR (2015) and the FMM (2011), and perform the same data access operations at the same time.

With respect to the BOOT_CTLR (2015), because the FMM algorithms are not applied to the boot section of the NAND Flash storage space, there is no distinction between logical addresses and physical addresses in the boot section. In the first embodiment, when reading from the boot section, the BOOT_CTLR (313) directly generates the PPAs with incrementing values, without logical-to-physical address translation, and then activates the FLASH_CTLR (310) to read each PPA from the boot section. In the present embodiment, illustrated in FIG. 20, the boot section pages are interleaved between the two FLASH_CTLRs (2011, 2012), occupying the same PPAs in the physical address spaces of the two FLASH_CTLRs (2011, 2012), preferably both starting from PPA 0. In other words, both FLASH_CTLRs (2011, 2012) have the same PPAs designated as the "boot section PPAs".

Therefore, when reading from the boot section, the BOOT_CTLR (2015) directly generates the boot section PPAs, and then activates both FLASH_CTLRs (2011, 2012) at the same time to each read the NAND Flash pages of the same PPAs. When both FLASH_CTLRs (2011, 2012) finish their page read operation, each PAGE_BUFF contains a page of data, and the BOOT_CTLR (2015) moves the two pages of data into either the BOOT_RAM or the FMM_RAM, depending on the PPAs of the two pages.

With respect to the SDRAM Controller (SDRAM_CTLR), the Control Circuit contains two copies of the SDRAM_CTLR, where each copy has the same functionality as in the first embodiment. The two SDRAM_CTLRs (2009, 2010) perform the same data access operations at the same time. To each SDRAM master, an access the SDRAM memory space is performed in bursts of data words of twice the width of the data word of a single SDRAM device.

With respect to the Flash Media Manager (FMM 2013), FMM (2013) performs the Flash media management tasks as similarly described with respect to the first embodiment, but further performs such tasks based on one set of LPAs and two separate sets of PPAs and therefore has the capability to maintain two logical-to-physical address associations (in other embodiments, the FMM can be scaled to handle still additional flash controllers, and SDRAM controllers). A first example association is between the even LPAs and FLASH_CTLR_1's PPAs, and between the odd LPAs and FLASH_CTLR_2's PPAs. Both associations are optionally based on the same or similar FMM algorithms as that in the first embodiment. When DMA_CTLR (2014) activates the FMM (2013) to read from an LDPA, which addresses two pages of an even LPA and an odd LPA, the FMM (2013) performs two address translations to convert the even LPA to a PPA of FLASH_CTLR_1 and the odd LPA to a PPA of FLASH_CTLR_2. The FMM (2013) then configures both FLASH_CTLRs (2011, 2012) to perform a page read operation from their corresponding PPAs at substantially the same time. As such, the LPA register in the FMM (2013) in the first embodiment is replaced with "LDPA" register.

With respect to the Registers (REGS 2006), in the first embodiment, the DMA_CONFIG register contains information regarding the DMA transfer between NAND Flash and SDRAM such as the starting NAND Flash LPA, starting SDRAM address and the number of NAND Flash pages to transfer. In the present embodiment, the starting NAND Flash LPA is replaced with the starting LDPA, and the number of NAND Flash pages to be transferred is replaced with the number of LDP to be transferred. The starting SDRAM address refers to a data word of twice the width as the data word of a single SDRAM device.

With respect to the DMA Controller (DMA_CTLR 2014), with two FLASH_CTLRs (2011, 2012) operating at the same time, the DMA_CTLR (2014) performs the DMA transfer by downloading or uploading two NAND Flash pages, or an LDP, per access to the NAND Flash space. With two SDRAM_CTLRs (2009, 2010) operating at the same time, the DMA_CTLR (2014) performs each access to the SDRAM space by transferring a burst of data words of twice the width of the data word of a single SDRAM device.

The DMA_CTLR (2014) obtains other information accompanying this DMA transfer command from the DMA- _CONFIG register in the REGS block (2006), such as the amount of data to transfer preferably described in number of Logical Double Pages (LDPs), the starting Logical Double Page Address (LDPA), and the starting SDRAM address. The DMA_CTLR (2014) then generates the LDPAs of the LDPs to be transferred, as well as the starting SDRAM address corresponding to each LDP.

To transfer an LDP, the DMA_CTLR (2014) sends the LDPA and the transfer type (e.g., LDP read or LDP write) to the FMM (2013), which then performs the address translation to obtain two PPAs, one for each FLASH_CTLR, and then configures both FLASH_CTLRs (2011, 2012) to each read from or write to the corresponding NAND Flash page of their own PPA. Optionally, a DMA transfer moves an amount of data equivalent to an integral number of LDPs, and does not start or end the DMA transfer in the middle of an LDP.

The Command Controller (CMD_CTLR 2005) will now be described. As similarly described above with respect to the first embodiment, the CMD_CTLR (2005) preferably contains a data buffer as a temporary storage for data transfers between the Primary Processor (2016) and the Memory System (2001). The data buffer allows for a mismatch between the data transfer rate of the PPBS interface (2003) and that of the SDRAM interface. In the present embodiment, the length of a burst transfer on the SDRAM interface is still defined by the SDRAM_BURST_LENGTH register, but since the size of a data word is twice that of the first embodiment, the signals for the CMD_CTLR (2005) to transfer data to and from the SDRAM_CTLR via the MAD block (2008) are expanded accordingly to accommodate the doubled word size on the SDRAM interface. In other words, the data transfer between the CMD_CTLR data buffer and the SDRAM_CTLR is twice as fast as that of the first embodiment, other factors being equal.

The Processor Interface (PI 2002) will now be described. As similarly described above with respect to the first embodiment, a SPBS preferably contains a data buffer as a temporary storage for data transfers between a corresponding Secondary Processor and the SDRAM. The data buffer allows for a mismatch between the data transfer rate of the SPBS interface and that of the SDRAM interface. In the present embodiment, the length of a burst transfer on the SDRAM interface is still defined by the SDRAM_BURST_LENGTH register, but since the size of a data word is twice that of the first embodiment, the signals for the SPBS to transfer data to and from the SDRAM_CTLR via the MAD block (2008) are expanded accordingly to accommodate the doubled word size on the SDRAM interface. In other words, the data transfer between an SPBS's data buffer and the SDRAM_CTLR performs transfers twice as fast as that of the first embodiment.

Figure 21:
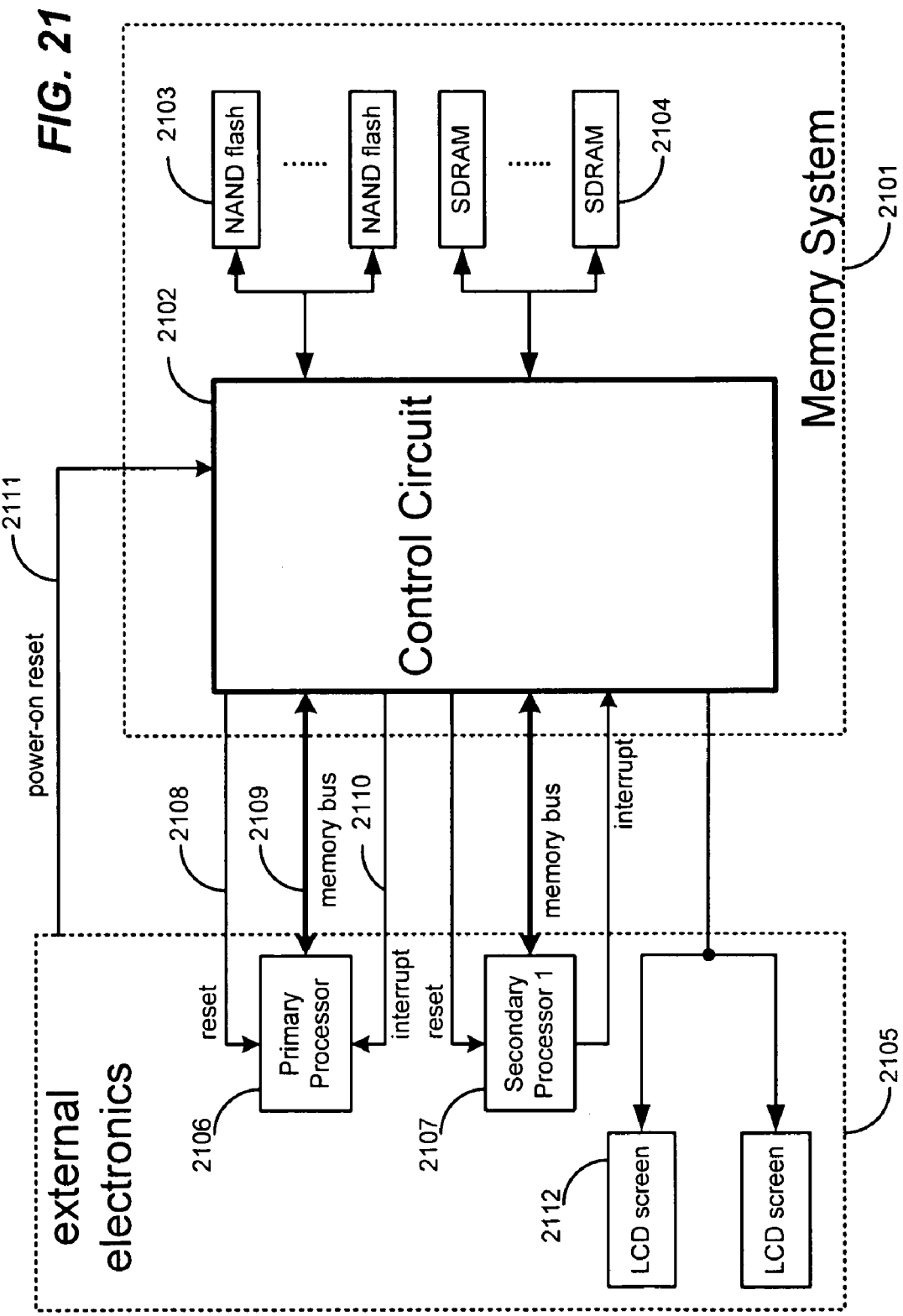
FIG. 21 illustrates a block diagram of an example cellular phone electronic system.

FIG. 21 illustrates a block diagram of an example cellular phone electronic system. In this embodiment, the Memory System (2101) provides interfaces to one or multiple displays (e.g., LCD or OLED screens) (2112) to be attached to the Memory System (2101). In addition, the Memory System (2101) provides for a portion of the external electronics (2105), for example, the Primary Processor (2106) and/or the Secondary Processor (2017), to configure and activate the Control Circuit (2102) to perform data transfers from the SDRAM (2104) to the displays (2112). While two displays are illustrated in FIG. 21, the Memory System (2101) can interface to fewer or more displays.

Figure 22:
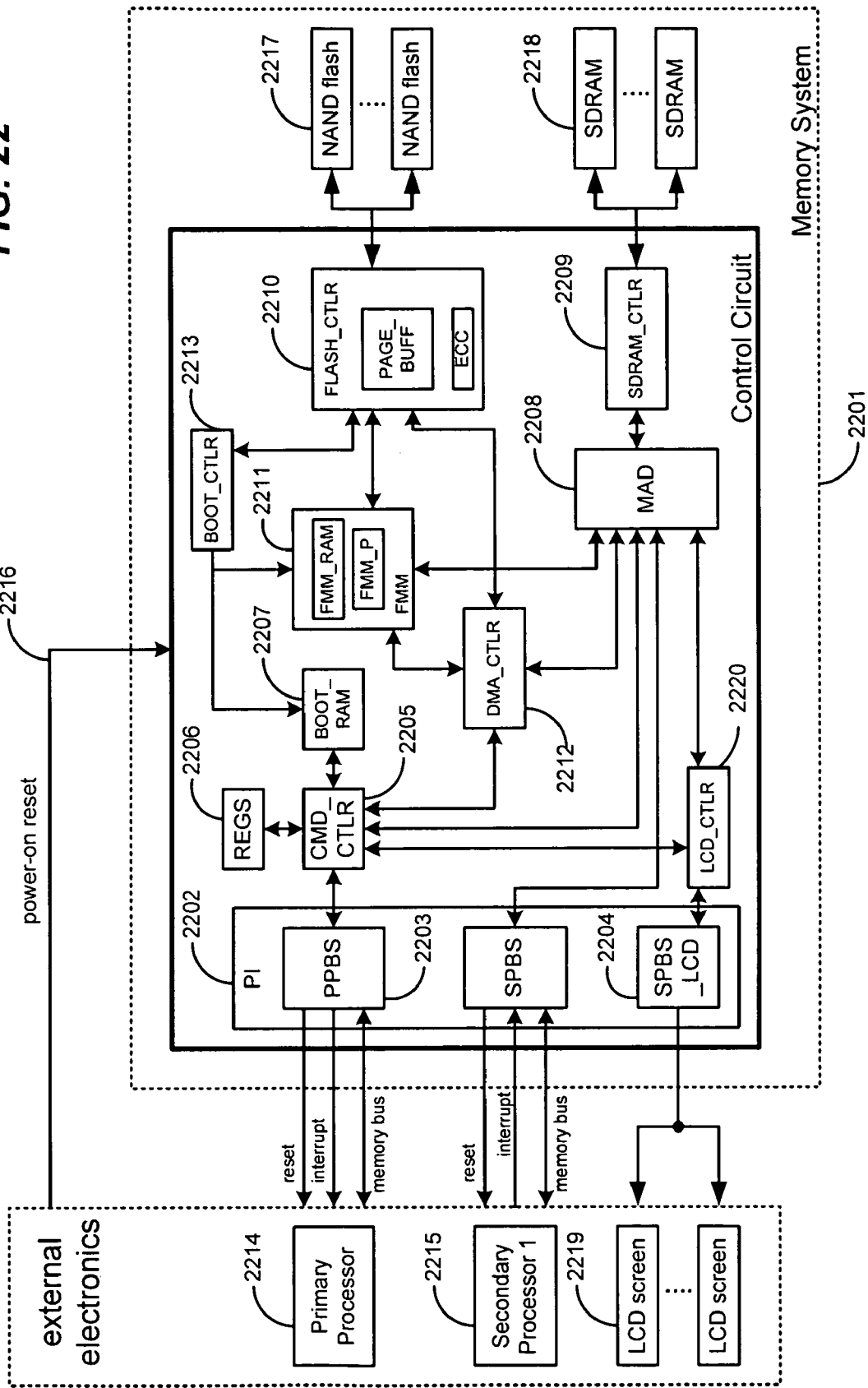
FIG. 22 illustrates a block diagram of a fifth embodiment of a memory system.

FIG. 22 illustrates the embodiment shown in FIG. 21 in greater detail, including a fifth embodiment of the memory system (2201). Those functional blocks of the Control Circuit in this embodiment which are different from the first embodiment are described as follows.

The Processor Interface (PI 2202) contains a PPBS (2203) and a plurality of SPBSs (2204). In this embodiment, an SPBS is designated as an interface which can be programmed to function either as a normal SPBS when it is connected to the memory bus of a Secondary Processor, or as an LCD driver interface when it is connected to one or multiple LCD screens. For convenience, this particular SPBS is referred to as the "SPBS_LCD" (2204) instead of "SPBS". When programmed to function as a normal SPBS, the SPBS_LCD (2204) interacts to the memory bus of the corresponding Secondary Processor in the same manner as other SPBSs in the PI circuit (2202).

When programmed to function as a display (e.g., LCD) driver interface, the SPBS_LCD (2204) provides control, data and address signals to operate one or multiple displays external to the Memory System (2201) according to the display data transfer protocol. The data buffer in the SPBS_LCD (2204) in this case is used as temporary data storage for data transfers from SDRAM (318) to the LCD screens (2219). The data buffer allows for a mismatch in the data transfer rate between the LCD screens (2219) and the SDRAM (2218). The LCD_CONFIG register in the REGS block (2206), which is writable by the Primary Processor (2214), determines whether the SPBS_LCD (2204) functions as an SPBS or an LCD interface driver. The SPBS_LCD (2204) is able to operate multiple LCD screens by providing multiple chip select signals to multiple LCD screens via output ports of the Memory System (2201). As an illustrative example, in the depicted embodiment, the SPBS_LCD (2204) supports two LCD screens (2219), by providing an independent chip select signals to each display.

When being accessed by the Primary Processor (2214), in addition to the following commands: "RAM Read", "RAM Write", "Register Read", "Register Write", "Download DMA Transfer" and "Upload DMA Transfer", the PPBS (2203) can translate the memory bus control signals into an "LCD Write" command.

With respect to the Registers (REGS 2206), REGS (2206) includes an LCD_CONFIG register to provide configuration information regarding operating the LCD screens (or other displays). The register includes the following fields. An "LCD enable" field determines whether the SPBS_LCD (2204) functions as an SPBS or as an LCD interface driver. This field also disables or enables LCD_CTLR (2220) accordingly. If a display is not coupled to the Memory System (2201), then the LCD_CTLR (2220) is disabled, and the SPBS_LCD (2204) is configured to function as an SPBS. Optionally, as a default register value, after power-on of the Memory System, the LCD enable field is set to "disable", although optionally instead, the default value can be "enable". If at least one LCD screen in the cellular phone is attached to the SPBS_LCD interface, then after power-on, the Primary Processor writes an "enable" value to the register field, to thereby enable the LCD_CTLR (2220) and configure the SPBS_LCD (2204) to be an LCD driver interface.

The LCD_CONFIG register further includes the following fields: "starting LCD Address", "starting SDRAM address", and "amount of data to transfer to LCD", which are used to configure the data transfer from SDRAM to the LCD screens (2219). The "LCD address partition" field defines the starting address of each LCD screen in the overall LCD address space when there are multiple LCD screens, or other displays, attached to the Memory System (2201).

With reference to the Command Controller (CMD_CTLR 2205), when the CMD_CTLR (2205) receives the command "LCD Write" from the Primary Processor (2214) via the PPBS (2203), the CMD_CTLR (2205) activates the LCD_CTLR (2220) to perform a data transfer from SDRAM to the LCD screens outside the Memory System via the SPBS_LCD interface. When the LCD_CTLR (2220) finishes the data transfer, the CMD_CTLR (2205) sends an interrupt signal to the Primary Processor (2214) via the PPBS (2203) to indicate that the data transfer has been completed.

With respect to the LCD Controller (LCD_CTLR (2220)), the LCD_CTLR (2220) is responsible for outputting image data stored in the SDRAM (2218) to the LCD screens (2219) external to the Memory System, via the SPBS_LCD (2204) interface. The "LCD Enable" field of the LCD_CONFIG register enables or disables the LCD_CTLR (2220). When enabled, the LCD_CTLR (2220) is under the control of CMD_CTLR (2205), which is, in turn, under the control of the Primary Processor (2214) via the PPBS (2203). The LCD_CONFIG register contains information used by the LCD_CTLR (2220) to perform data transfers from the SDRAM (2218) to the appropriate LCD screen.

For example, the LCD_CONFIG register stores an indication as to the amount of data to transfer, the starting SDRAM address, the starting LCD address, and the address partition of the two LCD screens. When activated by an "LCD Write" command from the CMD_CTLR (2205), the LCD_CTLR (2220) obtains the transfer-related information from the LCD_CONFIG register, disassembles the data transfer into a plurality of burst transfers aligned to SDRAM burst transfers. Based on the LCD address partition of the two LCD screens and the starting LCD address, the LCD_CTLR (2220) further determines which of the two LCD screen is to receive the data. For each burst transfer, the LCD_CTLR (2220) sends an access request to the MAD (2208) to access the SDRAM (2218). When granted, the LCD_CTLR (2220) performs a burst read operation from the SDRAM (2218), and writes the read data to the data buffer in SPBS_LCD (2204), which, in turn, writes the data to the selected LCD screen. The LCD_CTLR (2220) repeats the burst transfers until the entire data transfer is completed.

Figure 23:
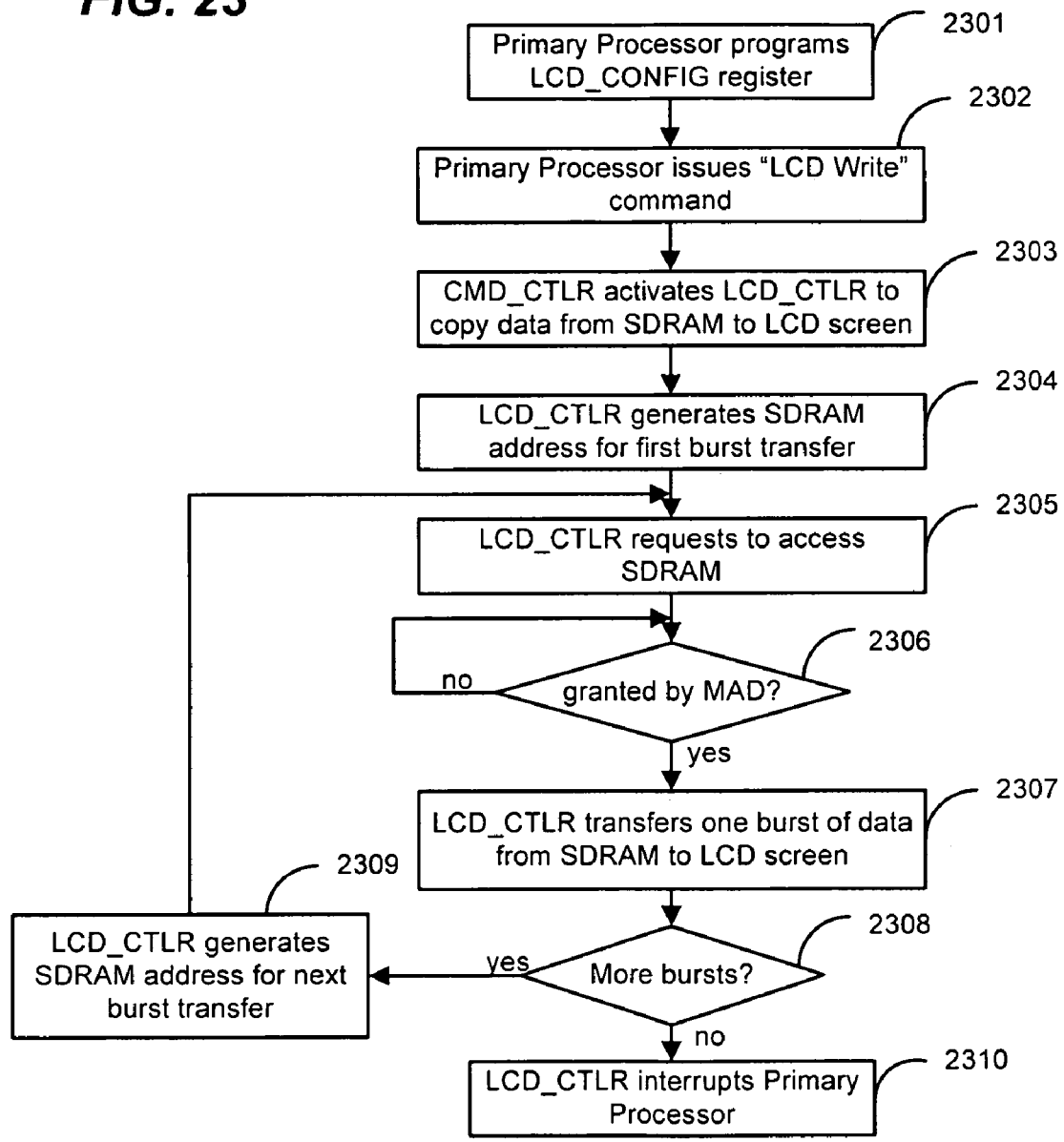
FIG. 23 is a flow chart illustrating an example data transfer process, wherein data is transferred from volatile memory to a cellular phone display, such as that illustrated in FIG. 22.

The operation of the fifth embodiment illustrated in FIG. 22 will now be described with reference to FIG. 23. FIG. 23 illustrates an example process of transferring image data from the SDRAM (2218) to an LCD screen. At state (2301), the Primary Processor (2214) writes to the LCD_CONFIG register's "LCD Enable" field to enable the LCD_CTLR (2220) and configure the SPBS_LCD (2204) to serve as an LCD driver interface as well as configure the data transfer from SDRAM to the LCD screen. At state (2302), the Primary Processor (2214) issues an "LCD Write" command", which, at state (2303), causes the CMD_CTLR (2205) to activate the LCD_CTLR (2220) to perform the data transfer from the SDRAM (2218) to the LCD screen. The LCD_CTLR (2220) reads data out of the SDRAM (2218) via the MAD (2208), according to the access-grant protocol of the MAD (2208), and writes the data to the LCD screen(s) until all the corresponding image data has been transferred from the SDRAM (2218) to the LCD screen. At this time, the CMD_CTLR (2205) interrupts the Primary Processor (2214) to indicate the completion of the data transfer (2310).

In particular, based on the value of the LCD_CONFIG register, at state (2304) the LCD_CTLR (2220) generates an SDRAM address for the initial burst transfer. At state (2305), the LCD_CTLR (2220) requests SDRAM access via the MAD (2208). At state (2306), a determination is made as to whether the MAD (2208) has granted SDRAM access, and at state (2307), the LCD_CTLR (2220) transfers a data burst from the SDRAM (2218) to the LCD screen (2219). At state (2308), a determination is made as to whether there are remaining data bursts to be performed. If there are remaining bursts to be transferred, the process proceeds to state (2309), and the LCD_CTLR (2220) generates the SDRAM address for the next burst transfer. Once all the appropriate image data has been transferred from SDRAM (2218) to the LCD screen, at state (2310), the CMD_CTLR (2205) interrupts the Primary Processor (2214) to indicate the completion of the data transfer.

Optionally, when disabled, the LCD_CTLR (2220) acts as a simple connection between SPBS_LCD (2204) and the MAD block (2208). The SPBS_LCD (2204) functions as a normal SPBS interface and interacts with the MAD block (2208) to access SDRAM (2218) as if the LCD_CTLR (2220) was not present.

Although the LCD_CTLR (2220) moves data from the SDRAM (2218) to the LCD screens (2219) in this exemplary embodiment, the LCD_CTLR (2220) can optionally perform the more complex functions of manipulating the image data in the SDRAM (2218) into a different format before moving the image data to the LCD screens (2219). Although the detailed image processing techniques are not described herein and they can be user defined as needed or desired, the Memory System (2201) enables image processing and rendering images for display without unduly utilizing the external processors' computational capability.

Although the SPBS_LCD (2204) can be configured by the Primary Processor (2214) to be either a normal SPBS interface which is under the control of a Secondary Processor, or an LCD interface which controls the LCD screens (2219), the SPBS_LCD (2204) is optionally restricted to use only one of these two configurations in any particular cellular phone. Thus, optionally, once the Memory System (2201) is installed into a particular device, such as a cellular phone, the SPBS_LCD (2204) is either permanently attached to a Secondary Processor or one or more displays (or not attached to either device), and is configured accordingly by the Primary Processor (2214) after power-on and, and so does not need to be switched back and forth between the two configurations while the cellular phone is in normal operation mode.

Figure 24:
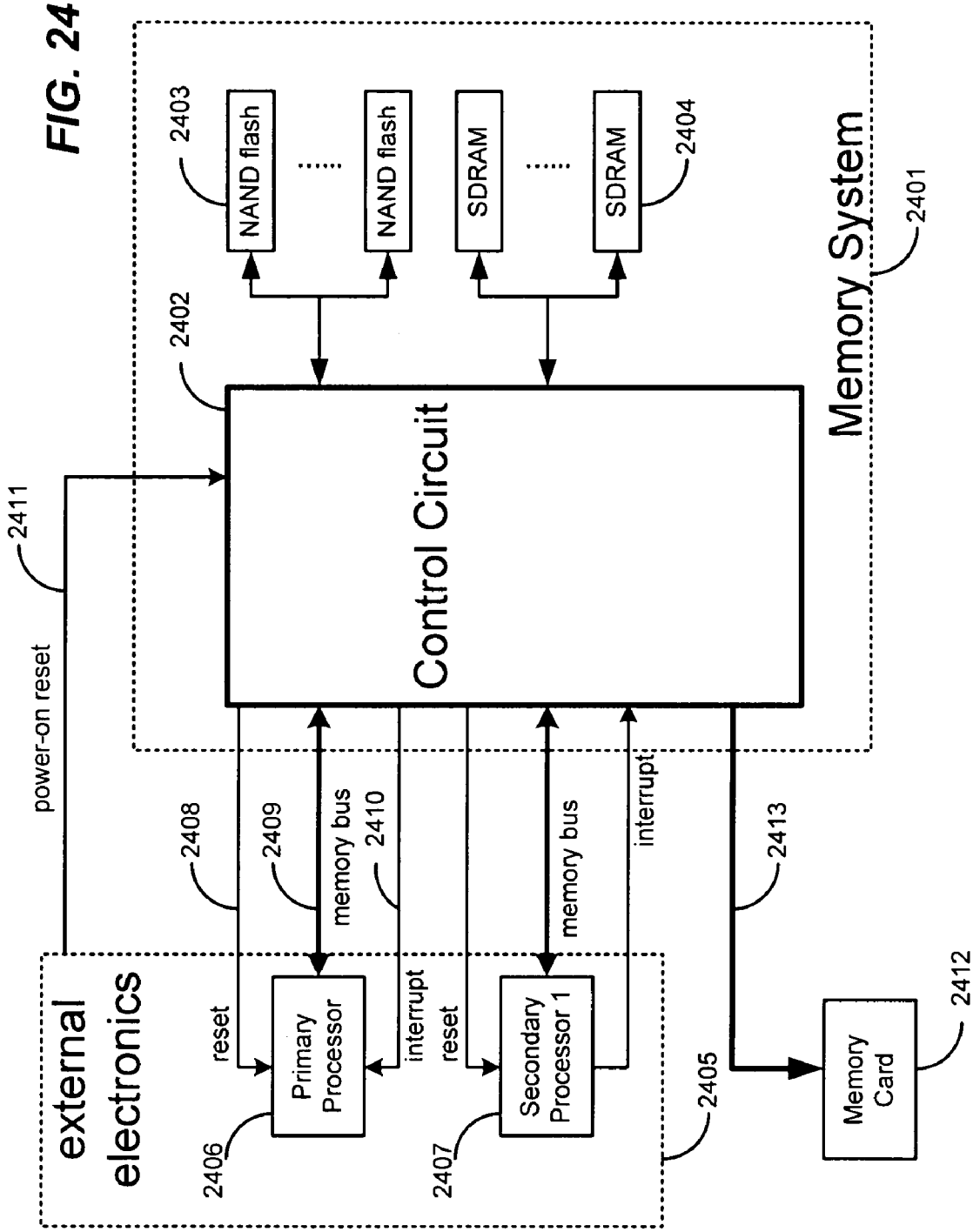
FIG. 24 illustrates a block diagram of another example cellular phone electronic system.

FIG. 24 illustrates a sixth embodiment of a Memory System (2401). The example Memory System (2401) provides interfaces for one or multiple removable, externally inserted memory cards (2412), and further provides for the Primary Processor to configure and activate a Control Circuit (2402) to perform data transfers between SDRAM (2404) and the memory cards (2412). By way of example and not limitation, the removable memory card can be a Memory Stick card, a Smart Media card, a Secure Digital card, a CompactFlash card, a MultiMedia card, or other card format. While the illustrated example depicts one memory card coupled to the Memory System (2401), other embodiments can include multiple memory card interfaces and multiple cards.

A memory card refers to a removable data storage device, which can optionally be inserted into a target device slot, such as a cellular phone slot or receptacle, to thereby be connected to the target device electronic system. The cellular phone, or other target device, can then access the data storage space provided by the memory card. The term "memory card" is hereinafter referred to as MC. For a cellular phone to be able to accept the insertion of an MC, the cellular phone provides an MC interface which is mechanically and electronically compatible with the MC. The Memory System (2401) provides an electronically compatible interface to the MC that can handle the MC bus protocol, and the cellular phone housing includes a mechanically compatible slot and connector for the MC.

Figure 25:
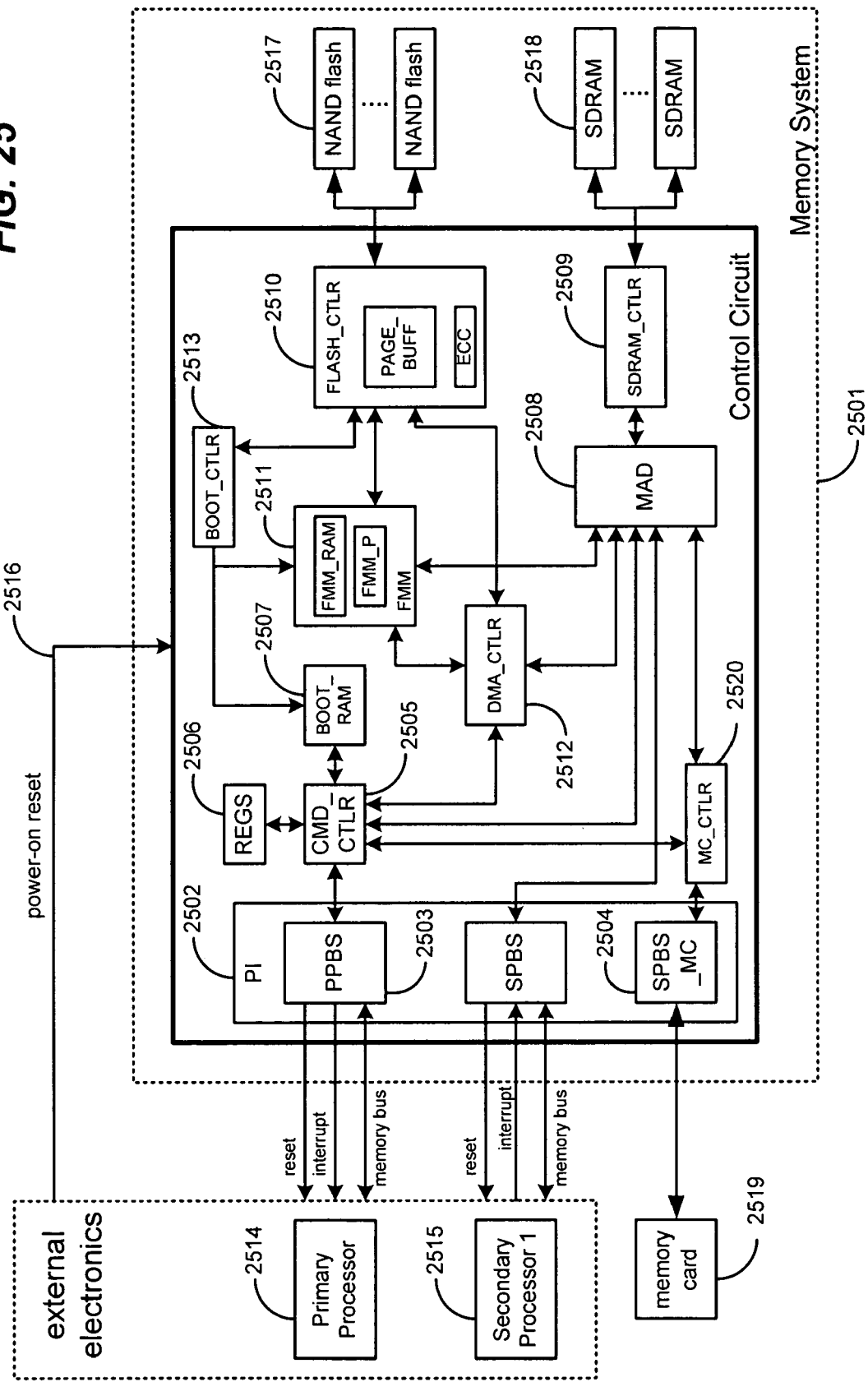
FIG. 25 illustrates a block diagram of a sixth embodiment of a memory system.

FIG. 25 illustrates a detailed block diagram of a Memory System (2501), including a Control Circuit that interfaces to an MC (2519). The functional blocks of the Control Circuit in this embodiment which are different from function block in the first embodiment are described as follows.

With reference to the PI circuit (2502), the PI circuit (2502) includes a PPBS (2503) and a plurality of SPBSs (2504). In this embodiment, at least one of the SPBSs has a configurable interface which can be programmed to function either as a normal SPBS when it is connected to the memory bus of a Secondary Processor, or as an MC (2519) driver interface when it is intended to interface with a removable MC (2519). Such an SPBS is referred to as an "SPBS_MC (2504)" (2504). When programmed to function as a normal SPBS, the SPBS_MC (2504) interacts to the memory bus of the corresponding Secondary Processor as similarly described above with respect to other SPBSs. When programmed to function as an MC driver interface, the SPBS_MC (2504) provides control, data and address signals to operate an MC (2519) according to the MC data transfer protocol.

The data buffer in SPBS_MC (2504) in this instance is used as temporary data storage for data transfer between SDRAM (2518) and the MC (2519). The data buffer allows for a mismatch in the data transfer rate between the MC (2519) and the SDRAM (2518). The MC_CONFIG register in the REGS block (2506), writable by the Primary Processor (2514), determines whether the SPBS_MC (2504) functions as an SPBS or an MC interface driver.

When the PPBS (2503) is accessed by the Primary Processor (2514), in addition to the "RAM Read", "RAM Write", "Register Read", "Register Write", "Download DMA Transfer" and "Upload DMA Transfer" commands, the PPBS (2503) can translate the memory bus control signals into two more commands: "MC Write" and "MC read".

With respect to the REGS block (2506), an MC_CONFIG register is included therein to provide configuration information regarding operating the MCs. The MC_CONFIG register contains the following fields. An "MC enable" field is provided, which determines whether the SPBS_MC (2504) functions as an SPBS or an MC interface driver. This field also disables or enables the MC_CTLR (2520) accordingly. If the Memory System (2501) is not intended to provide an MC interface, then the MC_CTLR (2520) is disabled, and the SPBS_MC (2504) is configured to function as an SPBS. Optionally, this is the default value of this register field right after power-on of the Memory System (2501). If the Memory System (2501) is intended to provide an MC interface, then after power-on, the Primary Processor (2514) writes an enable value to the "MC enable" register field to enable the MC_CTLR (2520) and configure the SPBS_MC (2504) to be an MC driver interface. Additional fields, including one or more of the fields of "starting MC (2519) Address", "starting SDRAM (2518) address", and "amount of data to transfer to/from MC" configure the data transfer between SDRAM (2518) and the MC (2519).

With respect to the Command Controller (CMD_CTLR 2505), when the CMD_CTLR (2505) receives the command "MC Write" or "MC Read" from the Primary Processor (2514) via the PPBS (2503), the CMD_CTLR (2505) activates the MC_CTLR (2520) to perform a data transfer from SDRAM (2518) to the MC (2519) or from the MC (2519) to SDRAM (2518), respectively, via the SPBS_MC (2504) interface. When the MC_CTLR (2520) finishes the data transfer, the CMD_CTLR (2505) sends an interrupt signal to the Primary Processor (2514) via the PPBS (2503) to indicate that the data transfer has been completed.

With respect to the MC Controller (MC_CTLR 2520), the MC_CTLR (2520) is responsible for transferring data between the SDRAM (2518) and the MC (2519) via the SPBS_MC (2504) interface. As previously discussed, the "MC Enable" field of the MC_CONFIG register enables or disables the MC_CTLR (2520). When enabled, the MC_CTLR (2520) is under the control of CMD_CTLR (2505), which is, in turn, under the control of the Primary Processor (2514) via the PPBS (2503). The MC_CONFIG register contains information needed for the MC_CTLR (2520) to perform data transfers between the SDRAM (2518) and the MC (2519) such as the amount of data to transfer, the starting SDRAM (2518) address and the starting MC (2519) address.

When being activated by an "MC Write" or "MC Read" command from the CMD_CTLR (2505), the MC_CTLR (2520) obtains transfer-related information from the MC_CONFIG register, disassembles the data transfer into a plurality of burst transfers aligned to SDRAM (2518) burst transfers, and for each burst transfer, the MC_CTLR (2520) sends an access request to the MAD to access SDRAM (2518). When granted, with respect to a write command "MC Write", the MC_CTLR (2520) reads a burst of data from the SDRAM (2518) and writes the burst of data to the MC (2519) via the data buffer in SPBS_MC (2504). If a read command "MC Read" is being performed, a burst of data is read by the MC_CTLR (2520) from the MC (2519) via the data buffer in SPBS_MC (2504) and the MC_CTLR (2520) writes the burst of data to the SDRAM (2518). The MC_CTLR (2520) repeats the burst transfers until the entire data transfer is completed.

Optionally, the Memory System Control Circuit can include display interfaces and related circuitry, as discussed above with respect to the fifth embodiment, in addition to the MC interfaces and related circuitry as discussed with respect to the present embodiment.

Figure 26:
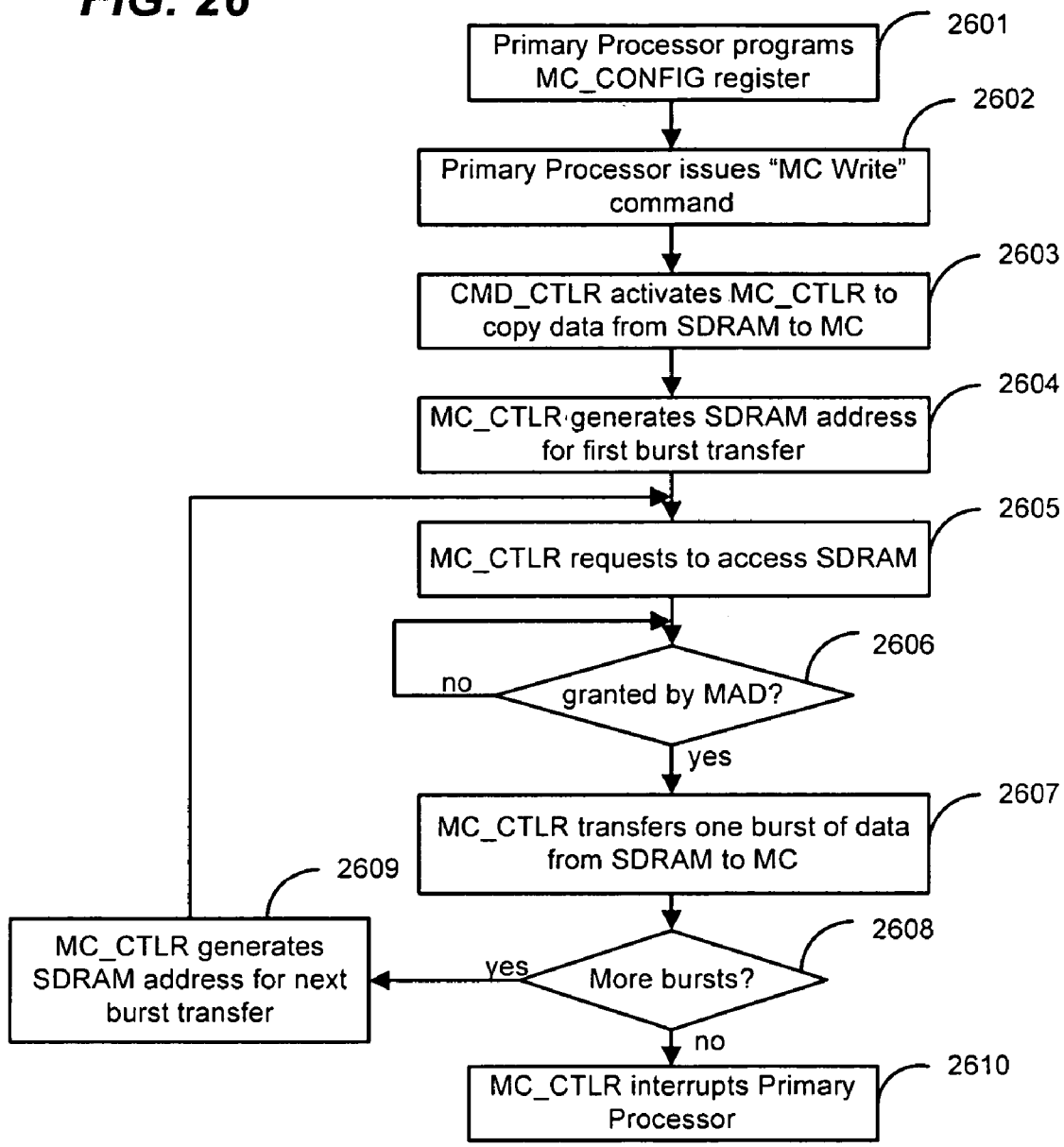
FIG. 26 is a flow chart illustrating an example data transfer process, wherein data is transferred from volatile memory to a removable memory card, such as that illustrated in FIG. 25.

The operation of the sixth embodiment, illustrated in FIG. 25, will now be described with reference to FIG. 26. FIG. 26 illustrates an example data transfer process, where data is transferred from the SDRAM (2518) to an MC (2519). At state (2601), the Primary Processor (2514) writes to the MC_CONFIG register to enable the MC_CTLR (2520) and configure the SPBS_MC (2504) to serve as an MC (2519) driver interface, as well as configure the data transfer between SDRAM (2518) and the MC (2519). At state (2602), the Primary Processor (2514) issues an "MC Write" command", which causes the CMD_CTLR (2505) to activate the MC_CTLR (2520) to perform the data transfer from the SDRAM (2518) to the MC (2519) at state (2603). Based on the value of the MC_CONFIG register, the MC_CTLR (2520) disassembles the data in SDRAM (2518) into bursts of data aligned to SDRAM (2518) bursts and reads each burst out of SDRAM (2518) via the MAD block (2508) according to the access-grant protocol of the MAD block (2508) and writes the burst to the MC (2519) (2604 to 2607). In particular, at state (2604), the MC_CTLR (2520) generates an SDRAM address for the first burst transfer. At state (2605), the MC_CTLR send an access request to the MAD block (2508). At state (2606), a determination is made regarding whether the MAD block (2508) provided access. If the MAD block (2508) has granted access, the process proceeds to state (2608), and a determination is made as to whether there are bursts remaining. If there are more bursts remaining, the process proceeds to state (2609), and the MC_CTLR (2520) generates the SDRAM address for the next burst transfer, and the process proceeds back to state (2605). Once there are no bursts left, and so the MC_CTLR (2520) has completed the data transfer, the process proceeds to state (2610), and the MC_CTLR (2520) interrupts the Primary processor (2514).

If a data transfer in the opposite direction (from the MC (2519) to the SDRAM (2518)) is being performed, the process is similar to that described above, except that the Primary Processor (2514) issues the "MC Read" command to CMD_CTLR MC_CTLR (2520) and that the MC_CTLR (2520) performs data transfer from the MC (2519) to SDRAM (2518).

When disabled, the MC_CTLR (2520) acts as a connection between the SPBS_MC (2504) and the MAD block (2508). The SPBS_MC (2504) functions as a normal SPBS interface and interacts with the MAD block (2508) for accessing SDRAM (2518) as if the MC_CTLR (2520) does not exist or was not necessary.

Further, although SPBS_MC (2504) can be configured by the Primary Processor (2514) to be either a normal SPBS interface which is under the control of a Secondary Processor, or an MC interface which controls the MC, the SPBS_MC (2504) is intended to be used in one of these two configurations in any particular cellular phone. Thus, once the Memory System (2501) is installed into an cellular phone, the SPBS_MC (2504) is either permanently or fixedly attached to a Secondary Processor or used as an MC interface (or not used at all), and is to be configured accordingly by the Primary Processor (2514) after power-on and is not be switched back and forth between the two configurations while the cellular phone is in normal operation mode.

Figure 27:
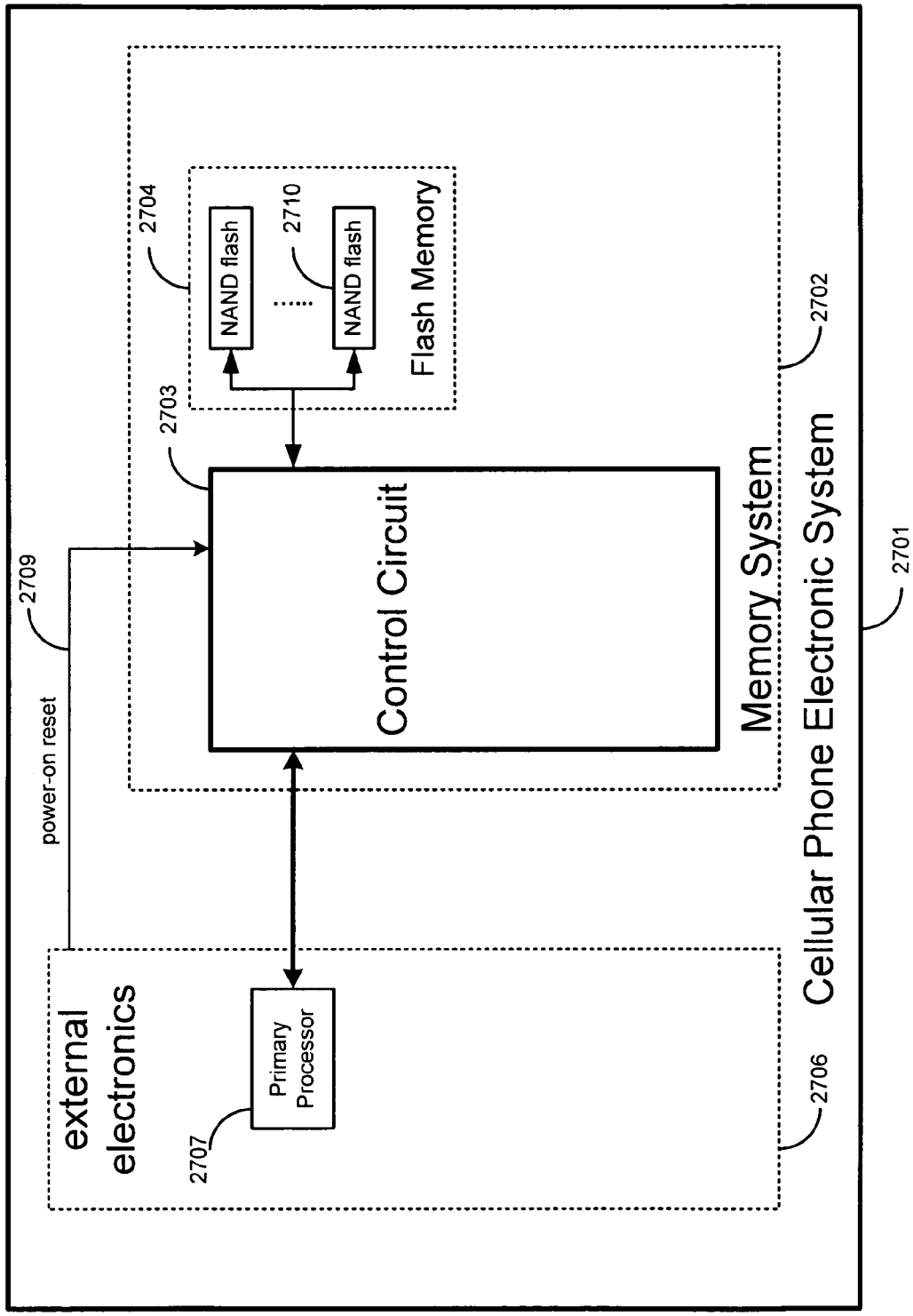
FIG. 27 illustrates a block diagram of a cellular phone depicting a seventh embodiment of a Memory System.

A seventh embodiment of the Memory System will now be described. As depicted in FIG. 27, an example Memory System (2702) contains a Flash Memory (2704) and a Control Circuit (2703), whereby the Control Circuit (2703) provides control signals to operate the Flash Memory (2704), as similarly described above with respect to the first embodiment. The Main RAM (205), illustrated in FIG. 2, is optionally absent in this example Memory System (2702). Furthermore, referring to FIG. 27, this example illustrates one external processor in the external electronics (2706) that has access to the Memory System (2702), wherein this external processor is designated as the Primary Processor (2707). Optionally, additional processors and associated interface circuitry (e.g., a PBS) can be included as well.

The Primary Processor (2707) is connected to the Control Circuit, as similarly discussed above with respect to the first embodiment. In addition to accessing the Memory System (2702), the Primary Processor (2707) may be provided with volatile memory (e.g., SDRAM, DRAM, etc.) and/or non-volatile memory (e.g., Flash memory, EEPROM, ROM, etc.) within the external electronics.

Figure 28:
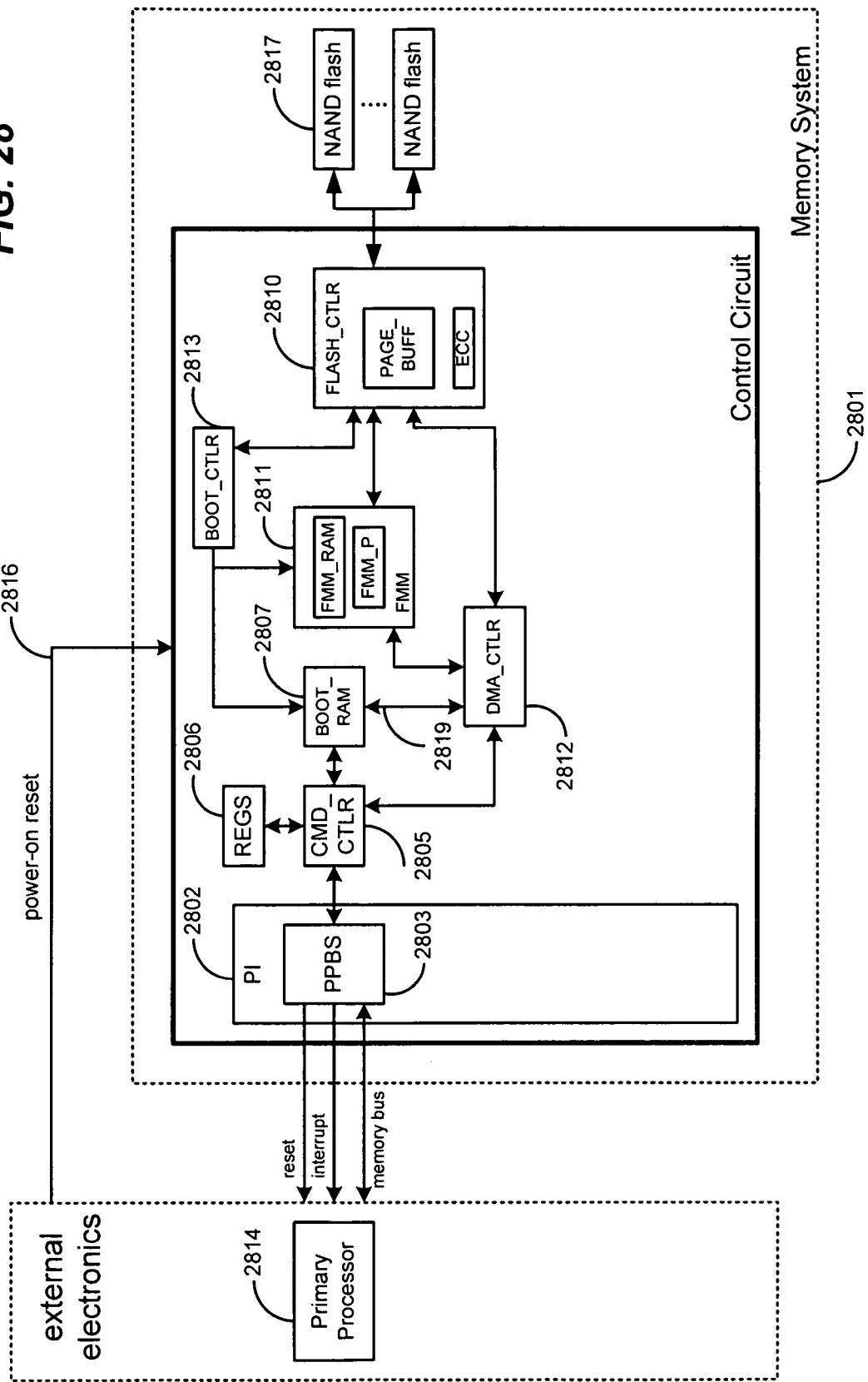
FIG. 28 illustrates a more detailed block diagram of the functional blocks of the control circuit illustrated in FIG. 27.

FIG. 28 illustrates functional blocks of the Control Circuit of the present embodiment. The illustrated embodiment includes a Primary Processor (2814), a PI (2802), a PPBS (2803), a CMD_CTLR (2805), a REGS block (2806), a BOOT_RAM (2807), a FLASH_CTLR (2810), an FMM (2811), a DMA_CTLR (2812), a BOOT_CTLR (2813), a power-on reset signal (2816), and nonvolatile NAND Flash memory (2817). The functional blocks of the Control Circuit which are different from the first embodiment are described as follows.

The example embodiment, as illustrated in FIG. 28, optionally does not include a MAD block (such as the MAD (308) illustrated in FIG. 3) or an SDRAM_CTLR block (such as SDRAM_CTLR (309) illustrated in FIG. 3).

With respect to the Processor Interface (PI 2802), the PI block (2802) optionally contains only one PBS, the PPBS (2803), and optionally does not contain a SPBS block. Differences between the PPBS (2803) of the present embodiment and that of the first embodiment are described below.

As in the first embodiment, the PPBS (2803) is responsible for translating the memory bus signals from the Primary Processor (2814) into commands, data and address information and then passing this information to the CMD_CTLR (2805). The CMD_CTLR (2805), in turn, activates the appropriate parts of the Control Circuit to perform the associated operations in the Memory System (2802). However, two of the commands which PPBS (2803) translates from the memory bus control signals, namely "Download DMA Transfer" and "Upload DMA Transfer", are replaced, or supplemented by "Flash Read" and "Flash Write" commands. More specifically, the PPBS (2803) of the present embodiment translates the Primary Processor (2814) memory bus control signals into one or more of the following example commands: "RAM Read", "RAM Write", "Register Read", "Register Write", "Flash Read" or "Flash Write" (and optionally, additional commands) and transmits the command(s) to the CMD_CTLR (2805).

If the PI block (2802) does not contain an SPBS block, the mechanism provided in the first embodiment for the Primary Processor (2814) to control the reset signals going to the Secondary Processors need not be present. However, the mechanism for the Control Circuit to control the reset signal going to the Primary Processor (2814) is still preferably provided in the present embodiment.

The embodiment illustrated in FIG. 28 can further include an MC interface via an additional PBS and/or a display interface via an additional PBS, as similarly discussed above with respect to other embodiments.

Figure 29:
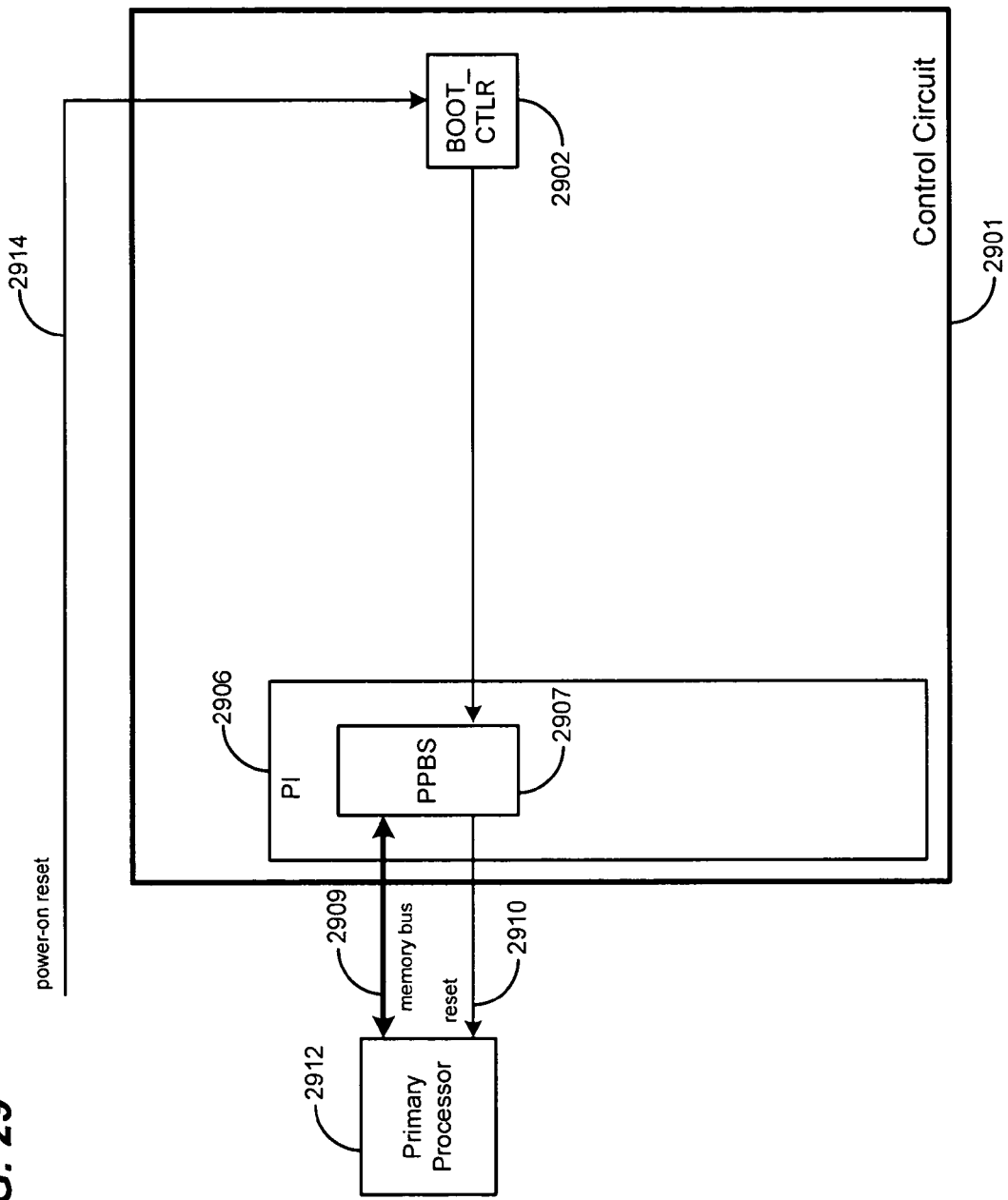
FIG. 29 illustrates a block diagram of an example reset control in the seventh embodiment of the control circuit.

FIG. 29 illustrates reset related circuitry the optionally can be included in the embodiment illustrated in FIG. 28. The illustrated circuitry includes a Primary Processor (2912), a Control Circuit (2901), a Boot_CTLR (2902), a PI (2906), a PPBS (2907), a memory bus (2909) coupling the Primary Processor (2912) and the PPBS (2907), a power_on reset signal (2914), and a reset signal (2910). As depicted in FIG. 29, the assertion of the power-on reset (2914) puts the BOOT_CTLR (2902) in reset mode whereby the BOOT_CTLR (2902) keeps the reset signal (2910) of the Primary Processor (2912) asserted. Upon the deassertion of the power-on reset, the BOOT_CTLR (2902) begins to perform tasks to initialize various functions of the Control Circuit (2901) while at the same time keeping the Primary Processor (2912) in reset by keeping its reset signal asserted. After completing the initialization tasks, the BOOT_CTLR (2902) deasserts the reset signal to release the Primary Processor (2912) from reset.

Figure 30:
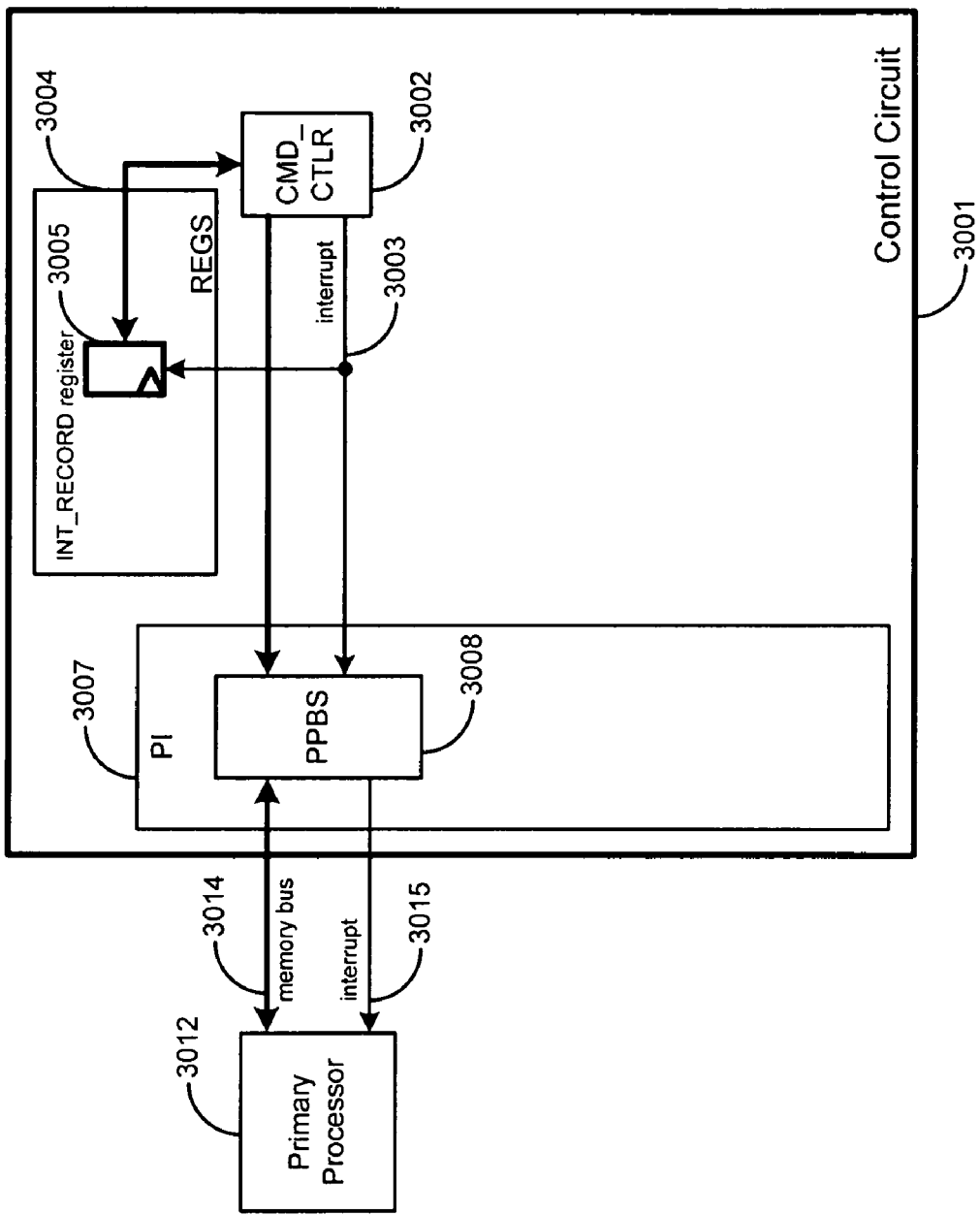
FIG. 30 illustrates a block diagram of an example interrupt control circuit in the seventh embodiment of the control circuit.

FIG. 30 illustrates interrupt related circuitry that optionally can be included in the embodiment illustrated in FIG. 28. The illustrated circuitry includes a Primary Processor (3012) and a CMD_CTLR (3001). The Control Circuit includes a PI (3007), a PPBS (3008), a memory bus (3014) coupling the Primary Processor (3012) and the PPBS (3008), an interrupt signal (3015), a REGS block (3004), and a INT_RECORD register (3005).

As depicted in FIG. 30, if there is no Secondary Processor, the mechanism for a Secondary Processors to interrupt a Primary Processor (3012) is not necessary and so is optionally absent. The mechanism for the CMD_CTLR (3002) to interrupt the Primary Processor (3012) is still preferably provided. The interrupt signal (3003) generated by the CMD_CTLR (3002) is optionally sent directly to the Primary Processor (3012) via the PPBS (3008) and signal (3015) and is also recorded in an interrupt recording register, the INT_RECORD (3005) register, in the REGS block (3004), which can be read and cleared by the Primary Processor (3012).

Referring back to FIG. 28, the Command Controller (CMD_CTLR 2805) performs commands received from the Primary Processor (2814) via the PPBS (2803) differently from the first embodiment, as described below.

With respect to the "RAM Read" and "RAM Write" commands, because the Memory System (2801) does not contain SDRAM, the BOOT_RAM (2807) provides the Memory System RAM memory space that is accessible to the Primary Processor (2814). When the Primary Processor (2814) issues the "RAM Read" or "RAM Write" command, the CMD_CTLR (2805) allows the Primary Processor (2814) to perform a burst transfer from or to the BOOT_RAM (2807).

With respect to the "Register Read" and "Register Write" commands, the CMD_CTLR (2805) performs these two commands as similarly discussed above with respect to the first embodiment.

With respect to the "Flash Read" and "Flash Write" commands, the Flash Read command causes the CMD_CTLR (2805) to activate the DMA_CTLR (2812) to perform a data transfer from the NAND flash memory (2817) to the BOOT_RAM (2807). The Flash Write command causes the CMD_CTLR (2805) to activate the DMA_CTLR (2812) to perform a data transfer from the BOOT_RAM (2807) to the NAND flash memory (2817).

After being activated by the CMD_CTLR (2805), the DMA_CTLR (2812) obtains information associated with the data transfer from the DMA_CONFIG register in the REGS block (2806), such as the amount of data to be moved, optionally described in terms of the number of NAND flash pages, the starting NAND flash Logical Page Address (LPA), and the BOOT_RAM "transfer section" address range. Therefore, the Primary Processor (2814) loads the appropriate values into the DMA_CONFIG register before issuing "Flash Read" or "Flash Write" command to the CMD_CTLR (2805). Upon the completion of the command, the CMD_CTLR (2805) sends an interrupt signal to the Primary Processor (2814) via the PPBS (2803) interface. The CMD_CTLR (2805) optionally does not contain the data buffer which is present in the first embodiment.

Preferably, the data transfer of the "Flash Read" and "Flash Write" commands is performed so that the data transfer between the BOOT_RAM (2807) and the FLASH_CTLR (2810) PAGE_BUFF, and the data transfer between the BOOT_RAM (2807) and the Primary Processor (2814) occurs at the same time, with the DMA_CTLR (2812) and the CMD_CTLR (2805) controlling the data traffic on each respective side of the BOOT_RAM (2807). When the BOOT_RAM (2807) "transfer section" is full and not ready to receive data from the Primary Processor (2814) in a "Flash Write" operation, or when BOOT_RAM (2807) "transfer section" is empty in a "Flash Read" operation, the CMD_CTLR (2805) asserts the "wait" signal to the Primary Processor (2814) via PPBS (2803) to temporarily halt the data transfer on the memory bus until BOOT_RAM (2807) is ready to continue with data transfer.

Referring now to the Registers (REGS 2806), because the Memory System (2801) does not contain SDRAM external to the Control Circuit, the registers which contain information related to accessing such SDRAM, such as the SDRAM_BURST_LENGTH register and the MAD_PRIORITY register, are optionally omitted from the REGS (2806). A DMA_CONFIG register contains information which is used by the Control Circuit illustrated in FIG. 28, when performing the "Flash Read" or "Flash Write" command, instead of the DMA transfer between NAND flash and SDRAM as in the first embodiment.

Referring now to the Boot RAM (BOOT_RAM 2807), in addition to the BOOT_CTLR (2813) and the CMD_CTLR (2805), the BOOT_RAM (2807) is further under the control of the DMA_CTLR (2812) via a connection (2819). After power-on reset, the BOOT_CTLR (2813), by default, has the control of BOOT_RAM (2807), and as part of the initialization of the Control Circuit, the BOOT_CTLR (2813) loads the system boot code from NAND flash memory (2817) to the BOOT_RAM (2807). Then the BOOT_CTLR (2813) turns the control of BOOT_RAM (2807) over to the CMD_CTLR (2805) and the DMA_CTLR (2812). In a "RAM Read" or "RAM Write" operation, the CMD_CTLR (2805) allows the Primary Processor (2814) to perform data transfer from or to the BOOT_RAM (2807). In a "Flash Read" or "Flash Write" operation, the CMD_CTLR (2805) allows the Primary Processor (2814) to perform data transfer from or to the BOOT_RAM (2807) while the DMA_CTLR (2812) performs data transfer between the BOOT_RAM (2807) and the FLASH_CTLR (2810) PAGE_BUFF in the FLASH_CTLR (2810).

In a "Flash Read" or "Flash Write" operation, a section in the BOOT_RAM (2807) is conceptually designated as the "transfer section", which is used to temporarily store the data flowing between the Primary Processor (2814) and the FLASH_CTLR (2810) PAGE_BUFF. The address range of the transfer section in the BOOT_RAM (2807) is defined by the DMA_CONFIG register in the REGS block (2806), which the Primary Processor (2814) programs with the proper value before issuing a "Flash Read" or a "Flash Write" command. The purpose for the transfer section in the BOOT_RAM (2807) is to create a designated section for data transfer such that existent data in the BOOT_RAM (2807), such as the system boot code, do not get overwritten during the data transfer.

With respect to the Flash Memory Controller (FLASH_CTLR (2810)), the FLASH_CTLR (2810) provides an input signal, "flash_halt", for the DMA_CTLR (2812) to halt the operation of the FLASH_CTLR (2810). When asserted, the "flash_halt" signal causes the FLASH_CTLR (2810) to stop operating the NAND flash memory but to still maintain the current state of the operation. When deasserted, the "flash_halt" signal causes the FLASH_CTLR (2810) to continue operating the NAND flash memory from the current state of the operation.

With respect to the Flash Media Manager (FMM 2811), because, in the present embodiment, the Memory System (2801) does not contain SDRAM, the FMM (2811) FMM_P does not need to provide instructions to transfer data between the FMM_RAM and SDRAM. Therefore, the FMM program code and book-keeping records of the FMM algorithms are kept in the FMM_RAM during normal operation mode.

With respect to the DMA Controller (DMA_CTLR (2812)), instead of performing a DMA transfer between NAND flash memory and SDRAM as in the first embodiment, the DMA_CTLR (2812) of the present embodiment performs data transfer operations between the NAND flash memory (2817) and the BOOT_RAM (2807) in the "Flash Read" or "Flash Write" command.

More specifically, when the CMD_CTLR (2805) activates the DMA_CTLR (2812) to perform a "Flash Read" or "Flash Write" command, the DMA_CTLR (2812) obtains information accompanying this command from the DMA_CONFIG register in the REGS block (2806), such as the amount of data to transfer preferably described as a number of NAND flash pages, the starting NAND flash Logical Page Address (LPA), and the BOOT_RAM transfer section address range. The DMA_CTLR (2812) then generates the LPAs of the NAND flash pages to be transferred, as well as the starting BOOT_RAM (2807) address corresponding to each NAND flash page.

To accomplish the DMA transfer of each NAND flash page, the DMA_CTLR (2812) accesses the NAND flash memory (2817) and the BOOT_RAM (2807). The DMA_CTLR (2812) accesses the NAND flash memory (2817) in the same manner as the first embodiment. To access the BOOT_RAM (2807), the DMA_CTLR (2812) directly reads from or writes to the BOOT_RAM (2807) transfer section.

The data transfer of the "Flash Read" and "Flash Write" commands are optionally performed so that the data transfer between the BOOT_RAM (2807) and the FLASH_CTLR (2810) PAGE_BUFF and the data transfer between the BOOT_RAM (2807) and the Primary Processor (2814) can occur at the same time, with the DMA_CTLR (2812) and the CMD_CTLR (2805) controlling the data traffic on each respective side of the BOOT_RAM (2807). When the BOOT_RAM (2807) is full, and not ready to receive data from the FLASH_CTLR (2810) PAGE_BUFF in a "Flash Read" operation, the DMA_CTLR (2812) stops transferring data from the FLASH_CTLR (2810) PAGE_BUFF to the BOOT_RAM (2807) and asserts the "flash_halt" signal to the FLASH_CTLR (2810) to temporarily halt the operation of the NAND flash until the Primary Processor (2814) reads data out of BOOT_RAM (2807).

When the BOOT_RAM (2807) is empty during a "Flash Write" operation, the DMA_CTLR (2812) stops transferring data from the BOOT_RAM (2807) to the FLASH_CTLR (2810) PAGE_BUFF until the Primary Processor (2814) writes data into BOOT_RAM (2807).

The operation of the seventh embodiment, illustrated in FIG. 28, will now be described with reference to FIG. 31. The boot up procedure performed by the BOOT_CTLR (2813) after the deassertion of power-on reset is similar to that described above with respect to the first embodiment. After the BOOT_CTLR (2813) completes the boot up procedure, the Memory System (2801) enters the "Normal Operation Mode".

In the present embodiment, the "Normal Operation Mode" refers to the condition where the FMM (2811) has been initialized and can perform logical-to-physical NAND flash address translation, and the Primary Processor (2814) has been released from reset to execute the system boot code and can, via the PPBS (2803) and the CMD_CTLR (2805), issue commands to transfer bursts of data in and out of the BOOT_RAM (2807), write to and read from registers in the REGS block (2806) to configure/monitor the operations of the Memory System (2801), activate data transfers between the NAND flash memory (2817) and the BOOT_RAM (2807), and receive the interrupt signal generated by the CMD_CTLR (2805).

In Normal Operation Mode, transferring data to and from the Primary Processor (2814) via BOOT_RAM (2807) is a commonly used function. Therefore, the operations of "Flash Read" and "Flash Write" commands are described in detail here.

Figure 31:
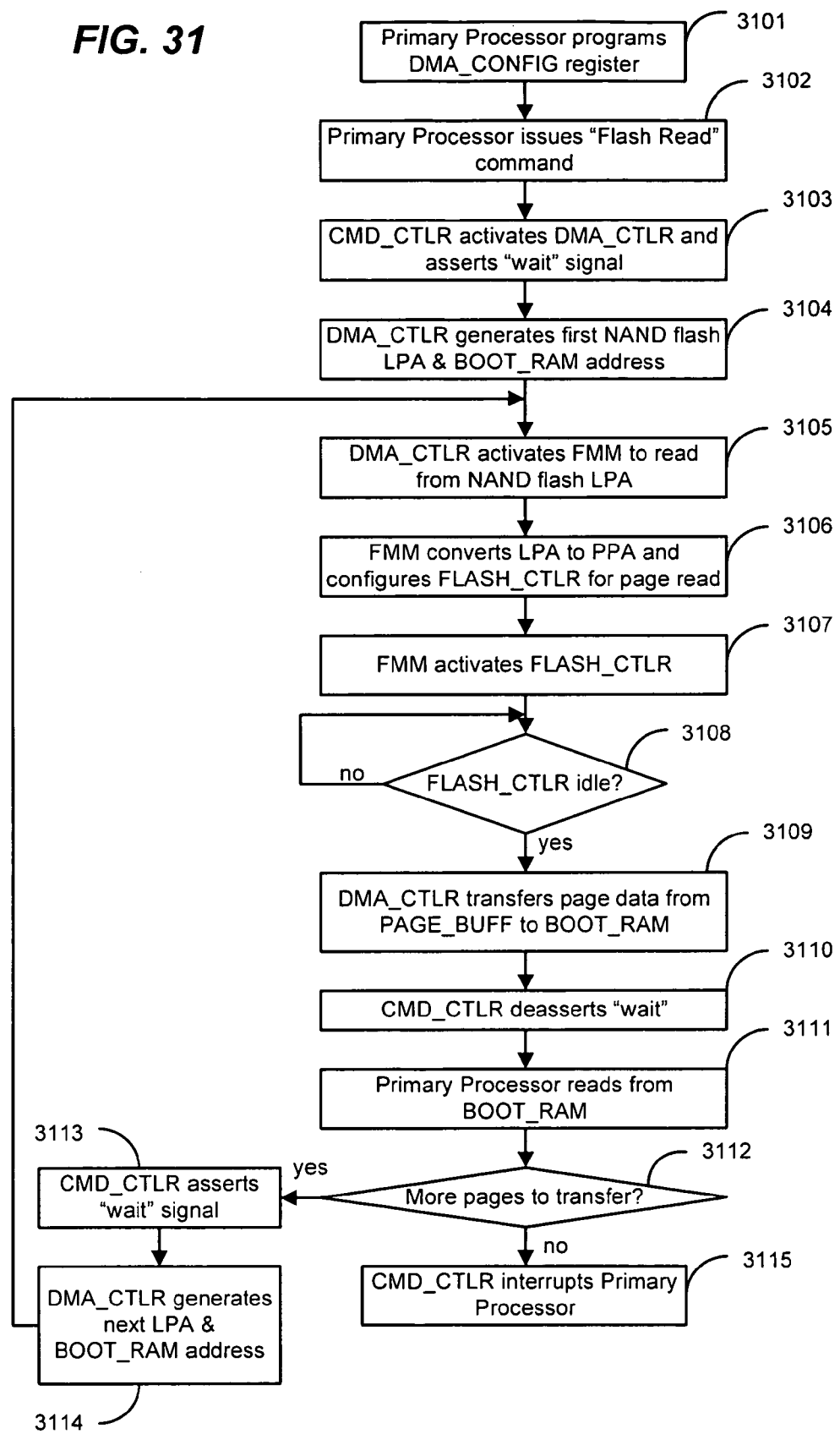
FIG. 31 illustrates a flow chart of an example procedure of a "Flash Read" command that can be used in conjunction with the seventh embodiment of the control circuit.

FIG. 31 illustrates an example Flash read process performed in response to a "Flash Read" command. At state (3101), the Primary Processor (2814) programs command-related information, such as starting NAND flash LPA, BOOT_RAM transfer section address range, and the amount of data to transfer into the DMA_CONFIG register. At state (3102), the Primary Processor (2814) issues a "Flash Read" command", which causes the CMD_CTLR (2805) to activate the DMA_CTLR at state (3103). Meanwhile, at state (3103), the CMD_CTLR (2805) asserts a "wait" signal to temporarily halt the data transfer on the Primary Processor memory bus until the NAND flash data begins to be copied to the BOOT_RAM (2807). Based on the DMA_CONFIG register value, at state (3104), the DMA_CTLR (2812) generates the first NAND flash LPA and the BOOT_RAM address and then, at state (3105), activates the FMM to read NAND flash page of this LPA (3105). At state (3106), the FMM (2811) first performs logical-to-physical address translation to convert the LPA to PPA and, at state (3107) configures and activates the FLASH_CTLR (2810) to read the NAND flash page of this PPA.

At state (3108), a determination is made as to whether the FLASH_CTLR (2810) has entered the idle state, indicating that the FLASH_CTLR (2810) completed the page read operation. At state (3109), the page data is stored in the PAGE_BUFF, with potential errors already corrected by the ECC circuit. At state (3109), the DMA_CTLR (2812) transfers the page data from the PAGE_BUFF to the BOOT_RAM (2807). Upon determining that the BOOT_RAM (2807) transfer section is not empty, at state (3110), the CMD_CTLR (2805) deasserts the "wait" signal to allow the Primary Processor (2814) to read from the BOOT_RAM (2807), which occurs at state (3111).

If the transfer section of the BOOT_RAM (2807) is full, the DMA_CTLR (2812) stops transferring data from the PAGE_BUFF to the BOOT_RAM (2807), and asserts a "flash_halt" signal to temporarily halt reading of the NAND Flash memory (2817). At state (3112), a determination is made as to whether there are more pages to transfer. If the transfer section of the BOOT_RAM (2807) is empty, the CMD_CTLR (2805) asserts a "wait" signal at state (3113) to temporarily halt the Primary Processor (2814) from reading the BOOT_RAM (2807). The DMA_CTLR (2812) generates the next LPA and BOOT_RAM address. This procedure is repeated for each NAND flash page until the "Flash Read" transfer is complete. Once the transfer is complete, the process proceeds to state (3115), and the CMD_CTLR (2805) interrupts the Primary Processor (2814) to indicate the completion of the DMA transfer.

Figure 32:
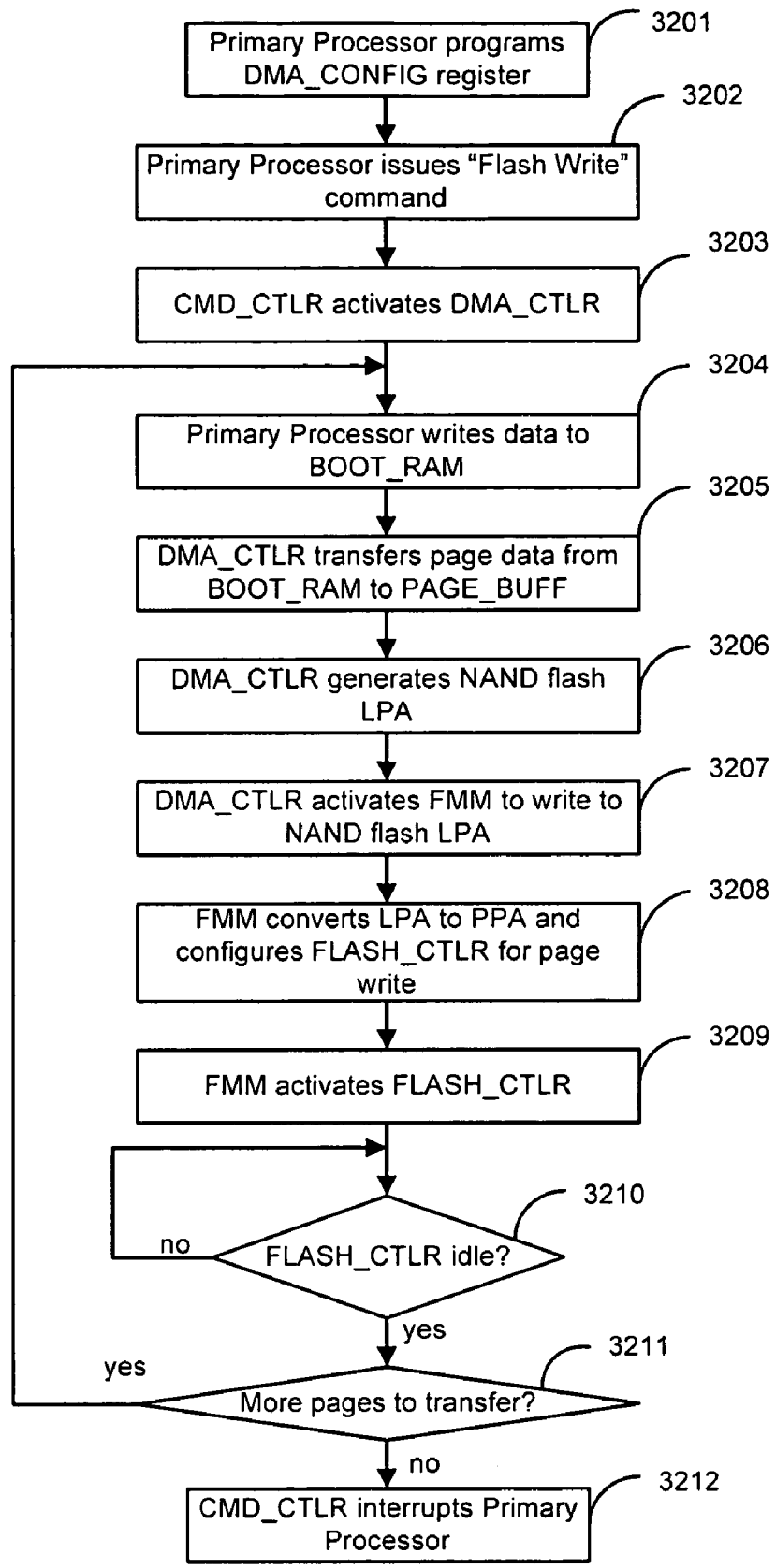
FIG. 32 illustrates a flow chart showing an example procedure of a "Flash Write" command that can be used in conjunction with the seventh embodiment of the control circuit.

FIG. 32 illustrates an example Flash write process performed in response to a "Flash Write" command. At state (3201), the Primary Processor (2814) programs the command-related information, such as a starting NAND flash LPA, a BOOT_RAM transfer section address range, and the amount of data to transfer into the DMA_CONFIG register. At state (3202), the Primary Processor (2814) issues the "Flash Write" command". In response, at state (3203), the CMD_CTLR (2805) activates the DMA_CTLR (2812). Meanwhile, at state (3204), the Primary Processor (2814) begins to write data into the BOOT_RAM (2807). Upon determining that the BOOT_RAM (2807) transfer section is not empty, at state (3205), the DMA_CTLR (2812) begins to transfer data from the BOOT_RAM (2807) to the FLASH_CTRL PAGE_BUFF.

After a page's worth of data has been written to the PAGE_BUFF, at state (3206) the DMA_CTLR (2812) generates the first NAND flash LPA based on the DMA_CONFIG register value, and at state (3207), activates the FMM (2811) to write to the NAND flash page of this LPA. At state (3208), the FMM (2811) performs a logical-to-physical address translation to convert the LPA to PPA, and then at state (3209), configures and activates the FLASH_CTLR (2810) to write to the NAND flash page of this PPA.

Meanwhile the Primary Processor (2814) continues to write data into the BOOT_RAM (2807), which, in turn, causes the DMA_CTLR (2812) to transfer data from the BOOT_RAM (2807) to the PAGE_BUFF. If the transfer section of the BOOT_RAM (2807) is full, the CMD_CTLR (2805) asserts a "wait" signal to temporarily halt the Primary Processor (2814) from writing to the BOOT_RAM (2807). If the transfer section of the BOOT_RAM (2807) is empty, the DMA_CTLR (2812) stops transferring data from the BOOT_RAM (2807) to the PAGE_BUFF. This procedure is repeated for each NAND flash page until the entire "Flash Write" transfer is complete, via a determination made at state (3211), as to whether there are more pages left to transfer. At state (3212), the CMD_CTLR (2805) interrupts the Primary Processor (2814) to indicate the completion of the DMA transfer.

Once in Normal Operation Mode, the Memory System (2801) illustrated in FIG. 28, does not further enter into the "User Mode" as is the case in the first embodiment. The Primary Processor (2814) may or may not continue to execute the system boot code from the BOOT_RAM (2807). In some cellular phones, the external electronics may contain volatile random access memory readily accessible to the Primary Processor (2814). In this case, once in Normal Operation Mode and executing the system boot code from the BOOT_RAM (2807), the Primary Processor (2814) may transfer some or all of the software program codes for the Primary Processor (2814) stored within the Memory System (2801) to the volatile random access memory in the external electronics, and then branches to execute the software program codes from therein.

In some cellular phones, the external electronics may further contain nonvolatile memories, such as Flash memories and ROMs, which are used to store the system boot code for the Primary Processor. In this case, the system boot code is optionally not stored in the NAND flash memory within the Memory System, and is made available to the Primary Processor via the external electronics, once the Primary Processor is released from reset. As such, the BOOT_CTLR does not have the responsibility of loading the system boot code from NAND flash memory to the BOOT_RAM, but still loads the FMM program code from NAND flash memory to the FMM_RAM as well as releases the FMM and the Primary Processor from reset.

In this instance, when released from reset by the BOOT_CTLR, the Primary Processor executes the system boot code by fetching instructions from the external electronics instead of from the Memory System. Furthermore, in such cellular phones, the external electronics may directly control the reset of the Primary Processor. In this case, the Primary Processor may or may not be already released from reset by the external electronics when the BOOT_CTLR deasserts the reset signal going to the Primary Processor. Therefore, the reset signal which the BOOT_CTLR sends to the Primary Processor may instead be used by the Primary Processor as a signal indicating whether or not the Memory System has been initialized and is ready to service the commands from the Primary Processor.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or subcombinations of the specific features and aspects of the embodiments may be made and still fall within the scope of the invention. Accordingly, it should be understood that various features and aspects of the disclosed embodiments can be combined with, or substituted for one another, in order to form varying modes of the disclosed invention. Thus, it is intended that the scope of the present invention herein disclosed should not be limited by the particular disclosed embodiments described above.

What is claimed is:

1. A wireless phone memory controller, comprising:
    a memory controller including a:
        a nonvolatile memory controller circuit configured to be coupled to nonvolatile memory;
        a volatile memory controller circuit configured to be coupled to volatile memory;
        a boot controller circuit configured to be coupled to the nonvolatile memory controller circuit, the boot controller circuit configured to cause user-defined boot program code to be read from nonvolatile memory into memory controller memory;
        a first processor interface, including a first reset signal, configured to be coupled to a first wireless phone processor, wherein, the memory controller is configured to release the first wireless phone processor from a reset state after the user-defined boot code is read into the memory controller memory; and
        a second processor interface, including a second reset signal, configured to be coupled to a second wireless phone processor, wherein the second reset signal is configured to be controlled at least in part by the first processor.

2. The wireless phone memory controller as defined in claim 1, further comprising:
    a first display interface configured to be coupled to a first display; and
    a second display interface configured to be coupled to a second display wherein, the memory controller is further configured to transfer display data from the volatile memory to at least the second display at least partly in response to receiving a memory transfer request from the first processor.

3. The wireless phone memory controller as defined in claim 1, further comprising an interface configured to be coupled to a removable memory device.

4. The wireless phone memory controller as defined in claim 1, further comprising an interface configured to be coupled to a removable memory card.

5. The wireless phone memory controller as defined in claim 1, wherein the user defined boot code is loaded into dedicated boot volatile memory.

6. The wireless phone memory controller as defined in claim 1, wherein the nonvolatile memory includes NAND Flash memory.

7. The wireless phone memory controller as defined in claim 1, wherein the nonvolatile memory includes AND Flash memory.

8. The wireless phone memory controller as defined in claim 1, wherein the volatile memory includes SDRAM memory.

9. The wireless phone memory controller as defined in claim 1, further comprising:
    a DMA controller configured to transfer data from the nonvolatile to the volatile memory in response to a request received via the first processor port; and
    an ECC circuit configured to provide error detection and correction of data read from the nonvolatile memory.

10. The wireless phone memory controller as defined in claim 1, further comprising memory storing user defined Flash media management code.

11. The wireless phone memory controller as defined in claim 1, further comprising a data buffer used to buffer data with respect to nonvolatile data transfers.

12. The wireless phone memory controller as defined in claim 1, further comprising an error detection and correction circuit that can detect and correct at least a portion of data errors in data read from nonvolatile memory without the intervention of the first or second processors.

13. The wireless phone memory controller as defined in claim 1, further comprising a circuit that copies a plurality of data pages from nonvolatile memory to volatile memory without intervention of the first or second processors.

14. The wireless phone memory controller as defined in claim 1, further comprising a second nonvolatile memory controller and a second volatile memory controller.

15. A method of managing phone memory operations, comprising:
  causing user-defined boot program code to be read from nonvolatile memory into memory controller memory;
  releasing a first wireless phone processor from a reset state using a first reset signal after the user-defined boot code is read into the memory controller memory; and
  controlling a second reset signal coupled to a second wireless phone processor using the first wireless phone processor.

16. The method as defined in claim 15, further comprising:
  communicating display information with a first display using a first display interface; and
  transferring display data via the memory controller from volatile memory to at least a second display at least partly in response to receiving a memory transfer request from the first processor.

17. The method as defined in claim 16, further comprising:
  transferring data from the nonvolatile to the volatile memory in response to a request received via the first processor port; and
  correcting data via an ECC circuit configured to provide error detection and correction of data read from the nonvolatile memory.

18. The method as defined in claim 15, further comprising providing an interface configured to be coupled to a removable memory card.

19. The method as defined in claim 15, wherein the user defined boot code is loaded into dedicated boot volatile memory.

20. The method as defined in claim 15, wherein the nonvolatile memory includes Flash memory.

21. The method as defined in claim 15, wherein the volatile memory includes S DRAM memory.

22. The method as defined in claim 15, further comprising storing user defined Flash media management code.

23. The method as defined in claim 15, further comprising detecting and correcting at least a portion of data errors in data read from nonvolatile memory without the intervention of the first or second processors.

24. The method as defined in claim 15, further comprising copying a plurality of data pages from nonvolatile memory to volatile memory without intervention of the first or second processors.

25. A wireless phone memory controller, comprising:
  a memory controller circuit configured to be coupled to nonvolatile memory and to volatile memory;
  a boot controller circuit configured to be coupled to the memory controller circuit, the boot controller circuit configured to cause user-defined boot program code to be read from nonvolatile memory into memory associated with the memory controller circuit;
  a first processor interface, including a first reset signal, configured to be coupled to a first processor, wherein, the first processor interface is configured to release the first processor from a reset state after the user-defined boot code is read into the memory associated the memory controller circuit; and
  a second processor interface, including a second reset signal, configured to be coupled to a second processor, wherein the second reset signal is configured to be controlled at least in part by the first processor.

26. The wireless phone memory controller as defined in claim 25, further comprising:
  a first display interface configured to be coupled to a first display; and
  a second display interface configured to be coupled to a second display wherein, the memory controller circuit is further configured to transfer display data from the volatile memory to at least the second display at least partly in response to receiving a memory transfer request from the first processor.

27. The wireless phone memory controller as defined in claim 25, further comprising an interface configured to be coupled to a removable memory card.

28. The wireless phone memory controller as defined in claim 25, wherein the user defined boot code is loaded into dedicated boot volatile memory.

29. The wireless phone memory controller as defined in claim 25, wherein the nonvolatile memory includes NAND Flash memory.

30. The wireless phone memory controller as defined in claim 25, wherein the nonvolatile memory includes AND Flash memory.

31. The wireless phone memory controller as defined in claim 25, wherein the volatile memory includes SDRAM memory.

32. The wireless phone memory controller as defined in claim 25, further comprising:
  a DMA controller configured to transfer data from the nonvolatile to the volatile memory in response to a request received via the first processor; and
  an ECC circuit configured to provide error detection and correction of data read from the nonvolatile memory.

33. The wireless phone memory controller as defined in claim 25, further comprising memory storing user defined Flash media management code.

34. The wireless phone memory controller as defined in claim 25, further comprising a data buffer used to buffer data with respect to nonvolatile data transfers.

35. The wireless phone memory controller as defined in claim 25, further comprising an error detection and correction circuit that can detect and correct at least a portion of data errors in data read from nonvolatile memory without the intervention of the first or second processors.

36. The wireless phone memory controller as defined in claim 25, further comprising a circuit that copies a plurality of data pages from nonvolatile memory to volatile memory without intervention of the first or second processors.

37. The wireless phone memory controller as defined in claim 25, further comprising a second nonvolatile memory controller and a second volatile memory controller.

38. A memory controller for controlling the operation of a first nonvolatile memory comprising:
  a first memory interface circuit including a first bus for interfacing with the first nonvolatile memory;
  a second nonvolatile memory;
  a boot controller circuit configured to be coupled to the second nonvolatile memory, the boot controller circuit configured to cause a boot program code to be read from the second nonvolatile memory for execution;

a first processor interface, including a second bus configured to be coupled to a first host processor; and a second processor interface, including a third bus configured to be coupled to a second host processor.

39. A memory controller for controlling the operation of a first nonvolatile memory comprising:
- a first interface circuit, including a first bus, configured to be coupled to the first a nonvolatile memory;
- a second nonvolatile memory:
- a second interface circuit, including a second bus, configured to be coupled to the second nonvolatile memory:
- a volatile memory:
- a third interface circuit, including a third bus, configured to be coupled to the volatile memory;
- a first processor interface, configured to be coupled to a first host processor, wherein the first processor interface is configured to provide the first processor with access to the volatile memory;
- a second processor interface, configured to be coupled to a second host processor; and
- controller circuit configured to execute at least a portion of the data stored in the second nonvolatile memory without intervention by the first processor or the second processor.

40. A memory controller for controlling the operation of a first nonvolatile memory external to the memory controller comprising:
- a nonvolatile memory controller circuit having a first bus, configured to be coupled to a the first nonvolatile memory;
- a second nonvolatile memory;
- a boot controller circuit configured to be coupled to the second nonvolatile memory, the boot controller circuit configured to cause a boot program code to be read from the second nonvolatile memory for execution; and
- a first processor interface, configured to be coupled to a first host processor.

* * * * *

UNITED STATES PATENT AND TRADEMARK OFFICE
CERTIFICATE OF CORRECTION

| | |
|---|---|
| PATENT NO. | : 7,475,184 B2 |
| APPLICATION NO. | : 11/215744 |
| DATED | : January 6, 2009 |
| INVENTOR(S) | : Schweiray Joseph Lee |

It is certified that error appears in the above-identified patent and that said Letters Patent is hereby corrected as shown below:

At Sheet 20 of 32 (Reference numeral 2011) (Fig. 20), Line 1, Change "FLAHS" to --FLASH--.

At Sheet 20 of 32 (Reference numeral 2012) (Fig. 20), Line 1, Change "FLAHS" to --FLASH--.

At Column 10, Line 62, Change "modem" to --modern--.

At Column 16, Line 67, Change "the a" to --the--.

At Column 34, Line 61, Change "modem" to --modern--.

At Column 37, Line 29, After "(1618)" insert --.--.

At Column 37, Line 53, After "(1618)" insert --.--.

At Column 59, Line 46, In Claim 21, change "S DRAM" to --SDRAM--.

At Column 61, Line 8, In Claim 39, after "first" delete "a".

At Column 61, Line 9, In Claim 39, change "memory:" to --memory;--.

At Column 61, Line 11, In Claim 39, change "memory:" to --memory;--.

At Column 61, Line 12, In Claim 39, change "memory:" to --memory;--.

At Column 62, Line 1, In Claim 39, before "controller" insert --a--.

UNITED STATES PATENT AND TRADEMARK OFFICE
CERTIFICATE OF CORRECTION

PATENT NO. : 7,475,184 B2
APPLICATION NO. : 11/215744
DATED : January 6, 2009
INVENTOR(S) : Schweiray Joseph Lee It is certified that error appears in the above-identified patent and that said Letters Patent is hereby corrected as shown below:

At Column 62, Line 9, In Claim 40, change "a the" to --the--.

Signed and Sealed this

Fourteenth Day of July, 2009

JOHN DOLL
*Acting Director of the United States Patent and Trademark Office*